(12) United States Patent
Ihn et al.

(10) Patent No.: US 11,594,689 B2
(45) Date of Patent: Feb. 28, 2023

(54) ORGANIC LIGHT-EMITTING DEVICE

(71) Applicants: Samsung Electronics Co., Ltd., Suwon-si (KR); Samsung SDI Co., Ltd., Yongin-si (KR); Ewha University—Industry Collaboration Foundation, Seoul (KR)

(72) Inventors: Sooghang Ihn, Hwaseong-si (KR); Youngmin You, Seoul (KR); Changho Noh, Suwon-si (KR); Jongsoo Kim, Suwon-si (KR); Joonghyuk Kim, Seoul (KR); Namheon Lee, Suwon-si (KR)

(73) Assignees: SAMSUNG ELECTRONICS CO., LTD., Gyeonggi-Do (KR); SAMSUNG SDI CO., LTD., Gyeonggi-Do (KR); EWHA UNIVERSITY—INDUSTRY COLLABORATION FOUNDATION, Seoul (KR)

( * ) Notice: Subject to any disclaimer, the term of this patent is extended or adjusted under 35 U.S.C. 154(b) by 632 days.

(21) Appl. No.: 15/871,430

(22) Filed: Jan. 15, 2018

(65) Prior Publication Data
US 2018/0233678 A1 Aug. 16, 2018

(30) Foreign Application Priority Data

Jan. 16, 2017 (KR) .................. 10-2017-0007033
Jan. 11, 2018 (KR) .................. 10-2018-0003976

(51) Int. Cl.
*H01L 51/00* (2006.01)
*H01L 51/50* (2006.01)

(52) U.S. Cl.
CPC ...... *H01L 51/0085* (2013.01); *H01L 51/0067* (2013.01); *H01L 51/0071* (2013.01);
(Continued)

(58) Field of Classification Search
CPC ............. H01L 51/0085; H01L 51/0071; H01L 51/5016; H01L 51/0067; H01L 51/0072;
(Continued)

(56) References Cited

U.S. PATENT DOCUMENTS 6,936,716 B1 * 8/2005 Lin ..................... C07F 15/0033
428/917
9,331,296 B2  5/2016 Okajima et al.
(Continued)

FOREIGN PATENT DOCUMENTS

EP        2966146 A1    1/2016
JP        2011176250 A  9/2011
(Continued)

OTHER PUBLICATIONS

Extended European Search Report issued by the European Patent Office dated Nov. 15, 2018, in the examination of the European Patent Application No. 18151527.1-1211.
(Continued)

*Primary Examiner* — Alexander C Kollias
(74) *Attorney, Agent, or Firm* — Cantor Colburn LLP

(57) ABSTRACT

An organic light-emitting device including a first electrode, a second electrode facing the first electrode, and an organic layer disposed between the first electrode and the second electrode, wherein the organic layer includes an emission layer, wherein the emission layer includes a host and a dopant, and wherein the organic light-emitting device satisfies predetermined conditions described in the specification.

1 Claim, 1 Drawing Sheet

(52) U.S. Cl.
CPC ...... *H01L 51/0072* (2013.01); *H01L 51/5016* (2013.01); *H01L 51/0087* (2013.01); *H01L 2251/55* (2013.01); *H01L 2251/552* (2013.01)

(58) Field of Classification Search
CPC .......... H01L 2251/552; H01L 51/0087; H01L 2251/55
See application file for complete search history.

(56) References Cited

U.S. PATENT DOCUMENTS

| | | | |
|---|---|---|---|
| 9,349,954 B2 | 5/2016 | D'Andrade et al. | |
| 2005/0260448 A1* | 11/2005 | Lin | C09K 11/06 428/690 |
| 2007/0088167 A1 | 4/2007 | Lin et al. | |
| 2010/0176380 A1 | 7/2010 | Jung et al. | |
| 2013/0032766 A1* | 2/2013 | Molt | C07F 7/0816 252/519.2 |
| 2015/0249225 A1* | 9/2015 | Lin | C07F 15/0033 257/40 |
| 2016/0013423 A1* | 1/2016 | Huh | H01L 51/0074 257/40 |
| 2016/0093823 A1 | 3/2016 | Seo et al. | |
| 2016/0141521 A1 | 5/2016 | Watanabe et al. | |
| 2018/0301633 A1 | 10/2018 | Ishii et al. | |

FOREIGN PATENT DOCUMENTS

| | | |
|---|---|---|
| JP | 2012175025 A | 9/2012 |
| JP | 2014-175590 A | 9/2014 |
| JP | 5626790 B2 | 10/2014 |
| JP | 2014-241315 A | 12/2014 |
| KR | 10-2010-0133352 A | 12/2010 |
| KR | 10-1431364 B1 | 8/2014 |
| WO | 2014147006 A1 | 9/2014 |
| WO | 2015150203 A1 | 10/2015 |

OTHER PUBLICATIONS

Chan Seok Oh et al. "Molecular design of host materials for high power efficiency in blue phosphorescent organic light-emitting diodes doped with an imidazole ligand based triplet emitter" J. Mater. Chem. C, 2016, 4, 3792-3797.

Partial European Search Report issued by the European Patent Office dated Jul. 3, 2018 in the examination of the European Patent Application No. 18151527.1-1211.

D.Y. Kondakov et al. "Operational degradation of organic light-emitting diodes: Mechanism and identification of chemical products", Journal of Applied Physics 2007, 101, 024512 (8 pp.).

Denis Y. Kondakov "Role of chemical reactions of arylamine hold transport materials in operational degradation of organic light-emitting diodes", Journal of Applied Physics 2008, 104, 084520 (10 pp.).

N.C. Geibink et al. "Direct evidence for degradation of polaron excited states in organic light emitting diodes", Journal of Applied Physics 2009, 105, 124514 (8 pp.).

Sebastian Scholz et al. "Analysis of Complete Organic Semiconductor Devices by Laser Desorption/Ionization Time-of-Flight Mass Spectrometry", Adv. Funct. Mater. 2008, 18, 2541-2547.

* cited by examiner

10

| 19 |
|----|
| 15 |
| 11 |

ORGANIC LIGHT-EMITTING DEVICE

CROSS-REFERENCE TO RELATED APPLICATION

This application claims priority to Korean Patent Application No. 10-2017-0007033, filed on Jan. 16, 2017, and Korean Patent Application No. 10-2018-0003976, filed on Jan. 11, 2018, in the Korean Intellectual Property Office, and all the benefits accruing therefrom under 35 U.S.C. § 119, the contents of which are incorporated herein in their entirety by reference.

BACKGROUND

1. Field

The present disclosure relates to an organic light-emitting device.

2. Description of the Related Art

Organic light-emitting devices (OLEDs) are self-emission devices that have wide viewing angles, high contrast ratios, short response times, and excellent brightness, driving voltage, and response speed characteristics, and that produce full-color images.

A typical OLED includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons transit from an excited state to a ground state, thereby generating light.

Various types of organic light emitting devices are known. However, there still remains a need in OLEDs having low driving voltage, high efficiency, high brightness, and long lifespan.

SUMMARY

Provided is an organic light-emitting device including a host and a dopant satisfying predetermined conditions so as to have long lifespan.

Additional aspects will be set forth in part in the description which follows and, in part, will be apparent from the description, or may be learned by practice of the presented embodiments.

According to an aspect of an embodiment, an organic light-emitting device includes:
a first electrode;
a second electrode facing the first electrode; and
an organic layer disposed between the first electrode and the second electrode, wherein the organic layer includes an emission layer,
wherein the emission layer includes a host and a dopant,
1) the dopant includes a phosphorescent dopant, and
i) Conditions 1, 2, 3, and 4 are all satisfied;
ii) when Conditions 1 and 4 are satisfied and at least one of Conditions 2 and 3 is not satisfied, Condition 5-1 is satisfied;

iii) when at least one of Conditions 1 and 4 are not satisfied and Conditions 2 and 3 are satisfied, Condition 6-1 is satisfied; or
iv) when at least one of Conditions 1 and 4 is not satisfied and at least one of Conditions 2 and 3 is not satisfied, Conditions 5-1 and 6-1 are both satisfied, or 2) the dopant includes a fluorescent dopant, and
i) Conditions 1, 2, 3, and 4 are all satisfied;
ii) when Conditions 1 and 4 are satisfied and at least one of Conditions 2 and 3 is not satisfied, Condition 5-2 is satisfied;
iii) when at least one of Conditions 1 and 4 is not satisfied and Conditions 2 and 3 are satisfied, Condition 6-2 is satisfied; or
iv) when at least one of Conditions 1 and 4 is not satisfied and at least one of Conditions 2 and 3 is not satisfied, Conditions 5-2 and 6-2 are both satisfied:

$E^*_{ox,dopant} \geq E_{red,host}$  Condition 1

$E^*_{red,dopant} \leq E_{ox,host}$  Condition 2

$E_{ox,dopant} \geq E^*_{red,host}$  Condition 3

$E_{red,dopant} \leq E^*_{ox,host}$  Condition 4

$T1_{dopant} - 0.4\ \text{eV} < |E_{red,host} - E_{ox,dopant}| < T1_{dopant} + 0.3\ \text{eV}$  Condition 5-1

$T1_{dopant} - 0.4\ \text{eV} < |E_{red,dopant} - E_{ox,host}| < T1_{dopant} + 0.3\ \text{eV}$  Condition 6-1

$S1_{dopant} - 0.4\ \text{eV} < |E_{red,host} - E_{ox,dopant}| < S1_{dopant} + 0.3\ \text{eV}$  Condition 5-2

$S1_{dopant} - 0.4\ \text{eV} < |E_{red,dopant} - E_{ox,host}| < S1_{dopant} + 0.3\ \text{eV}$  Condition 6-2 wherein, "$E^*_{ox,dopant}$" represents an excited-state oxidation potential (electron volts, eV) of the dopant,
"$E^*_{red,dopant}$" represents an excited-state reduction potential (eV) of the dopant,
"$E_{ox,dopant}$" represents a ground-state oxidation potential (eV) of the dopant,
"$E_{red,dopant}$" represents a ground-state reduction potential (eV) of the dopant,
"$E^*_{red,host}$" represents an excited-state reduction potential (eV) of the host,
"$E^*_{ox,host}$" represents an excited-state oxidation potential (eV) of the host,
"$E_{red,host}$" represents a ground-state reduction potential (eV) of the host,
"$E_{ox,host}$" represents a ground-state oxidation potential (eV) of the host,
$E^*_{ox,dopant}$ is identical to $E_{ox,dopant} - T1_{dopant}$,
$E^*_{red,dopant}$ is identical to $E_{red,dopant} + T1_{dopant}$,
$E^*_{ox,host}$ is identical to $E_{ox,host} - S1_{host}$,
$E^*_{red,host}$ is identical to $E_{red,host} + S1_{host}$,
"$T1_{dopant}$" represents the lowest triplet energy level (eV) of the dopant,
"$S1_{dopant}$" represents the lowest singlet energy level (eV) of the dopant,
"$S1_{host}$" represents the lowest singlet energy level (eV) of the host,
$E_{ox,dopant}$ and $E_{ox,host}$ are measured by using cyclic voltammetry (CV),
$E_{red,dopant}$ and $E_{red,host}$ are measured by using differential pulse voltammetry,
$T1_{dopant}$ and $S1_{dopant}$ are calculated from a photoluminescence (PL) spectrum of the dopant in solution, and $S1_{host}$ is calculated from a PL spectrum of the host in solution, wherein "eV" denotes "electron volts".

BRIEF DESCRIPTION OF THE DRAWING

These and/or other aspects will become apparent and more readily appreciated from the following description of the embodiments, taken in conjunction with the FIGURE which is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organic light-emitting device is provided. The organic light-emitting device may include:

a first electrode;

a second electrode facing the first electrode; and an organic layer disposed between the first electrode and the second electrode, wherein the organic layer includes an emission layer, and wherein the emission layer may include a host and a dopant.

In an embodiment, the dopant may include a phosphorescent dopant. In some embodiments, the dopant may be a phosphorescent dopant.

In the organic light-emitting device in which the dopant includes a phosphorescent dopant, i) Conditions 1, 2, 3, and 4 may all be satisfied;

ii) when Conditions 1 and 4 may be satisfied and at least one of Conditions 2 and 3 is not satisfied, Condition 5-1 may be satisfied;

iii) when at least one of Conditions 1 and 4 may not be satisfied and Conditions 2 and 3 are satisfied, Condition 6-1 may be satisfied; or iv) when at least one of Conditions 1 and 4 may not be satisfied and at least one of Conditions 2 and 3 is not satisfied, Conditions 5-1 and 6-1 may both be satisfied.

In one or more embodiments, the dopant may include a fluorescent dopant. In some embodiments, the dopant may be a fluorescent dopant.

In the organic light-emitting device in which the dopant includes a fluorescent dopant, i) Conditions 1, 2, 3, and 4 may all be satisfied;

ii) when Conditions 1 and 4 may be satisfied and at least one of Conditions 2 and 3 is not satisfied, Condition 5-2 may be satisfied;

iii) when at least one of Conditions 1 and 4 may not be satisfied and Conditions 2 and 3 are satisfied, Condition 6-2 may be satisfied; or iv) when at least one of Conditions 1 and 4 may not be satisfied and at least one of Conditions 2 and 3 is not satisfied, Conditions 5-2 and 6-2 may both be satisfied.

$$E^*_{ox,dopant} \geq E_{red,host} \qquad \text{Condition 1}$$

$$E^*_{red,dopant} \leq E_{ox,host} \qquad \text{Condition 2}$$

$$E_{ox,dopant} \geq E^*_{red,host} \quad \text{Condition 3}$$

$$E_{red,dopant} \leq E^*_{ox,host} \quad \text{Condition 4}$$

$$T1_{dopant} - 0.4 \text{ eV} < |E_{red,host} - E_{ox,dopant}| < T1_{dopant} + 0.3 \text{ eV} \quad \text{Condition 5-1}$$

(for example, $T1_{dopant} - 0.3 \text{ eV} < |E_{red,host} - E_{ox,dopant}| < T1_{dopant} + 0.3 \text{ eV}$)

$$T1_{dopant} - 0.4 \text{ eV} < |E_{red,dopant} - E_{ox,host}| < T1_{dopant} + 0.3 \text{ eV} \quad \text{Condition 6-1}$$

(for example, $T1_{dopant} - 0.3 \text{ eV} < |E_{red,dopant} - E_{ox,host}| < T1_{dopant} + 0.3 \text{ eV}$)

$$S1_{dopant} - 0.4 \text{ eV} < |E_{red,host} - E_{ox,dopant}| < S1_{dopant} + 0.3 \text{ eV} \quad \text{Condition 5-2}$$

(for example, $S1_{dopant} - 0.3 \text{ eV} < |E_{red,host} - E_{ox,dopant}| < S1_{dopant} + 0.3 \text{ eV}$)

$$S1_{dopant} - 0.4 \text{ eV} < |E_{red,dopant} - E_{ox,host}| < S1_{dopant} + 0.3 \text{ eV} \quad \text{Condition 6-2}$$

(for example, $S1_{dopant} - 0.3 \text{ eV} < |E_{red,dopant} - E_{ox,host}| < S1_{dopant} + 0.3 \text{ eV}$), wherein "eV" denotes "electron volts".

In Conditions 1 to 6-2, "$E^*_{ox,dopant}$" represents an excited-state oxidation potential (expressed in electron volts, eV) of the dopant, "$E^*_{red,dopant}$" represents an excited-state reduction potential (eV) of the dopant, "$E_{ox,dopant}$" represents a ground-state oxidation potential (eV) of the dopant, "$E_{red,dopant}$" represents a ground-state reduction potential (eV) of the dopant, "$E^*_{red,host}$" represents an excited-state reduction potential (eV) of the host, "$E^*_{ox,host}$" represents an excited-state oxidation potential (eV) of the host, "$E_{red,host}$" represents a ground-state reduction potential (eV) of the host, "$E_{ox,host}$" represents a ground-state oxidation potential (eV) of the host, $E^*_{ox,dopant}$ may be identical to $E_{ox,dopant} - T1_{dopant}$, $E^*_{red,dopant}$ may be identical to $E_{red,dopant} + T1_{dopant}$, $E^*_{ox,host}$ may be identical to $E_{ox,host} - S1_{host}$, $E^*_{red,host}$ may be identical to $E_{red,host} + S1_{host}$, "$T1_{dopant}$" represents the lowest triplet energy level (eV) of the dopant, "$S1_{dopant}$" represents the lowest singlet energy level (eV) of the dopant, "$S1_{host}$" represents the lowest singlet energy level (eV) of the host, $E_{ox,dopant}$ and $E_{ox,host}$ may be measured by using cyclic voltammetry (CV), $E_{red,dopant}$ and $E_{red,host}$ may be measured by using differential pulse voltammetry, $T1_{dopant}$ and $S1_{dopant}$ may be calculated from a photoluminescence (PL) spectrum of the dopant in solution, and $S1_{host}$ may be calculated from a PL spectrum of the host in solution.

While not wishing to be bound by theory, it is understood that when the organic light-emitting device satisfies Conditions 1, 2, 3, and 4, reduction or oxidation of the host and/or the dopant in the emission layer through electron transfer may be substantially prevented, thereby substantially preventing generation of radical species in the emission layer. Since the radical species may cause various side reactions in the emission layer, the lifespan of the organic light-emitting device may be shortened.

In some embodiments, 1) when the dopant of the organic light-emitting device includes a phosphorescent dopant and at least one of Conditions 5-1 and 6-1 is satisfied in the organic light-emitting device; or 2) when the dopant of the organic light-emitting device includes a fluorescent dopant and at least one of Conditions 5-2 and 6-2 is satisfied in the organic light-emitting device, i) a limited degree of reduction or oxidation of the host and/or the dopant in the emission layer through electron transfer may occur, and ii) even when the reduction or oxidation of the host and/or the dopant in the emission layer through electron transfer occurs, back electron transfer may rapidly occur, which may facilitate rapid restoration of the host and/or the dopant to their/its original state before the reduction or oxidation. Accordingly, the reduction or oxidation of the host and/or the dopant in the emission layer through electron transfer may be substantially prevented and/or limited, thereby substantially preventing and/or limiting generation of radical species in the emission layer. Furthermore, re-excitation of the dopant may also be promoted.

While not wishing to be bound by theory, it is understood that when the organic light-emitting device satisfies the aforementioned conditions, generation of radical species in the emission layer may be substantially prevented and/or minimized, and thus, exciton quenching in the emission layer of the organic light-emitting device and electrochemical degradation and/or photochemical degradation of the host and the dopant in the emission layer may be substantially prevented and/or minimized. Therefore, the organic light-emitting device may have improved lifespan.

In one or more embodiments, the dopant of the organic light-emitting device may include a phosphorescent dopant, and in the organic light-emitting device, at least one of Conditions 5-1 and 6-1 may be satisfied.

In one or more embodiments, the dopant of the organic light-emitting device may include a fluorescent dopant, and in the organic light-emitting device, at least one of Conditions 5-2 and 6-2 may be satisfied.

In one or more embodiments, the dopant of the organic light-emitting device may include a phosphorescent dopant, and in the organic light-emitting device, Conditions 1 and 3 may not be satisfied, and Conditions 2, 4, 5-1, and 6-1 may be satisfied.

In one or more embodiments, the dopant of the organic light-emitting device may include a phosphorescent dopant, and in the organic light-emitting device, Conditions 3 and 6-1 may not be satisfied, and Conditions 1, 2, 4, and 5-1 may be satisfied.

i) The host may include (e.g., consist of) at least one donor compound, ii) the host may include (e.g., consist of) at least one acceptor compound, or iii) the host may include (e.g., consist of) a combination of at least one donor compound and at least one acceptor compound. When the host includes at least one donor compound and at least one acceptor compound, the donor compound and the acceptor compound may form an exciplex.

The donor compound may include at least one selected from a carbazole-including ring, a dibenzofuran-including ring, a dibenzothiophene-including ring, an indenocarbazole-including ring, an indolocarbazole-including ring, a benzofurocarbazole-including ring, a benzothienocarbazole-including ring, an acridine-including ring, a dihydroacridine-including ring, and a tri-indolobenzene-including ring, and the acceptor compound may include at least one selected from a carbazole-including ring, a dibenzofuran-including ring, a dibenzothiophene-including ring, an indenocarbazole-including ring, an indolocarbazole-including ring, a benzofurocarbazole-including ring, a benzothienocarbazole-including ring, a pyridine-including ring, a pyrimidine-including ring, and a triazine-including ring.

In some embodiments, the acceptor compound may include at least one electron withdrawing group, wherein the electron withdrawing group may be selected from:

—F, —CFH$_2$, —CF$_2$H, —CF$_3$, —CN, and —NO$_2$;

a C$_1$-C$_{60}$ alkyl group substituted with at least one selected from —F, —CFH$_2$, —CF$_2$H, —CF$_3$, —CN, and —NO$_2$;

a C$_1$-C$_{60}$ heteroaryl group and a monovalent non-aromatic condensed polycyclic heterocyclic group, each including *=N—*' as a ring-forming moiety; and a C$_1$-C$_{60}$ heteroaryl group and a monovalent non-aromatic condensed polycyclic heterocyclic group, each including *=N—*' as a ring-forming moiety and each substituted with at least one selected from deuterium, —F, —CFH$_2$, —CF$_2$H, —CF$_3$, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_7$-C$_{60}$ arylalkyl group, a substituted or unsubstituted C$_1$-C$_{60}$ heteroaryl group, a substituted or unsubstituted C$_1$-C$_{60}$ heteroaryloxy group, a substituted or unsubstituted C$_1$-C$_{60}$ heteroarylthio group, a substituted or unsubstituted C$_2$-C$_{60}$ heteroarylalkyl group, a substituted or unsubstituted monovalent non-aromatic condensed polycyclic group, and a substituted or unsubstituted monovalent non-aromatic condensed heteropolycyclic group.

In an embodiment, the donor compound may be selected from compounds represented by Formula D-1, and the acceptor compound may be selected from compounds represented by Formulae A-1 and A-2:

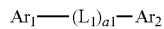

Formula D-1

Formula A-1

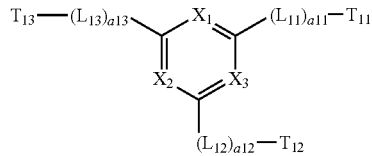

Formula A-2

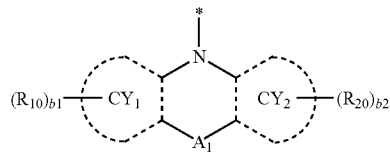

Formula 11

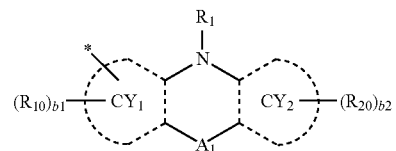

Formula 12

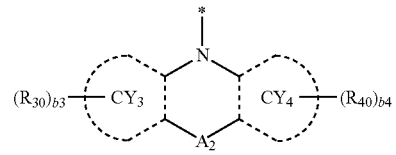

Formula 13

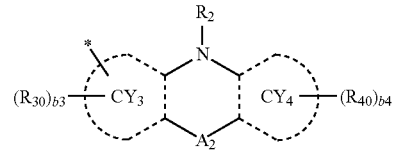

Formula 14 wherein, in Formulae D-1, A-1, A-2, and 11 to 14,

Ar$_1$ may be groups represented by Formulae 11 and 12,

Ar$_2$ may be selected from:

groups represented by Formulae 11 and 12, a phenyl group, a naphthyl group, and a benzimidazolyl group; and a phenyl group, a naphthyl group, and a benzimidazolyl group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a phenyl group, a naphthyl group, a fluorenyl group, a carbazolyl group, a dibenzofuranyl group, and a dibenzothiophenyl group, Ar$_{11}$ and Ar$_{12}$ may each independently be selected from groups represented by Formulae 13 and 14, X$_1$ may be N or C(T$_{14}$), X$_2$ may be N or C(T$_{15}$), and X$_3$ may be N or C(T$_{16}$), provided that at least one of X$_1$ to X$_3$ is N, L$_1$ may be selected from:

a single bond, a phenylene group, a naphthylene group, a fluorenylene group, a carbazolylene group, a dibenzofuranylene group, and a dibenzothiophenylene group; and a phenylene group, a naphthylene group, a fluorenylene group, a carbazolylene group, a dibenzofuranylene group, and a dibenzothiophenylene group, each substituted with at least one selected from deuterium, a C$_1$-C$_{10}$ alkyl group, a C$_1$-C$_{10}$ alkoxy group, a phenyl group, a naphthyl group, a fluorenyl group, a carbazolyl group, a dibenzofuranyl group, a dibenzothiophenyl group, and —Si(Q$_{11}$)(Q$_{12}$)(Q$_{13}$), L$_{11}$ to L$_{13}$ may each independently be selected from:

a single bond, a phenylene group, a pyridinylene group, a pyrimidinylene group, a pyrazinylene group, a pyridazinylene group, a triazinylene group, a naphthylene group, a fluorenylene group, a carbazolylene group, a dibenzofuranylene group, and a dibenzothiophenylene group; and a phenylene group, a pyridinylene group, a pyrimidinylene group, a pyrazinylene group, a pyridazinylene group, a triazinylene group, a naphthylene group, a fluorenylene group, a carbazolylene group, a dibenzofuranylene group, and a dibenzothiophenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, —$CFH_2$, a phenyl group, a phenyl group substituted with a cyano group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —$Si(Q_{11})(Q_{12})(Q_{13})$, a1 and a11 to a13 may each independently be an integer selected from 0 to 5; when a1 is 2 or greater, at least two $L_1$ groups may be identical to or different from each other; when a11 is 2 or greater, at least two $L_{11}$ groups may be identical to or different from each other; when a12 is 2 or greater, at least two $L_{12}$ groups may be identical to or different from each other; and when a13 is 2 or greater, at least two $L_{13}$ groups may be identical to or different from each other, $CY_1$ to $CY_4$ may each independently be selected from a benzene group, a naphthalene group, a fluorene group, a carbazole group, a benzocarbazole group, an indolocarbazole group, a dibenzofuran group, and a dibenzothiophene group, $A_1$ may be selected from a single bond, a $C_1$-$C_4$ alkylene group, and a $C_2$-$C_4$ alkenylene group; and a $C_1$-$C_4$ alkylene group and a $C_2$-$C_4$ alkenylene group, each substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, and —$Si(Q_{21})(Q_{22})(Q_{23})$, $A_2$ may be selected from:

a single bond, a $C_1$-$C_4$ alkylene group, and a $C_2$-$C_4$ alkenylene group; and a $C_1$-$C_4$ alkylene group and a $C_2$-$C_4$ alkenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —$Si(Q_{21})(Q_{22})(Q_{23})$, $R_1$, $R_{10}$, and $R_{20}$ may each independently be selected from:

hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, and a dibenzothiophenyl group;

a phenyl group, a naphthyl group, a fluorenyl group, a carbazolyl group, a dibenzofuranyl group, and a dibenzothiophenyl group;

a phenyl group, a naphthyl group, a fluorenyl group, a carbazolyl group, a dibenzofuranyl group, and a dibenzothiophenyl group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, and a dibenzothiophenyl group; and —$Si(Q_1)(Q_2)(Q_3)$, $T_{11}$ to $T_{16}$, $R_2$, $R_{30}$, and $R_{40}$ may each independently be selected from hydrogen, deuterium, —F, —Cl, —Br, —I, a hydroxyl group, a cyano group (CN), a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, and —$Si(Q_1)(Q_2)(Q_3)$, b1 to b4 may each independently be an integer selected from 0 to 10, and at least one substituent of the substituted $C_1$-$C_{60}$ alkyl group, substituted $C_2$-$C_{60}$ alkenyl group, substituted $C_2$-$C_{60}$ alkynyl group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_7$-$C_{60}$ arylalkyl group, substituted $C_1$-$C_{60}$ heteroaryl group, substituted $C_1$-$C_{60}$ heteroaryloxy group, substituted $C_1$-$C_{60}$ heteroarylthio group, substituted $C_2$-$C_{60}$ heteroarylalkyl group, substituted monovalent non-aromatic condensed polycyclic group, and substituted monovalent non-aromatic condensed heteropolycyclic group may be selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, and —$Si(Q_{31})(Q_{32})(Q_{33})$, wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In some embodiments, in Formula D-1, $Ar_1$ may be selected from groups represented by Formulae 11-1 to 11-8 and 12-1 to 12-8, in Formula D-1, $Ar_2$ may be selected from groups represented by Formulae 11-1 to 11-8 and 12-1 to 12-8, a phenyl group, a naphthyl group, and a benzimidazolyl group substituted with a phenyl group, and in Formula A-1, $Ar_{11}$ and $Ar_{12}$ may each independently be selected from groups represented by Formulae 13-1 to 13-8 and 14-1 to 14-8:

Formula 11-1
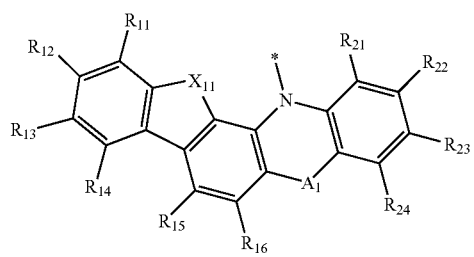

Formula 11-2
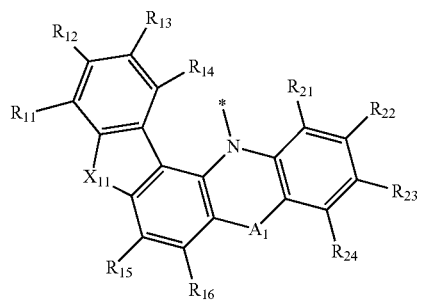

Formula 11-3
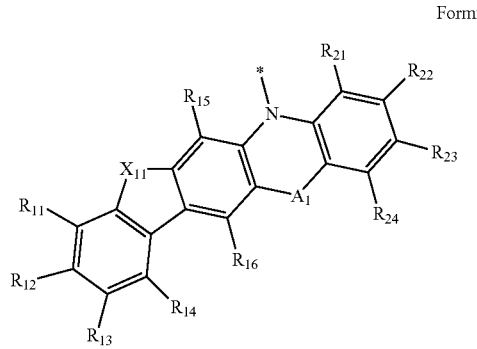

Formula 11-4
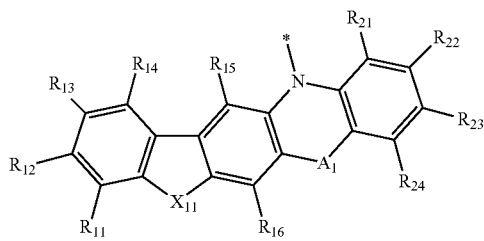

Formula 11-5
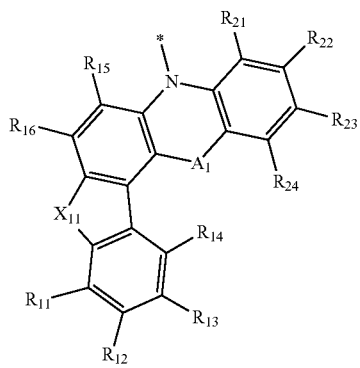

Formula 11-6
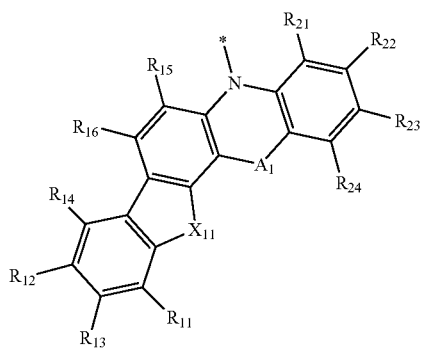

Formula 11-7
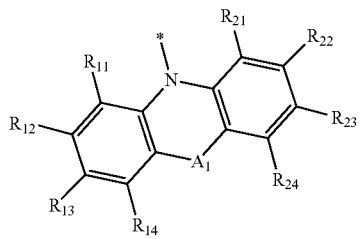

Formula 11-8
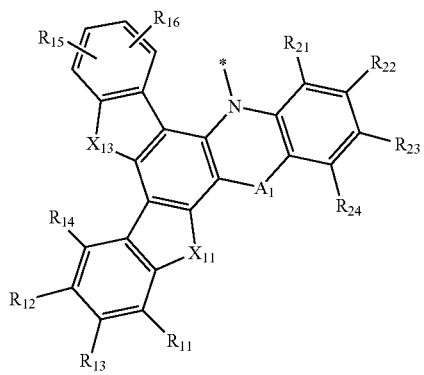

Formula 12-1
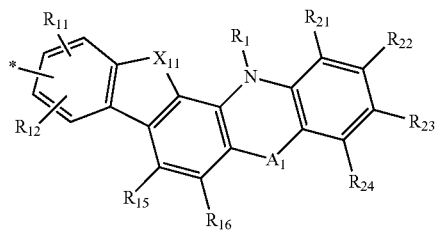
Formula 12-2
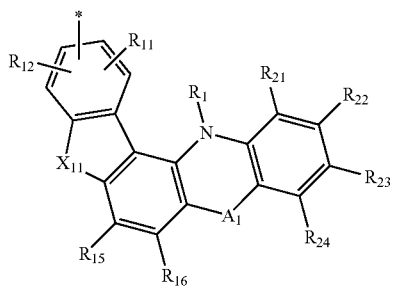
Formula 12-3
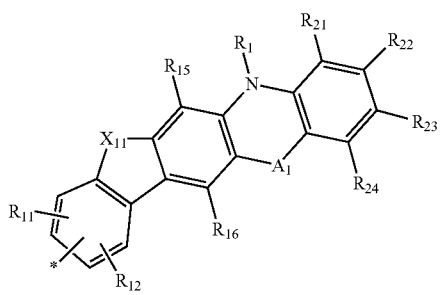
Formula 12-4
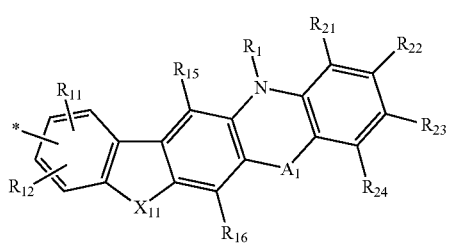
Formula 12-5
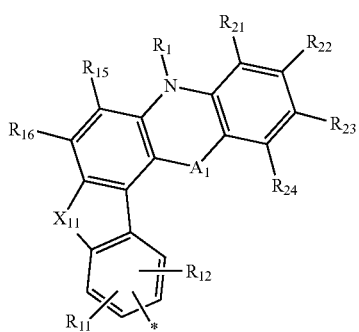
Formula 12-6
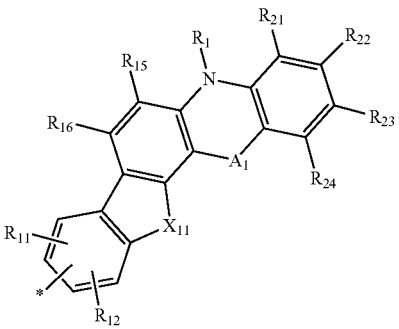
Formula 12-7
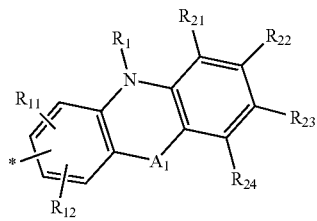
Formula 12-8
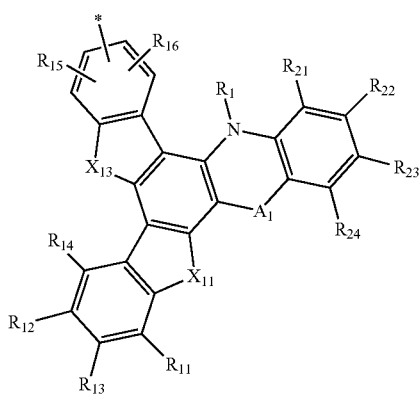
Formula 13-1
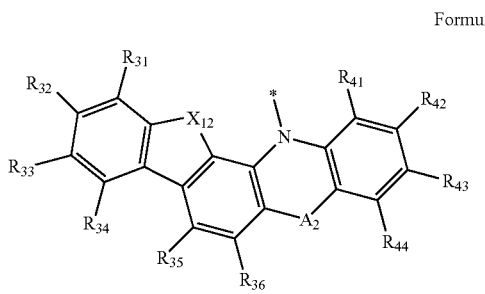
Formula 13-2
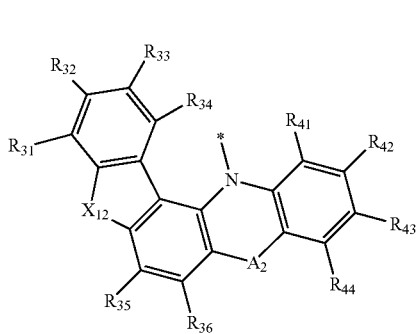

-continued
Formula 13-3
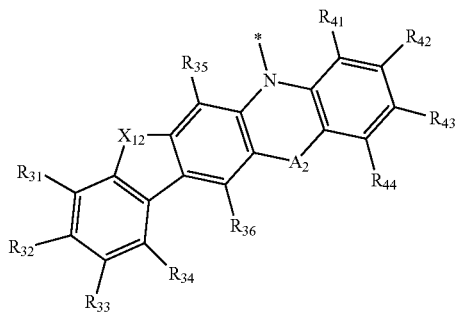
Formula 13-4
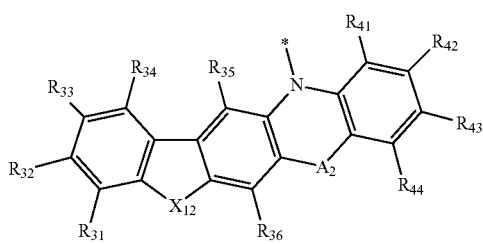
Formula 13-5
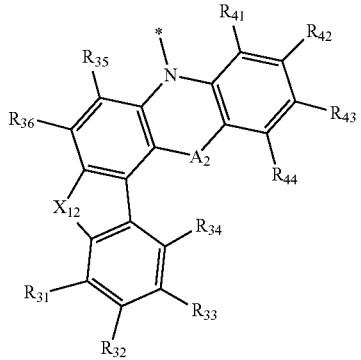
Formula 13-6
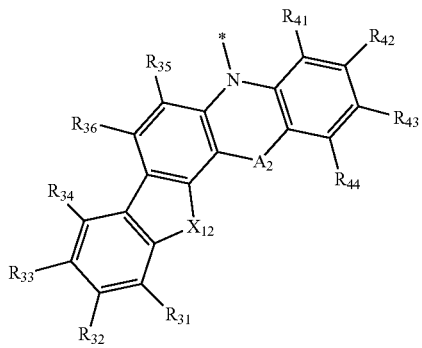
Formula 13-7
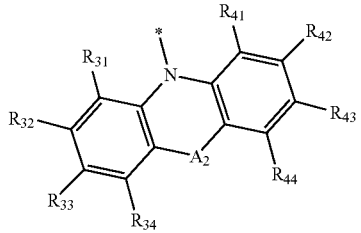
Formula 13-8
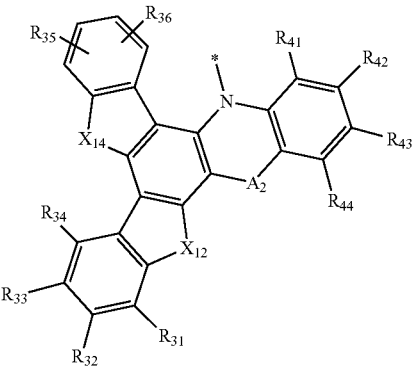
Formula 14-1
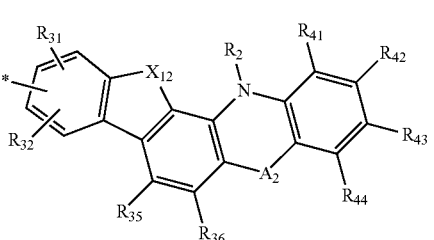
Formula 14-2
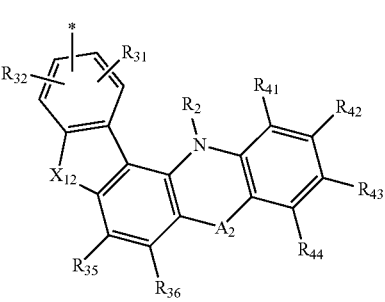
Formula 14-3
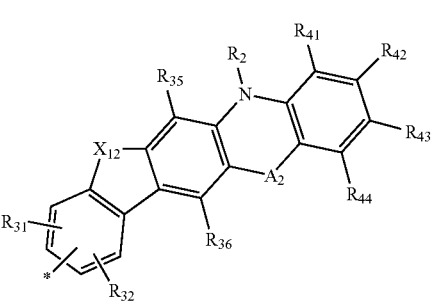
Formula 14-4
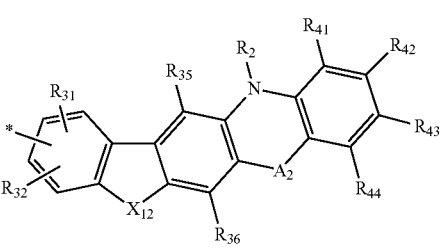

-continued

Formula 14-5

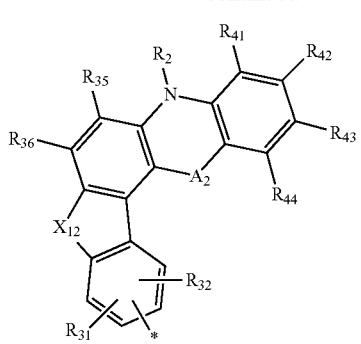

Formula 14-6

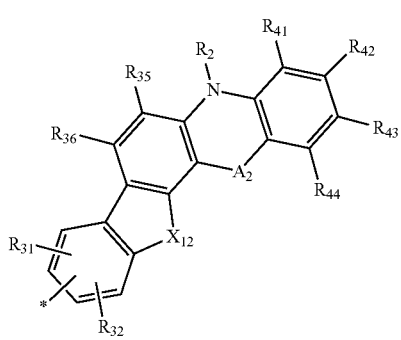

Formula 14-7

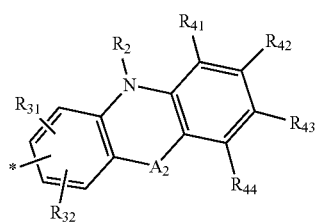

Formula 14-8

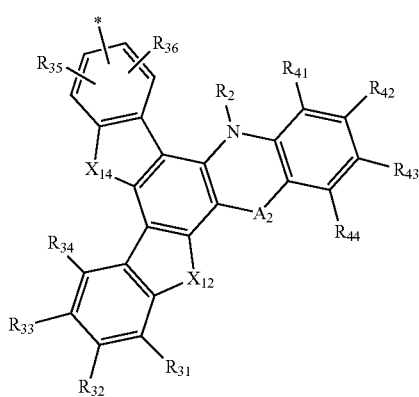

wherein, in Formulae 11-1 to 11-8, 12-1 to 12-8, 13-1 to 13-8, and 14-1 to 14-8, $X_{11}$ and $X_{13}$ may each independently be $C(R_{17})(R_{18})$, $N(R_{19})$, O, or S, $X_{12}$ and $X_{14}$ may each independently be $C(R_{37})(R_{38})$, $N(R_{39})$, O, or S, $R_1$, $R_2$, $A_1$, and $A_2$ may be the same as those defined herein, $R_{11}$ to $R_{19}$ may be the same as described herein with reference to $R_{10}$, $R_{21}$ to $R_{24}$ may be the same as described herein with reference to $R_{20}$, $R_{31}$ to $R_{39}$ may be the same as described herein with reference to $R_{30}$, $R_{41}$ to $R_{44}$ may be the same as described herein with reference to $R_{40}$, and

* indicates a binding site to an adjacent atom.

In some embodiments, in Formulae 11, 12, 11-1 to 11-8, and 12-1 to 12-8, $A_1$ may be selected from:

a single bond, a $C_1$-$C_2$ alkylene group, and a $C_2$ alkenylene group; and a $C_1$-$C_2$ alkylene group and a $C_2$ alkenylene group, each substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, and —Si$(Q_{21})(Q_{22})(Q_{23})$, in Formulae 13, 14, 13-1 to 13-8, and 14-1 to 14-8, A2 may be selected from:

a single bond, a $C_1$-$C_2$ alkylene group, and a $C_2$ alkenylene group; and a $C_1$-$C_2$ alkylene group and a $C_2$ alkenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —Si$(Q_{21})(Q_{22})(Q_{23})$, and in Formulae 13, 14, 13-1 to 13-8, and 14-1 to 14-8, $R_2$, $R_{30}$ to $R_{39}$, and $R_{40}$ to $R_{44}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, and a dibenzothiophenyl group;

a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group;

a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group; and —Si(Q₁)(Q₂)(Q₃), wherein $Q_1$ to $Q_3$ and $Q_{21}$ to $Q_{23}$ may each independently be selected from hydrogen, a $C_1$-$C_{10}$ alkyl group, a $C_1$-$C_{10}$ alkoxy group, a phenyl group, and a naphthyl group, but embodiments are not limited thereto.

In an embodiment, in Formula D-1, $Ar_1$ may be selected from groups represented by Formulae 15-1 to 15-17 and 16-1 to 16-8, in Formula D-1, $Ar_2$ may be selected from groups represented by Formulae 15-1 to 15-17 and 16-1 to 16-8, a phenyl group, a naphthyl group, and an imidazolyl group substituted with a phenyl group, and in Formula A-1, $Ar_{11}$ and $Ar_{12}$ may each independently be selected from groups represented by Formulae 17-1 to 17-3, but embodiments are not limited thereto:

Formula 15-1

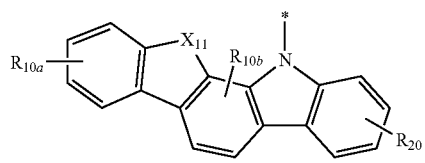

Formula 15-2

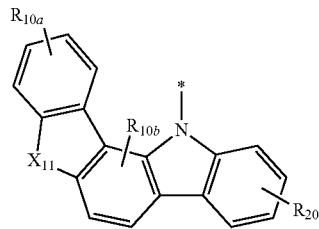

Formula 15-3

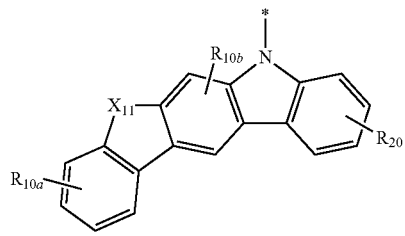

Formula 15-4

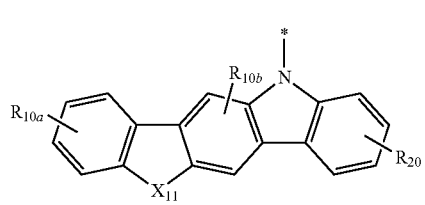

Formula 15-5

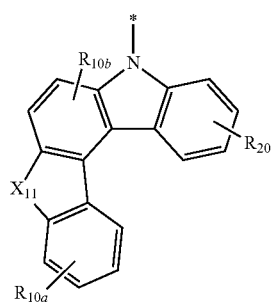

Formula 15-6

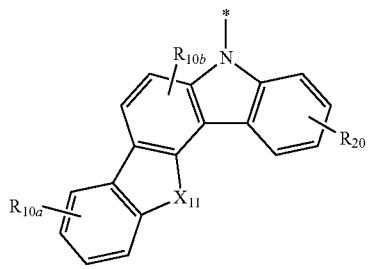

Formula 15-7

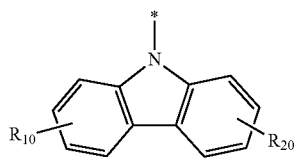

Formula 15-8

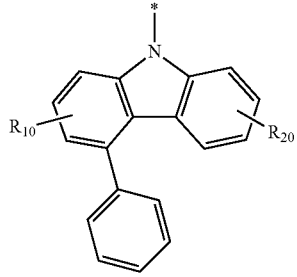

Formula 15-9

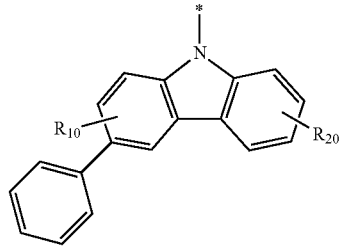

Formula 15-10

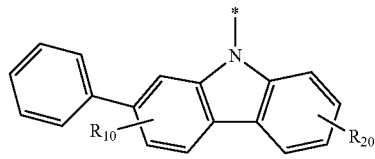

Formula 15-11

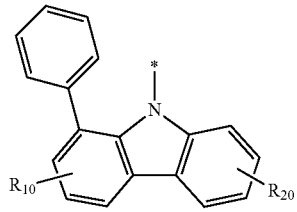

Formula 15-12

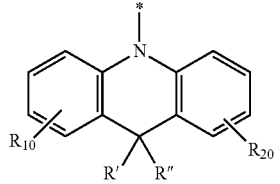

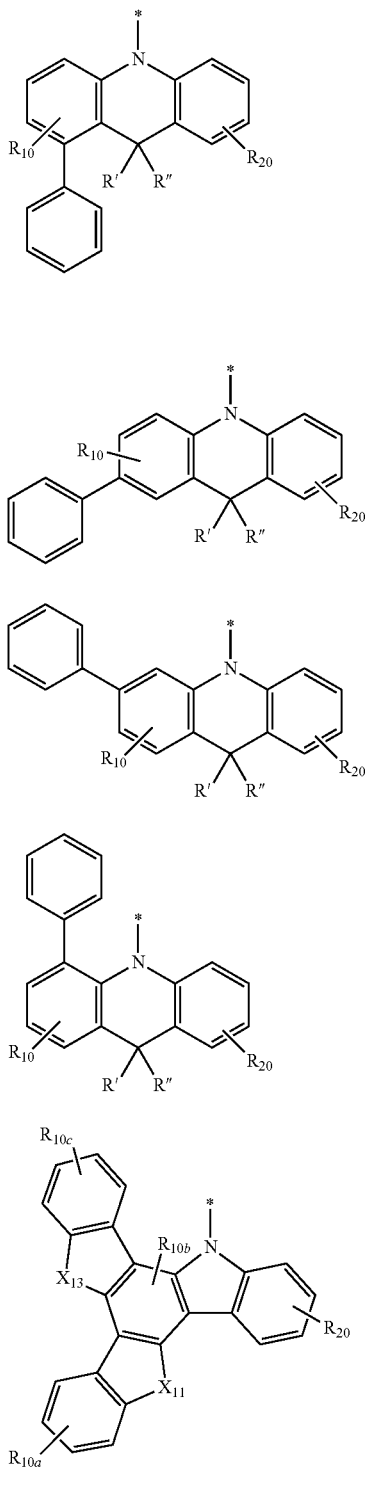
Formula 15-13
Formula 15-14
Formula 15-15
Formula 15-16
Formula 15-17
Formula 16-1
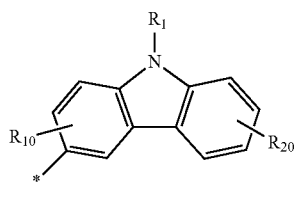
Formula 16-2
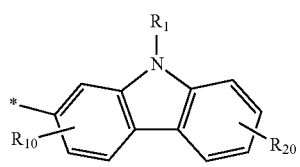
Formula 16-3
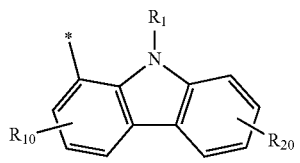
Formula 16-4
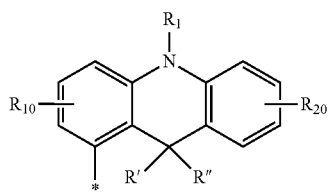
Formula 16-5
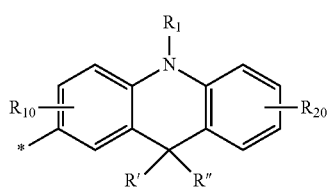
Formula 16-6
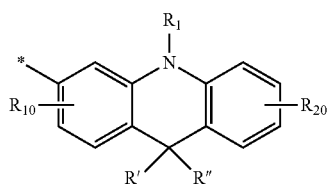
Formula 16-7
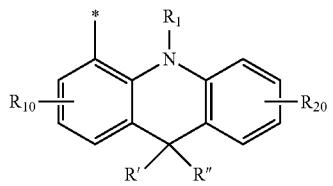
Formula 16-8
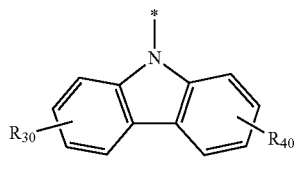
Formula 17-1

-continued

Formula 17-2

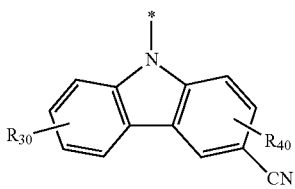

Formula 17-3

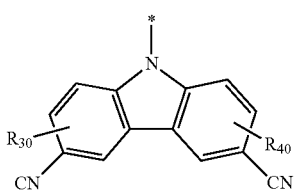

wherein, in Formulae 15-1 to 15-17, 16-1 to 16-18, and 17-1 to 17-3, $X_{11}$ and $X_{13}$ may each independently be $C(R_{17})(R_{18})$, $N(R_{19})$, O, or S, R' and R" may each independently be selected from hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, and a dibenzothiophenyl group, $R_1$, $R_{10}$, $R_{20}$, $R_{30}$, and $R_{40}$ may be the same as those described herein, and $R_{10a}$ to $R_{10c}$ may be the same as described herein with reference to $R_{10}$.

In some embodiments, in Formulae 15-1 to 15-17, 16-1 to 16-18, and 17-1 to 17-3, $R_1$, $R_{10}$, $R_{10a}$ to $R_{10c}$, and $R_{20}$ may each independently be selected from hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, and —Si($Q_1$)($Q_2$)($Q_3$), and $R_{30}$ and $R_{40}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —CF$_3$, —CF$_2$H, and —CFH$_2$;

a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group;

a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —CF$_3$, —CF$_2$H, —CFH$_2$, a phenyl group, a pyridinyl group, a pyrimidinyl group, a pyrazinyl group, a pyridazinyl group, a triazinyl group, a naphthyl group, a fluorenyl group, a carbazolyl group, a dibenzofuranyl group, and a dibenzothiophenyl group; and —Si($Q_1$)($Q_2$)($Q_3$), wherein $Q_1$ to $Q_3$ may each independently be selected from hydrogen, a $C_1$-$C_{10}$ alkyl group, a $C_1$-$C_{10}$ alkoxy group, a phenyl group, and a naphthyl group, but embodiments are not limited thereto.

In some embodiments, i) the donor compound may be represented by Formula D-1 in which $L_1$ is a single bond; or ii) the donor compound may be selected from compounds represented by Formulae D-1 (1) to D-1(52):

Formula D-1(1)

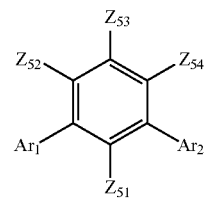

Formula D-1(2)

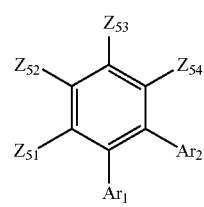

Formula D-1(3)

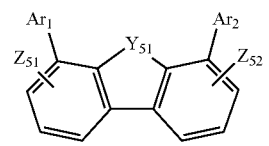

Formula D-1(4)

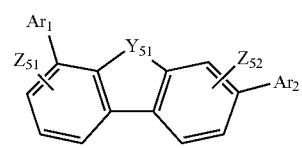

Formula D-1(5)

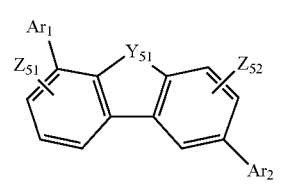

Formula D-1(6)

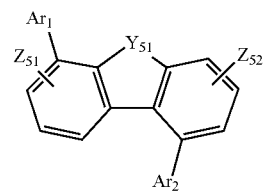

Formula D-1(7)

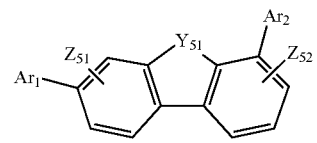

Formula D-1(8)

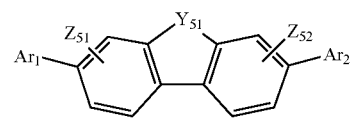

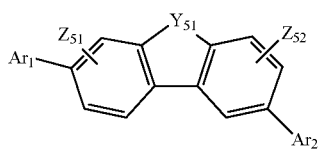
Formula D-1(9)
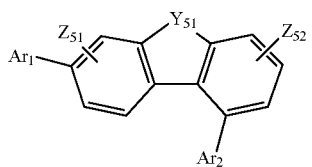
Formula D-1(10)
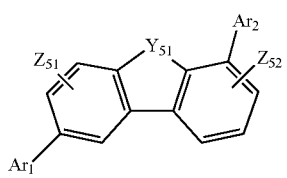
Formula D-1(11)
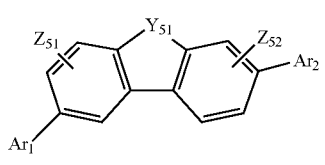
Formula D-1(12)
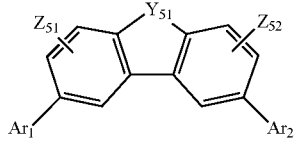
Formula D-1(13)
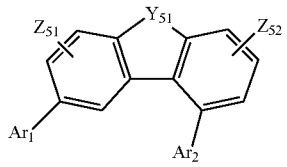
Formula D-1(14)
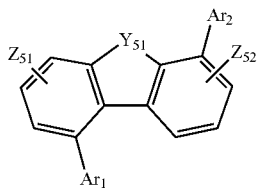
Formula D-1(15)
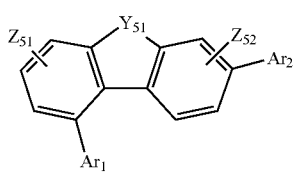
Formula D-1(16)
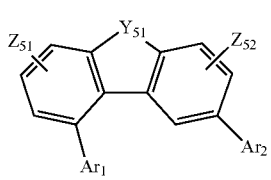
Formula D-1(17)
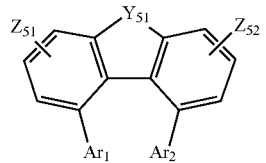
Formula D-1(18)
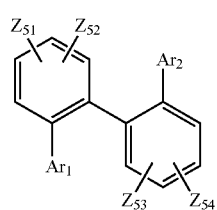
Formula D-1(19)
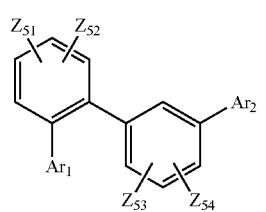
Formula D-1(20)
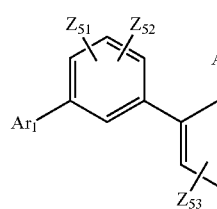
Formula D-1(21)
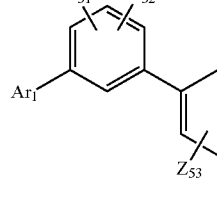
Formula D-1(22)
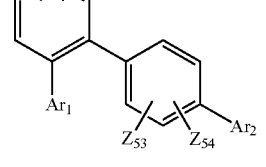
Formula D-1(23)
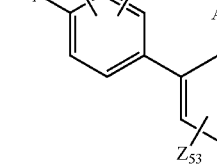
Formula D-1(24)

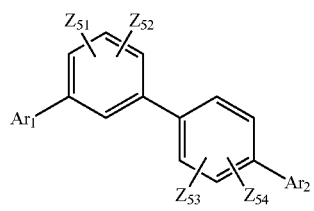
Formula D-1(25)
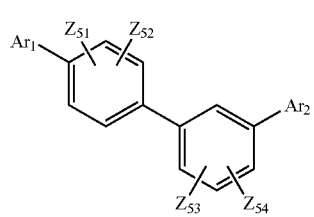
Formula D-1(26)
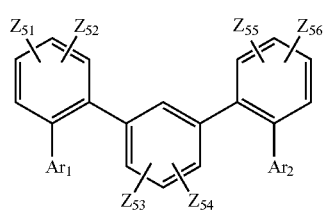
Formula D-1(27)
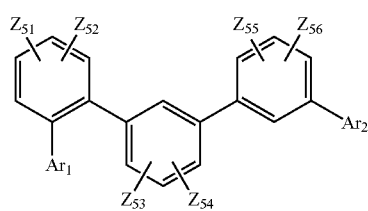
Formula D-1(28)
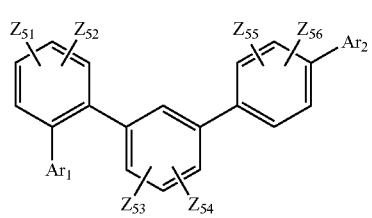
Formula D-1(29)
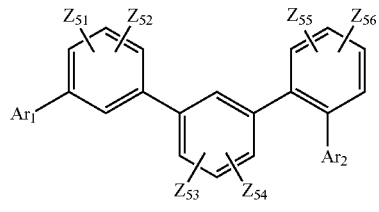
Formula D-1(30)
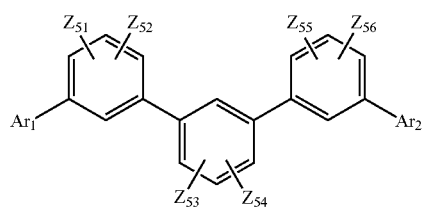
Formula D-1(31)
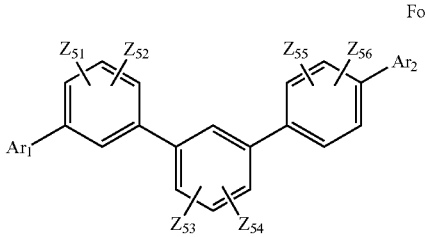
Formula D-1(32)
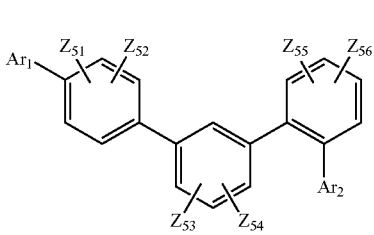
Formula D-1(33)
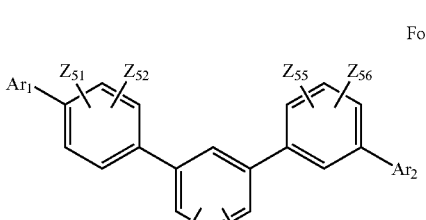
Formula D-1(34)
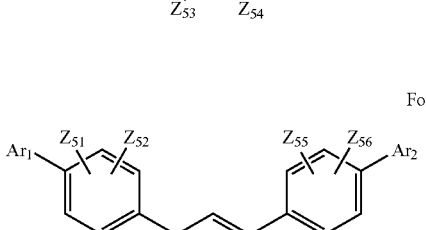
Formula D-1(35)
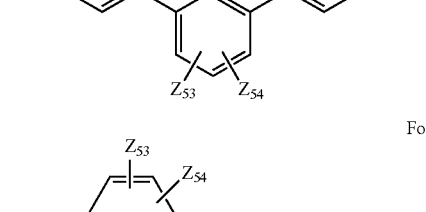
Formula D-1(36)
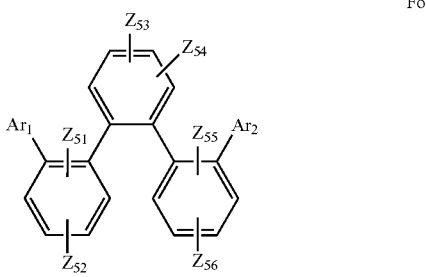
Formula D-1(37)
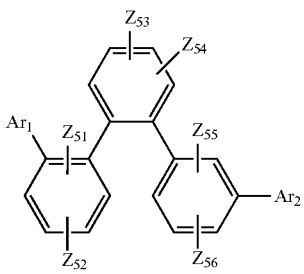

Formula D-1(38)
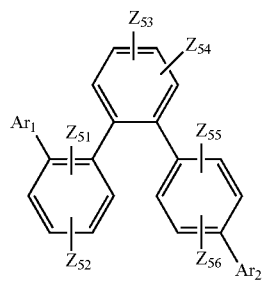
Formula D-1(39)
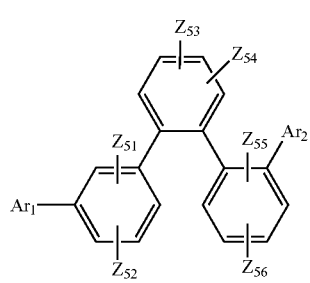
Formula D-1(40)
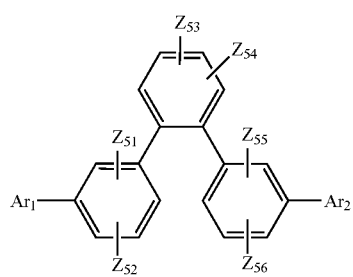
Formula D-1(41)
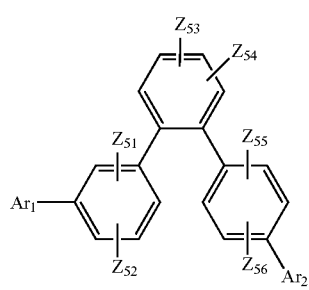
Formula D-1(42)
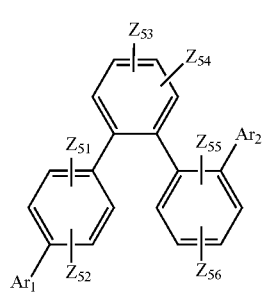
Formula D-1(43)
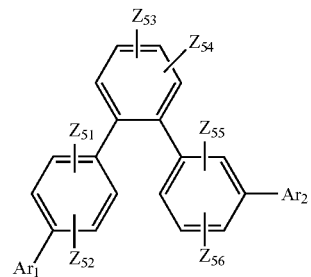
Formula D-1(44)
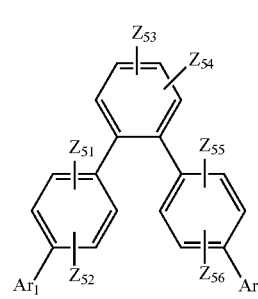
Formula D-1(45)
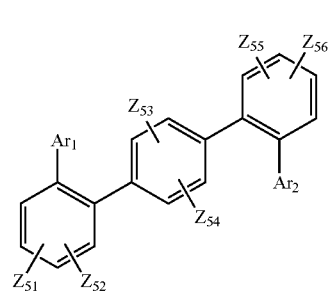
Formula D-1(46)
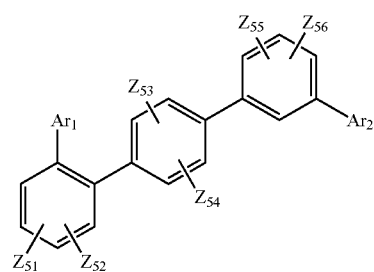
Formula D-1(47)
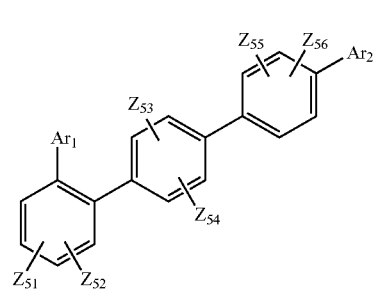

-continued

Formula D-1(48)
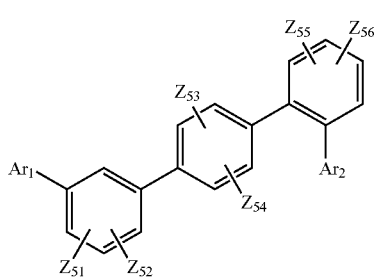

Formula D-1(49)
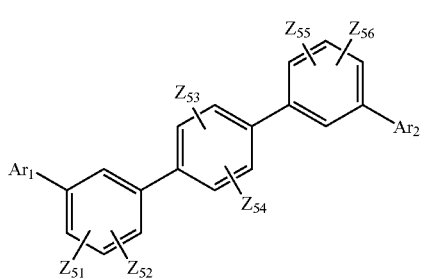

Formula D-1(50)
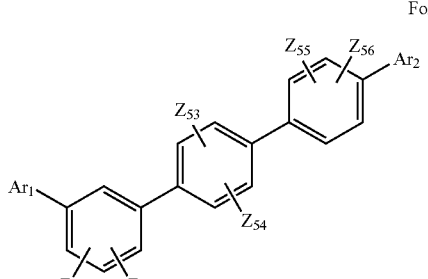

Formula D-1(51)
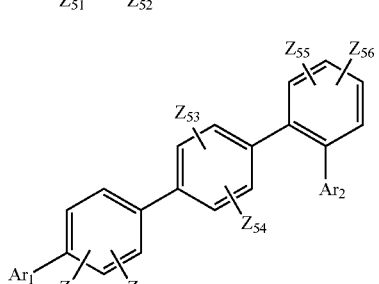

Formula D-1(52)
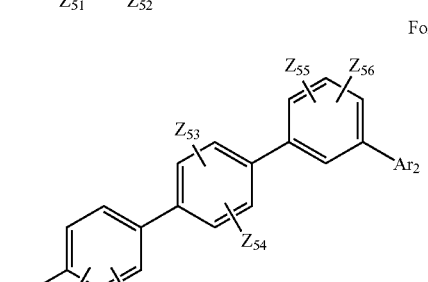

wherein, in Formulae D-1(1) to D-1(52), $Ar_1$ and $Ar_2$ may be the same as those described herein, $Y_{51}$ may be $C(Z_{53})(Z_{54})$, $N(Z_{55})$, O, or S, and $Z_{51}$ to $Z_{56}$ may each independently be selected from hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, and —$Si(Q_{11})(Q_{12})(Q_{13})$, wherein $Q_{11}$ to $Q_{13}$ may each independently be selected from hydrogen, a $C_1$-$C_{10}$ alkyl group, a $C_1$-$C_{10}$ alkoxy group, a phenyl group, and a naphthyl group.

In some embodiments, in Formulae D-1(1) to D-1(52), $Ar_1$ may be selected from groups represented by Formulae 11 and 12, and $Ar_2$ may be selected from:

groups represented by Formulae 11 and 12, a phenyl group, a naphthyl group, and a benzimidazolyl group; and a phenyl group, a naphthyl group, and a benzimidazolyl group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, and a dibenzothiophenyl group.

In one or more embodiments, in Formulae D-1(1) to D-1(52), $Ar_1$ may be selected from groups represented by Formulae 11-1 to 11-8 and 12-1 to 12-8, $Ar_2$ may be selected from groups represented by Formulae 11-1 to 11-8 and 12-1 to 12-8, a phenyl group, a naphthyl group, and a benzimidazolyl group substituted with a phenyl group, but embodiments are not limited thereto.

In Formulae A-1 and A-2, $L_{11}$ to $L_{13}$ may each independently be selected from groups represented by Formulae 3-1 to 3-56, and i) at least one $L_{11}$ in the number of a11, ii) at least one $L_{12}$ in the number of a12, and iii) at least one $L_{13}$ in the number of a13 may each independently be selected from groups represented by Formulae 3-15 to 3-56:

Formula 3-1
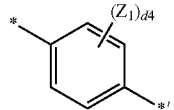

Formula 3-2
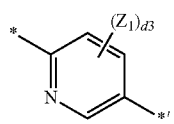

Formula 3-3
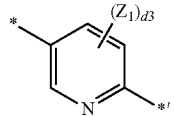

Formula 3-4
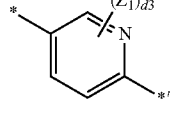

Formula 3-5
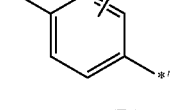

Formula 3-6
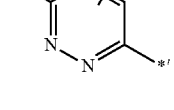

-continued
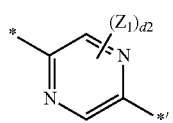
Formula 3-7
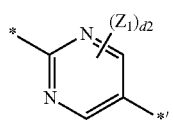
Formula 3-8
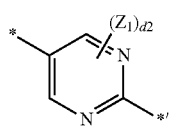
Formula 3-9
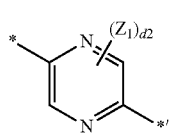
Formula 3-10
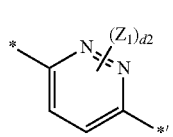
Formula 3-11
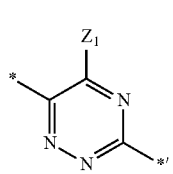
Formula 3-12
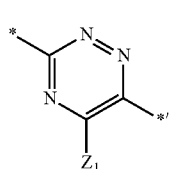
Formula 3-13
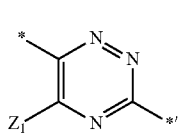
Formula 3-14
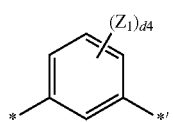
Formula 3-15
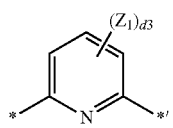
Formula 3-16
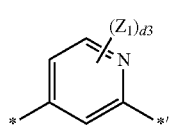
Formula 3-17
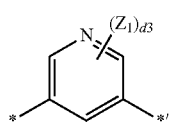
Formula 3-18
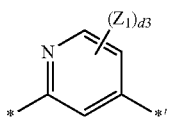
Formula 3-19
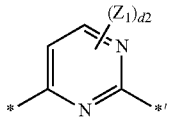
Formula 3-20
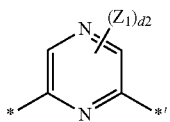
Formula 3-21
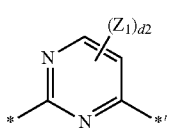
Formula 3-22
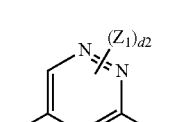
Formula 3-23
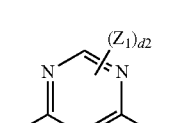
Formula 3-24
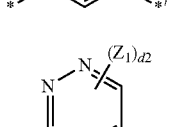
Formula 3-25
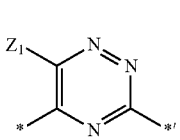
Formula 3-26
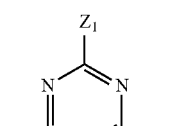
Formula 3-27
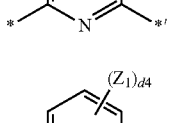
Formula 3-28
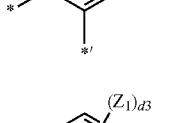
Formula 3-29

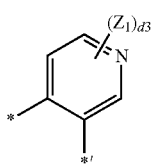
Formula 3-30
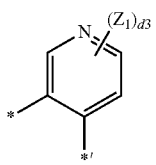
Formula 3-31
Formula 3-32
Formula 3-33
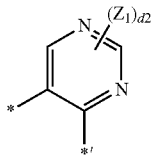
Formula 3-34
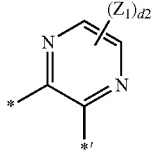
Formula 3-35
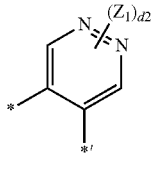
Formula 3-36
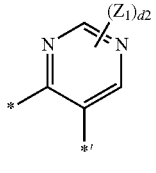
Formula 3-37
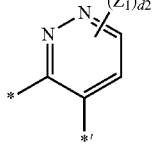
Formula 3-38
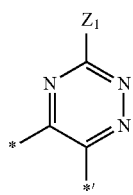
Formula 3-39
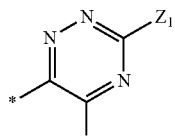
Formula 3-40
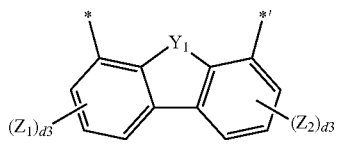
Formula 3-41
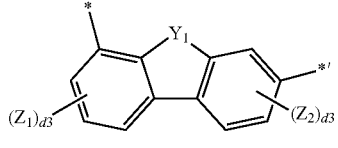
Formula 3-42
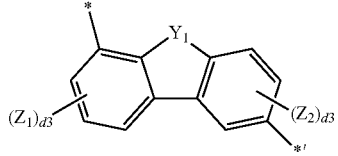
Formula 3-43
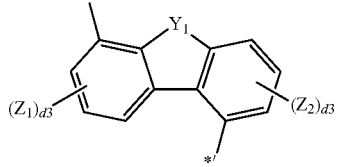
Formula 3-44
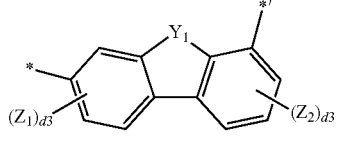
Formula 3-45
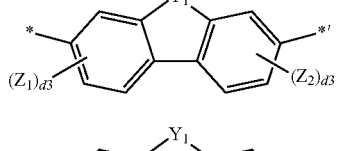
Formula 3-46
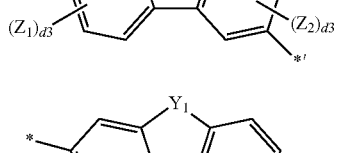
Formula 3-47
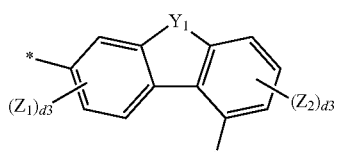
Formula 3-48

-continued

Formula 3-49
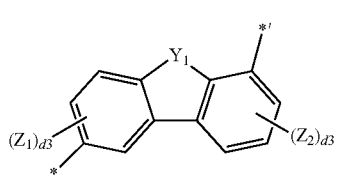

Formula 3-50
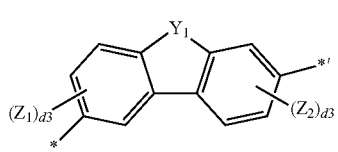

Formula 3-51
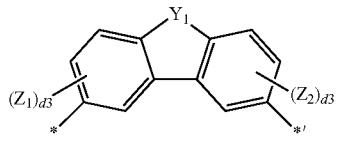

Formula 3-52
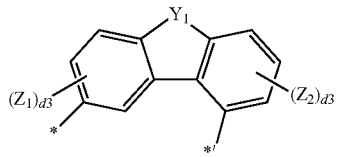

Formula 3-53
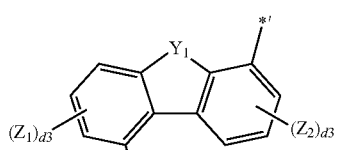

Formula 3-54
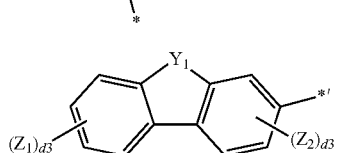

Formula 3-55
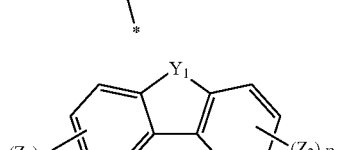

Formula 3-56
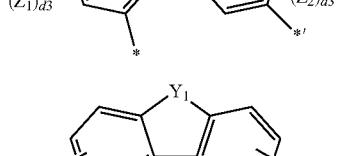

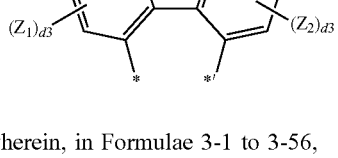

wherein, in Formulae 3-1 to 3-56, $Y_1$ may be selected from O, S, $C(Z_3)(Z_4)$, and $N(X_5)$, $Z_1$ to $X_5$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, —$CFH_2$, a phenyl group, a phenyl group substituted with a cyano group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —Si($Q_{11}$)($Q_{12}$)($Q_{13}$), wherein $Q_{11}$ to $Q_{13}$ may each independently be selected from hydrogen, a $C_1$-$C_{10}$ alkyl group, a $C_1$-$C_{10}$ alkoxy group, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group, and d4 may be an integer selected from 0 to 4, d3 may be an integer selected from 0 to 3, d2 may be an integer selected from 0 to 2, and

*and*' each indicate a binding site to an adjacent atom.

In one or more embodiments, in Formulae A-1 and A-2, groups represented by *-($L_{11}$)$_{a11}$-*', *-($L_{12}$)$_{a12}$-*', and *-($L_{13}$)$_{a13}$-*' may be selected from groups represented by Formulae 4-1 to 4-39:

Formula 4-1
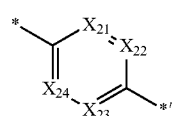

Formula 4-2
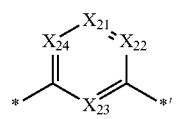

Formula 4-3
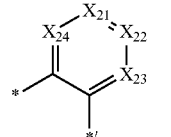

Formula 4-4
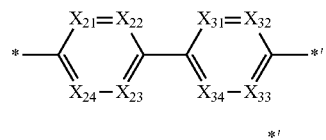

Formula 4-5
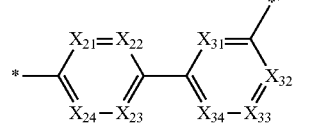

Formula 4-6
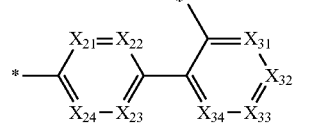

Formula 4-7
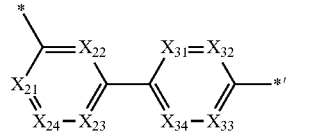

Formula 4-8
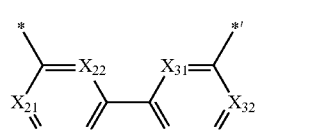

-continued
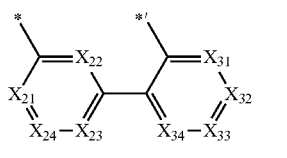
Formula 4-9
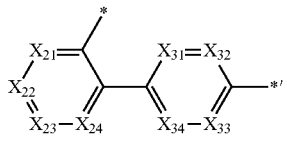
Formula 4-10
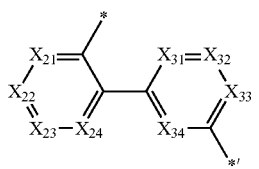
Formula 4-11
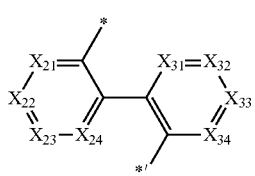
Formula 4-12
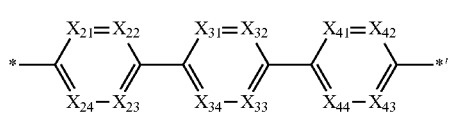
Formula 4-13
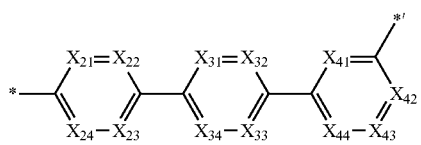
Formula 4-14
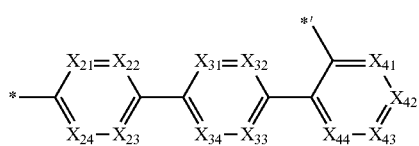
Formula 4-15
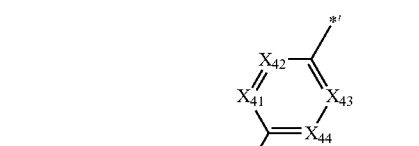
Formula 4-16
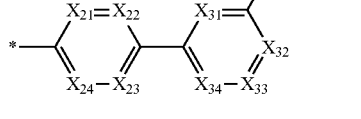
Formula 4-17
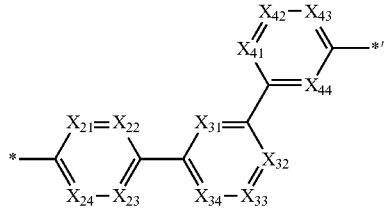
Formula 4-18
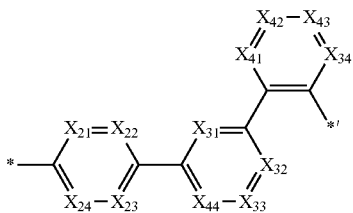
Formula 4-19
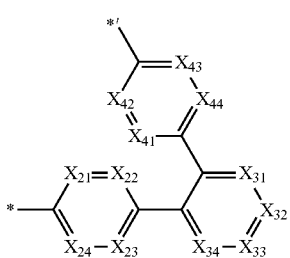
Formula 4-20
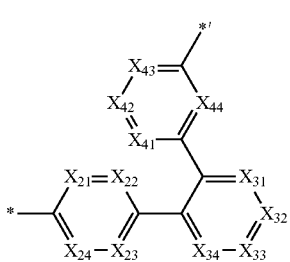
Formula 4-21
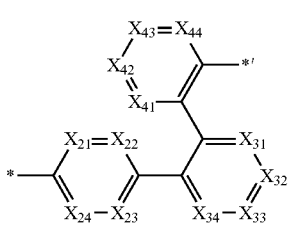
Formula 4-22
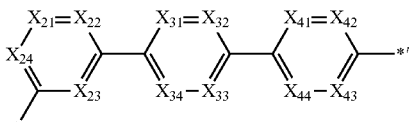
Formula 4-23
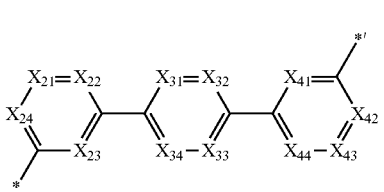
Formula 4-24
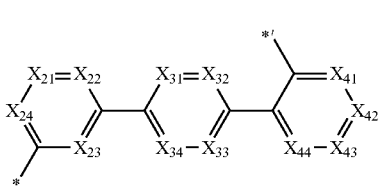

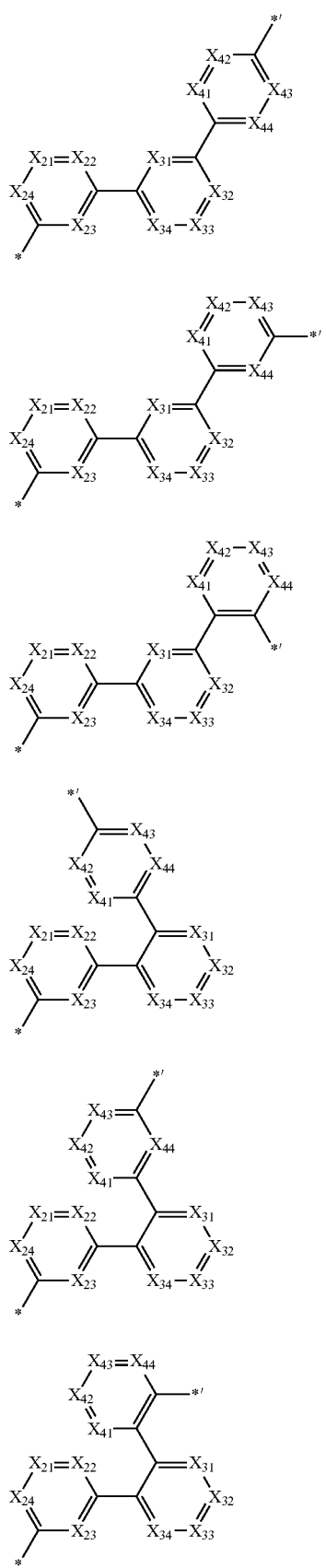
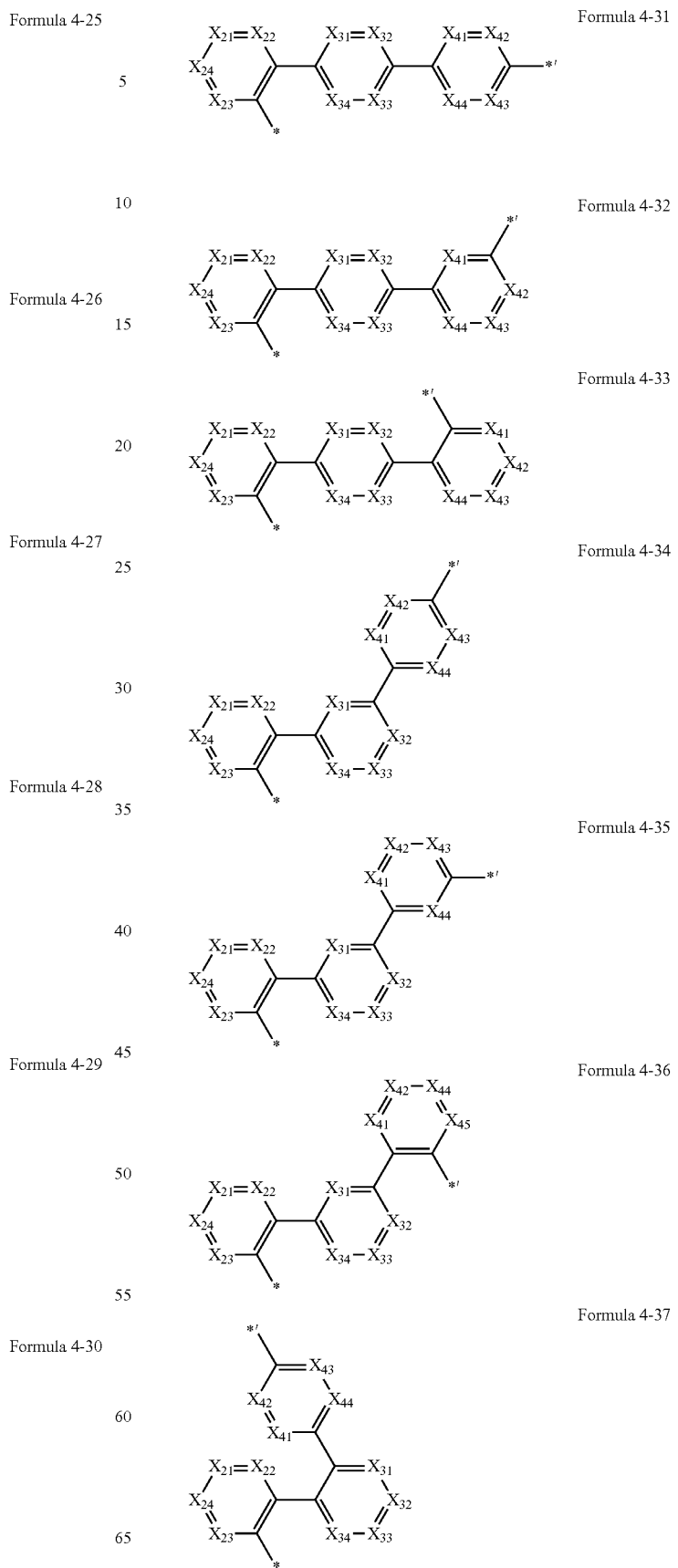

-continued

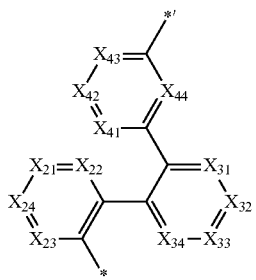

Formula 4-38

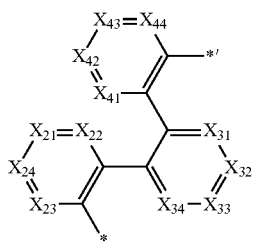

Formula 4-39 wherein, in Formulae 4-1 to 4-39, $X_{21}$ may be N or $C(Z_{21})$, $X_{22}$ may be N or $C(Z_{22})$, $X_{23}$ may be N or $C(Z_{23})$, $X_{24}$ may be N or $C(Z_{24})$, $X_{31}$ may be N or $C(Z_{31})$, $X_{32}$ may be N or $C(Z_{32})$, $X_{33}$ may be N or $C(Z_{33})$, $X_{34}$ may be N or $C(Z_{34})$, $X_{41}$ may be N or $C(Z_{41})$, $X_{42}$ may be N or $C(Z_{42})$, $X_{43}$ may be N or $C(Z_{43})$, and $X_{44}$ may be N or $C(Z_{44})$, provided that at least one of $X_{21}$ to $X_{24}$ is not N, at least one of $X_{31}$ to $X_{34}$ is not N, and at least one of $X_{41}$ to $X_{44}$ is not N, $Z_{21}$ to $Z_{24}$, $Z_{31}$ to $Z_{34}$, and $Z_{41}$ to $Z_{44}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, —$CFH_2$, a phenyl group, a phenyl group substituted with a cyano group, a naphthyl group, a pyridinyl group, a pyrimidinyl group, a pyrazinyl group, a pyridazinyl group, a triazinyl group, a fluorenyl group, a carbazolyl group, a dibenzofuranyl group, a dibenzothiophenyl group, and —$Si(Q_{11})(Q_{12})(Q_{13})$, wherein $Q_{11}$ to $Q_{13}$ may each independently be selected from hydrogen, a $C_1$-$C_{10}$ alkyl group, a $C_1$-$C_{10}$ alkoxy group, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group, and

*and*' each indicate a binding site to an adjacent atom.

In Formula A-2, $T_{11}$ to $T_{16}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, and —$CFH_2$;

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$CF_3$, —$CF_2H$, and —$CFH_2$;

a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group;

a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$CF_3$, —$CF_2H$, —$CFH_2$, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group; and —$Si(Q_1)(Q_2)(Q_3)$, wherein $Q_1$ to $Q_3$ may each independently be selected from hydrogen, a $C_1$-$C_{10}$ alkyl group, a $C_1$-$C_{10}$ alkoxy group, a phenyl group, a naphthyl group, a pyridinyl group, a pyrimidinyl group, a pyrazinyl group, a pyridazinyl group, a triazinyl group, a fluorenyl group, a carbazolyl group, a dibenzofuranyl group, and a dibenzothiophenyl group.

In some embodiments, in Formula A-2, $T_{11}$ to $T_{16}$ may each independently be selected from:

hydrogen, deuterium, —F, a cyano group, a $C_1$-$C_{10}$ alkyl group, a $C_1$-$C_{10}$ alkoxy group, —$CF_3$, —$CF_2H$, and —$CFH_2$;

a $C_1$-$C_{10}$ alkyl group and a $C_1$-$C_{10}$ alkoxy group, each substituted with at least one selected from deuterium, —F, a cyano group, —$CF_3$, —$CF_2H$, and —$CFH_2$;

a phenyl group, a pyridinyl group, a pyrimidinyl group, a triazinyl group, a carbazolyl group, a dibenzofuranyl group, and a dibenzothiophenyl group;

a phenyl group, a pyridinyl group, a pyrimidinyl group, a triazinyl group, a carbazolyl group, a dibenzofuranyl group, and a dibenzothiophenyl group, each substituted with at least one selected from deuterium, —F, a cyano group, a $C_1$-$C_{10}$ alkyl group, a $C_1$-$C_{10}$ alkoxy group, —$CF_3$, —$CF_2H$, —$CFH_2$, a phenyl group, a pyridinyl group, a pyrimidinyl group, a triazinyl group, a carbazolyl group, a dibenzofuranyl group, and a dibenzothiophenyl group; and —$Si(Q_1)(Q_2)(Q_3)$, wherein $Q_1$ to $Q_3$ may each independently be selected from hydrogen, a $C_1$-$C_{10}$ alkyl group, a $C_1$-$C_{10}$ alkoxy group, a phenyl group, a pyridinyl group, a pyrimidinyl group, a triazinyl group, a carbazolyl group, a dibenzofuranyl group, and a dibenzothiophenyl group.

In one or more embodiments, i) the acceptor compound may be represented by Formula A-, in which $Ar_{11}$ and $Ar_{12}$ are each independently selected from groups represented by Formulae 17-1 to 17-3, and at least one of $Ar_{11}$ and $Ar_{12}$ is selected from groups represented by Formulae 17-2 and 17-3;

ii) the acceptor compound may be represented by Formula A-1 in which $L_{11}$ is selected from groups represented by Formulae 3-15 and 3-28, and at least one $L_{11}$ in the number of a11 is selected from groups represented by Formulae 6-1 to 6-4; or iii) the acceptor compound may be represented by Formula A-2 in which $X_1$ to $X_3$ are each N, but embodiments are not limited thereto.

In some embodiments, the donor compound may be selected from Compounds D1 to D17, and the acceptor compound may be selected from Compounds A1 to A11, but embodiments are not limited thereto:
D1
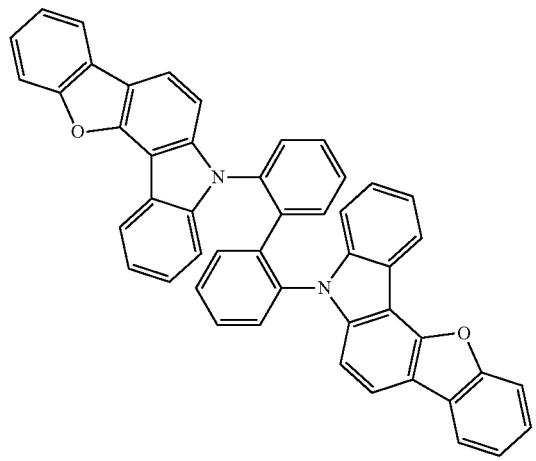
D2
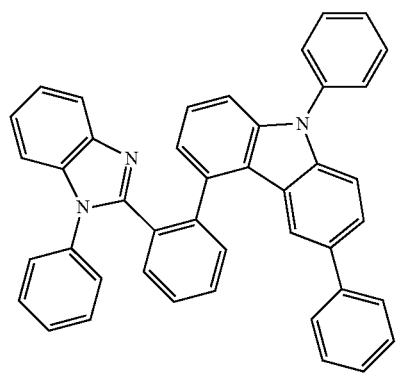
D3
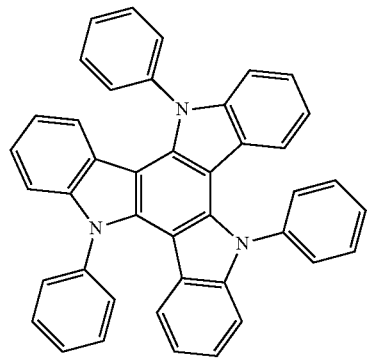
D4
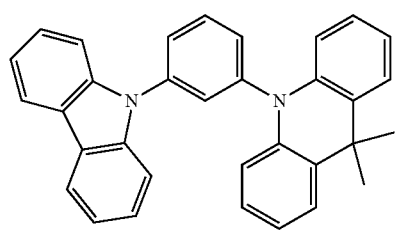
-continued
D5
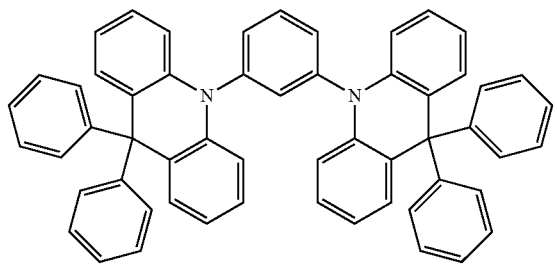
D6
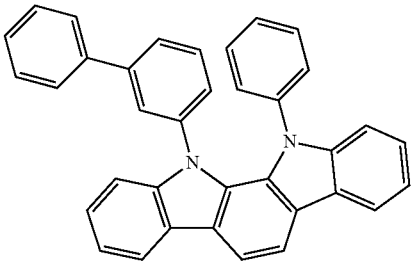
D7
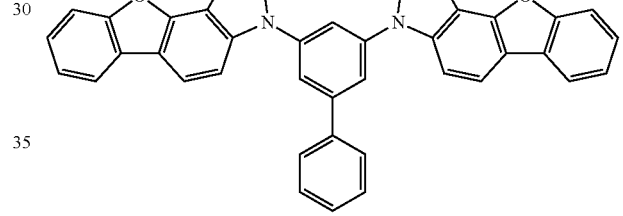
D8
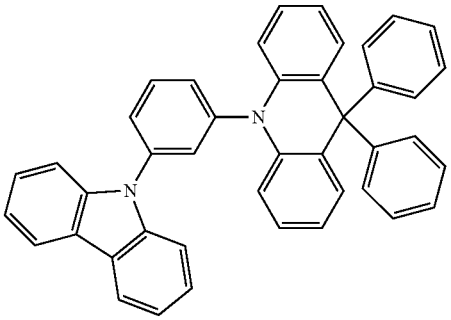
D9

D10
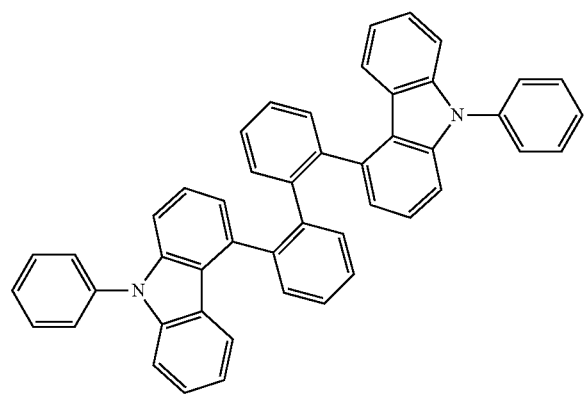
D11
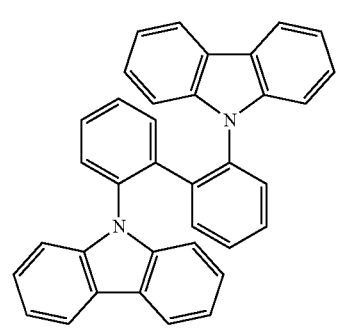
D12
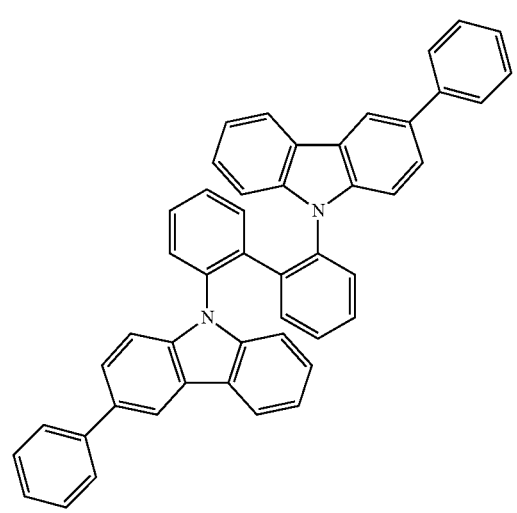
D13
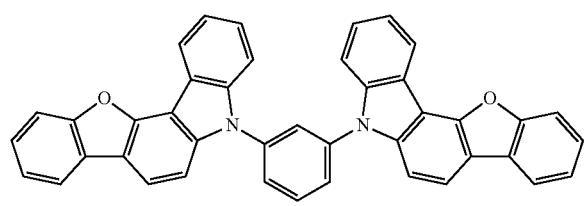
D14
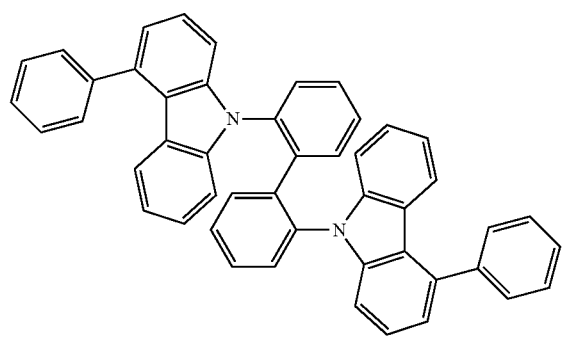
D15
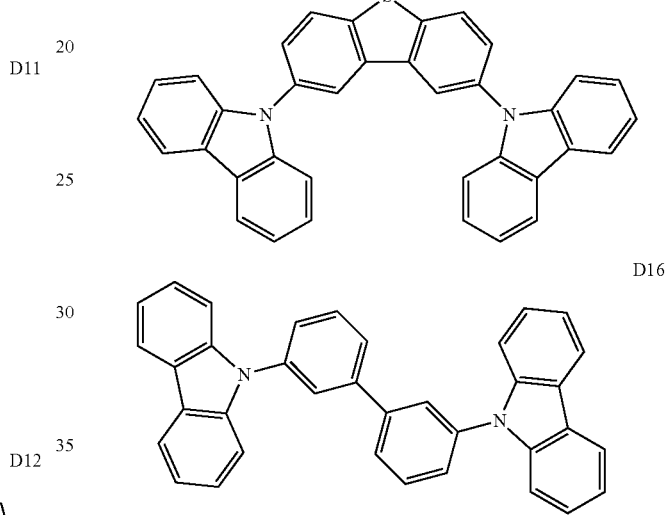
D16
D17
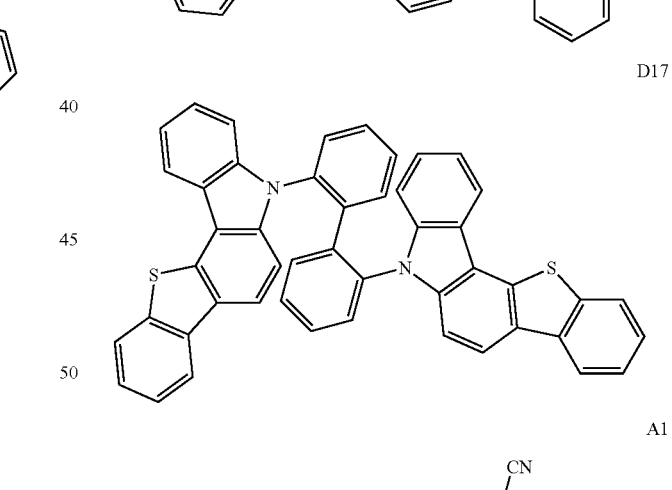
A1
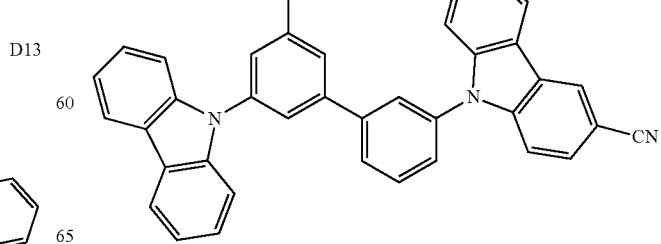

-continued
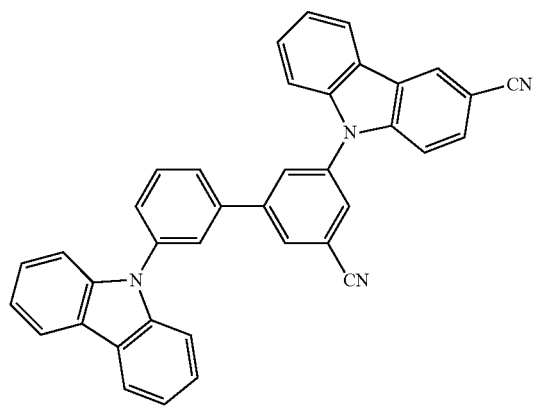
A2
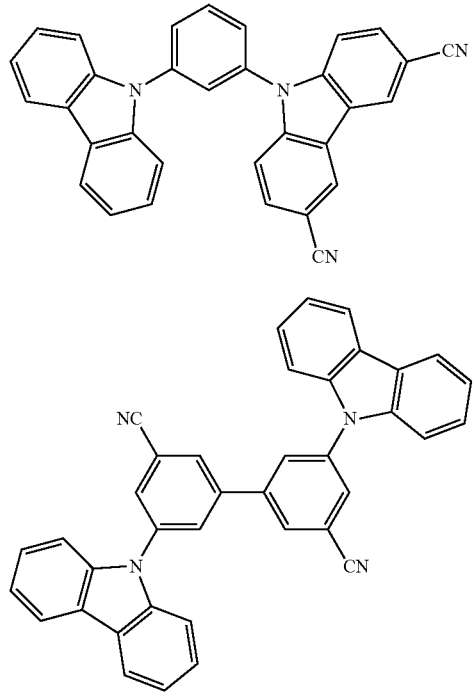
A3, A4, A5
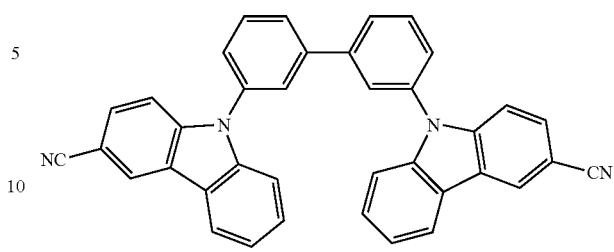
A6
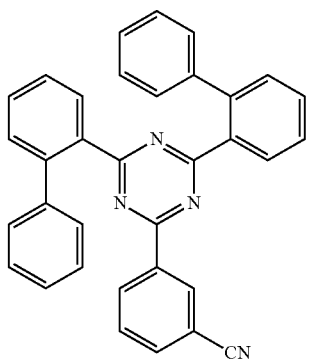
A7
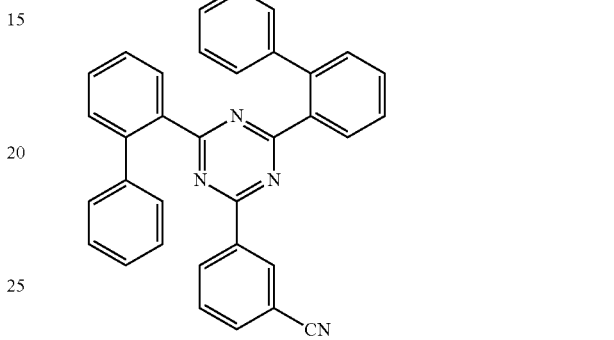
A8
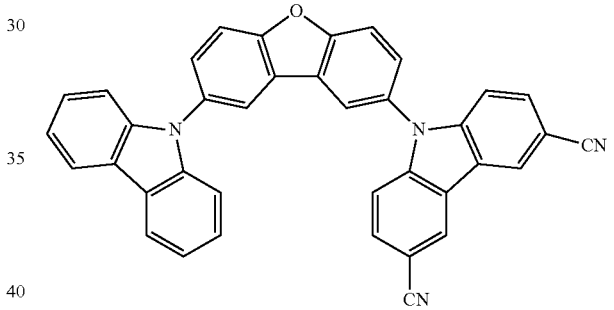
A9
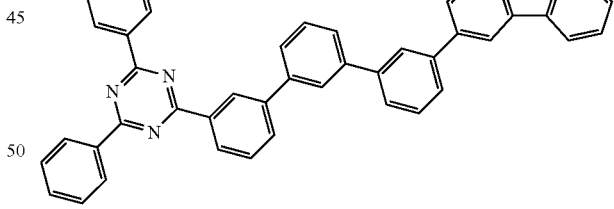
A10

A11

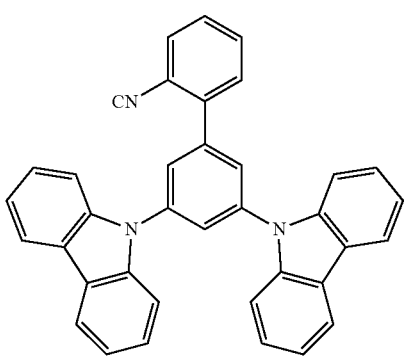

The dopant in the emission layer may include a phosphorescent dopant.

The phosphorescent dopant may be any suitable dopant capable of emitting light in accordance with a phosphorescent emission mechanism.

The phosphorescent dopant may be selected from a red phosphorescent dopant, a green phosphorescent dopant, and a blue phosphorescent dopant.

In an embodiment, the phosphorescent dopant may be a green phosphorescent dopant or a blue phosphorescent dopant, but embodiments are not limited thereto.

In some embodiments, the phosphorescent dopant may include an organometallic compound represented by Formula 81:

Formula 81

$M(L_{81})_{n81}(L_{82})_{n82}$

Formula 81A

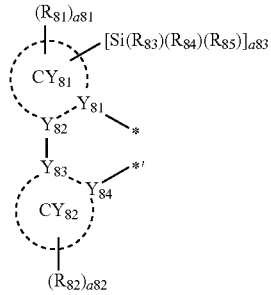

wherein, in Formulae 81 and 81A,

M may be selected from iridium (Ir), platinum (Pt), osmium (Os), titanium (Ti), zirconium (Zr), hafnium (Hf), europium (Eu), terbium (Tb), thulium (Tm), and rhodium (Rh), $L_{81}$ may be a ligand represented by Formula 81A, n81 may be an integer from 1 to 3; when n81 is 2 or greater, at least two $L_{81}$ groups may be identical to or different from each other, $L_{82}$ may be an organic ligand, n82 may be an integer from 0 to 4; when n82 is 2 or greater, at least two $L_{82}$ groups may be identical to or different from each other, $Y_{81}$ to $Y_{84}$ may each independently be C or N, $Y_{81}$ and $Y_{82}$ may be bound via a single bond or a double bond, $Y_{83}$ and $Y_{84}$ may be bound via a single bond or a double bond, $CY_{81}$ and $CY_{82}$ may each independently be selected from a $C_5$-$C_{30}$ carbocyclic group and a $C_1$-$C_{30}$ heterocyclic group, $CY_{81}$ and $CY_{82}$ may optionally and additionally be bound via an organic linking group, $R_{81}$ to $R_{85}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$Si(Q_{81})(Q_{82})(Q_{83})$, —$N(Q_{84})(Q_{85})$, —$B(Q_{86})(Q_{87})$, and —$P(=O)(Q_{88})(Q_{89})$, a81 to a83 may each independently be an integer selected from 0 to 5, when a81 is 2 or greater, at least two $R_{81}$ groups may be identical to or different from each other, when a82 is 2 or greater, at least two $R_{82}$ groups may be identical to or different from each other, when a81 is 2 or greater, $R_{81}$ groups that are adjacent to each other may optionally be bound to form a saturated or unsaturated ring, when a82 is 2 or greater, $R_{82}$ groups that are adjacent to each other may optionally be bound to form a saturated or unsaturated ring, in Formula 81A, *and*' each indicate a binding site to M in Formula 81, and at least one substituent of the substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_7$-$C_{60}$ arylalkyl group, substituted $C_1$-$C_{60}$ heteroaryl group, substituted $C_1$-$C_{60}$ heteroaryloxy group, substituted $C_1$-$C_{60}$ heteroarylthio group, substituted $C_2$-$C_{60}$ heteroarylalkyl group, substituted monovalent non-aromatic condensed polycyclic group, and substituted monovalent non-aromatic condensed heteropolycyclic group may be selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, and —Si($Q_{91}$)($Q_{92}$)($Q_{93}$), wherein $Q_{81}$ to $Q_{89}$ and $Q_{91}$ to $Q_{93}$ may each independently be selected from hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an embodiment, in Formula 81A, a83 may be 1 or 2, and $R_{83}$ to $R_{85}$ may each independently be selected from:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$; an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments are not limited thereto.

In one or more embodiments, in Formula 81A, $Y_{81}$ may be N, $Y_{82}$ and $Y_{83}$ may each be C, $Y_{84}$ may be N or C, and $CY_{81}$ and $CY_{82}$ may each independently be selected from a cyclopentadiene group, a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an isoindole group, an indole group, an indazole group, a pyrazole group, an imidazole group, a triazole group, an oxazole group, an isoxazole group, an oxadiazole group, a thiazole group, an isothiazole group, a thiadiazole group, a purine group, a furan group, a thiophene group, a pyridine group, a pyrimidine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, a benzofuran group, a benzothiophene group, an iso-benzothiazole group, a benzoxazole group, an isobenzoxazole group, a benzocarbazole group, a dibenzocarbazole group, an imidazopyridine group, an imidazopyrimidine group, a dibenzofuran group, a dibenzothiophene group, a dibenzothiophene sulfone group, a carbazole group, a dibenzosilole group, a 2,3-dihydro-1H-imidazole group, and a 2,3-dihydro-1H-imidazopyrazine group.

In one or more embodiments, in Formula 81A, $Y_{81}$ may be N, $Y_{82}$ to $Y_{84}$ may each be C, $CY_{81}$ may be selected from 5-membered rings including two N atoms as ring-forming atoms, and $CY_{82}$ may be selected from a benzene group, a naphthalene group, a fluorene group, a dibenzofuran group, and a dibenzothiophene group, but embodiments are not limited thereto.

In one or more embodiments, in Formula 81A, $Y_{81}$ may be N, $Y_{82}$ to $Y_{84}$ may each be C, $CY_{81}$ may be an imidazole group or a 2,3-dihydro-1H-imidazole group, and $CY_{82}$ may be selected from a benzene group, a naphthalene group a fluorene group, a dibenzofuran group, and a dibenzothiophene group, but embodiments are not limited thereto.

In one or more embodiments, in Formula 81A, $Y_{81}$ may be N, $Y_{82}$ to $Y_{84}$ may each be C, $CY_{81}$ may be selected from a pyrrole group, a pyrazole group, an imidazole group, a triazole group, an oxazole group, an isoxazole group, an oxadiazole group, a thiazole group, an isothiazole group, a thiadiazole group, a pyridine group, a pyrimidine group, a quinoline group, an isoquinoline group, a benzoquinoline group, a phthalazine group, a naphthyridine group, a quinoxaline group, a quinazoline group, a cinnoline group, a benzimidazole group, an iso-benzothiazole group, a benzoxazole group, and an isobenzoxazole group, and $CY_{82}$ may be selected from a cyclopentadiene group, a benzene group, a naphthalene group, a fluorene group, a benzofluorene group, a dibenzofluorene group, a phenanthrene group, an anthracene group, a triphenylene group, a pyrene group, a chrysene group, a perylene group, a benzofuran group, a benzothiophene group, a benzocarbazole group, a dibenzocarbazole group, a dibenzofuran group, a dibenzothiophene group, a dibenzothiophene sulfone group, a carbazole group, and a dibenzosilole group.

In one or more embodiments, in Formula 81A, $Y_{81}$, $Y_{83}$, and $Y_{84}$ may each be C, $Y_{82}$ may be N, $CY_{81}$ may be selected from a) a condensed ring in which i) a 5-membered ring including at least one N as a ring-forming atom may be condensed with ii) a 6-membered ring selected from a benzene group, a pyridine group, a pyrazine group, a pyrimidine group, and a pyridazine group; and b) a 5-membered ring including at least one N as a ring-forming atom, and $CY_{82}$ may be selected from a benzene group, a naphthalene group, a fluorene group, a dibenzofuran group, a dibenzothiophene group, a pyridine group, a pyrimidine group, a quinoline group, and an isoquinoline group, but embodiments are not limited thereto.

In one or more embodiments, in Formula 81A, $R_{81}$ and $R_{82}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —$B(Q_{86})(Q_{87})$ and —$P(=O)(Q_{88})(Q_{89})$, wherein $Q_{86}$ to $Q_{89}$ may each independently be selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

In one or more embodiments, in Formula 81A, $R_{81}$ and $R_{82}$ may each independently be selected from hydrogen, deuterium, —F, a cyano group, a nitro group, —$SF_5$, a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzothiophenyl group, and a dibenzofuranyl group;

a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzothiophenyl group, and a dibenzofuranyl group, each substituted with at least one selected from deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzothiophenyl group, and a dibenzofuranyl group; and —B($Q_{86}$)($Q_{87}$) and —P(=O)($Q_{88}$)($Q_{89}$), wherein $Q_{86}$ to $Q_{89}$ may each independently be selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

In one or more embodiments, in Formula 81A, at least one $R_{81}$ in the number of a81, at least one $R_{82}$ in the number of a82, or any combination thereof may be a cyano group.

In one or more embodiments, in Formula 81A, $Y_{81}$ may be N; $Y_{82}$ to $Y_{84}$ may each be C; $CY_{81}$ may be an imidazole group or a 2,3-dihydro-1H-imidazole group; $CY_{82}$ may be selected from a benzene group, a naphthalene group, a fluorene group, a dibenzofuran group, and a dibenzothiophene group; and at least one $R_{81}$ in the number of a81, at least one $R_{82}$ in the number of a82, or any combination thereof may be a cyano group.

In one or more embodiments, in Formula 81A, at least one $R_{82}$ in the number of a 82 may be a cyano group.

In one or more embodiments, in Formula 81A, at least one $R_{81}$ in the number of a81, at least one $R_{82}$ in the number of a82, or any combination thereof may be deuterium.

In one or more embodiments, in Formula 81A, $CY_{81}$ and $CY_{82}$ may additionally be bound via an organic linking group. Examples of the organic linking group may include a $C_2$-$C_5$ alkylene group, a $C_2$-$C_5$ alkenylene group,

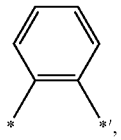

a $C_2$-$C_5$ alkylene group substituted with at least one $R_{81a}$, a $C_2$-$C_5$ alkenylene group substituted with at least one $R_{81a}$, and

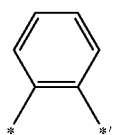

substituted with at least one $R_{81a}$, but embodiments are not limited thereto. $R_{81a}$ may be the same as described herein with reference to $R_{81}$.

In some embodiments, in Formula 81, $L_{81}$ may be selected from ligands represented by Formulae 81A-1 to 81A-8, but embodiments are not limited thereto:

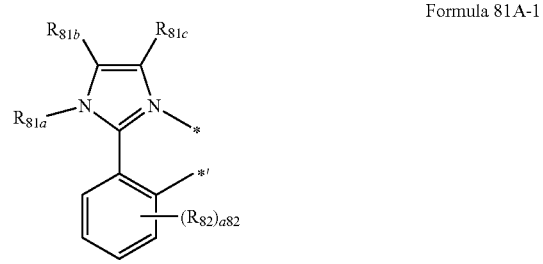

Formula 81A-1

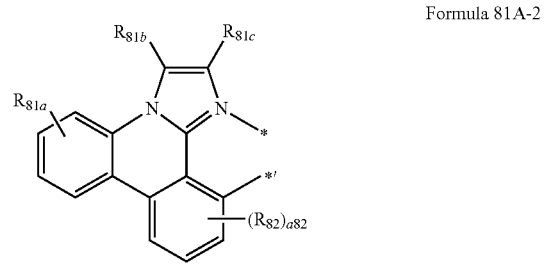

Formula 81A-2

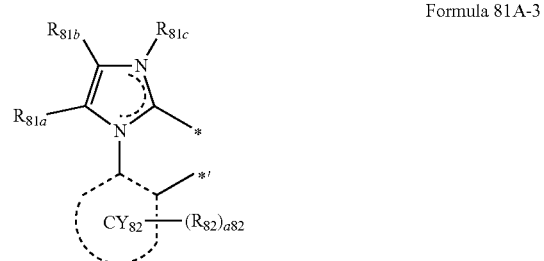

Formula 81A-3

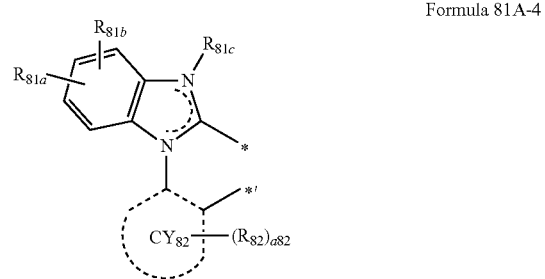

Formula 81A-4

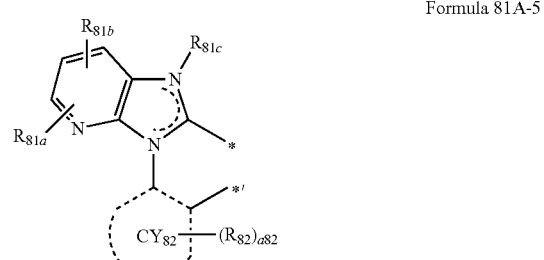

Formula 81A-5

Formula 81A-6

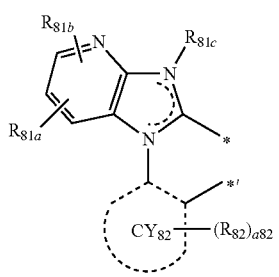

Formula 81A-7

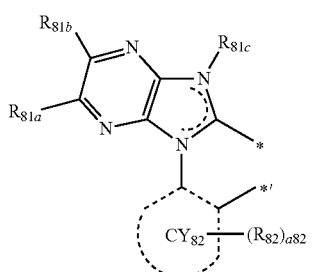

Formula 81A-8

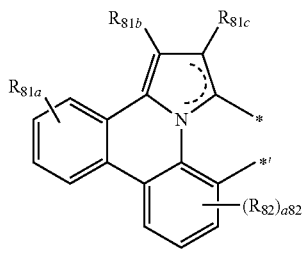

wherein in Formulae 81A-1 to 81A-8, $CY_{82}$, $R_{82}$, a82, *, and *' may be the same as those described herein, and $R_{81a}$, $R_{81b}$, and $R_{81c}$ may each be the same as described herein with reference to $R_{81}$.

In some embodiments, in Formulae 81A-1 to 81A-8, at least one of $R_{81a}$, $R_{81b}$, $R_{81c}$, and $R_{82}$ in the number of a82 may each be a cyano group, but embodiments are not limited thereto.

In one or more embodiments, in Formula 81, $L_{82}$ may be selected from ligands represented by Formulae 3-1(1) to 3-1(60), 3-1(61) to 3-1(69), 3-1(71) to 3-1(79), 3-1(81) to 3-1(88), 3-1(91) to 3-1(98), and 3-1(101) to 3-1(114):

Formula 3-1(1)

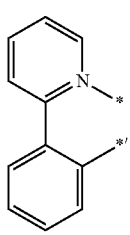

Formula 3-1(2)

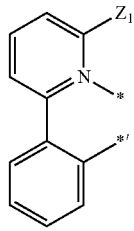

Formula 3-1(3)

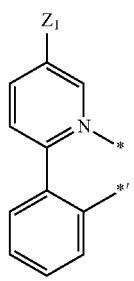

Formula 3-1(4)

Formula 3-1(5)

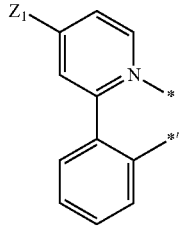

Formula 3-1(6)

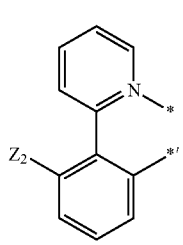

Formula 3-1(7)

-continued
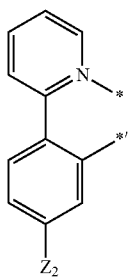
Formula 3-1(8)
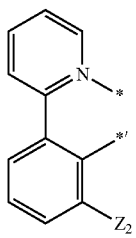
Formula 3-1(9)
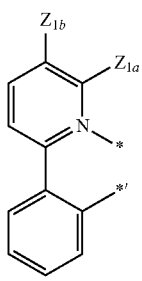
Formula 3-1(10)
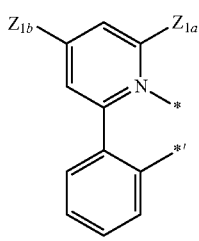
Formula 3-1(11)
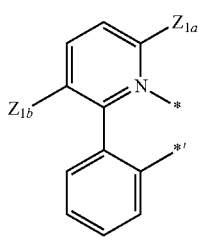
Formula 3-1-(12)
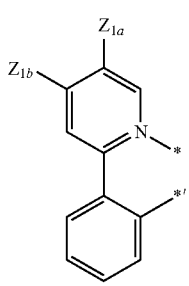
Formula 3-1(13)
-continued
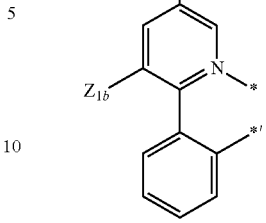
Formula 3-1(14)
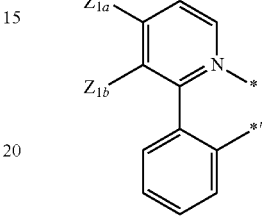
Formula 3-1(15)
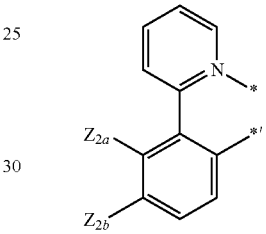
Formula 3-1(16)
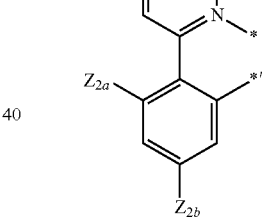
Formula 3-1(17)
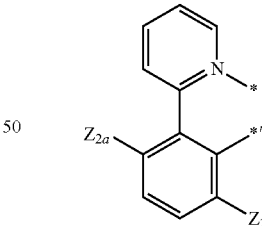
Formula 3-1(18)
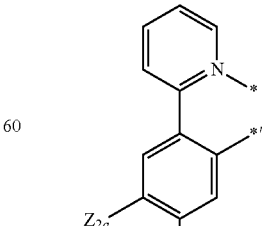
Formula 3-1(19)

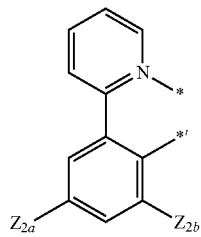
Formula 3-1(20)
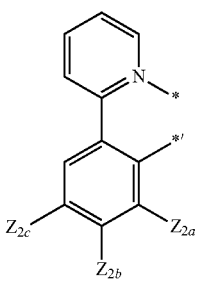
Formula 3-1(26)
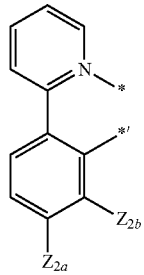
Formula 3-1(21)
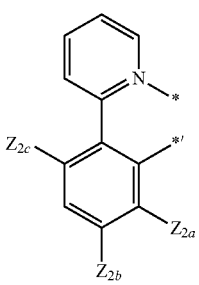
Formula 3-1(27)
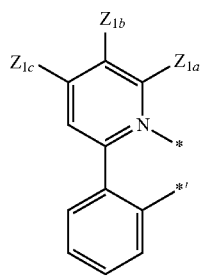
Formula 3-1(22)
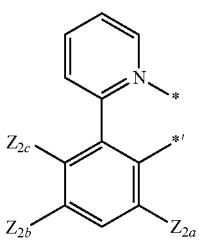
Formula 3-1(28)
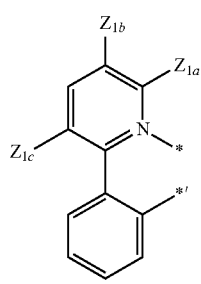
Formula 3-1(23)
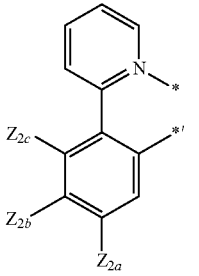
Formula 3-1(29)
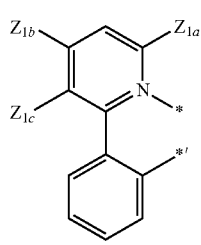
Formula 3-1(24)
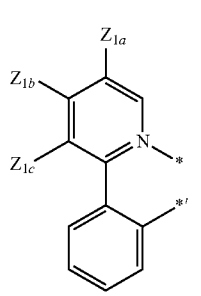
Formula 3-1(25)
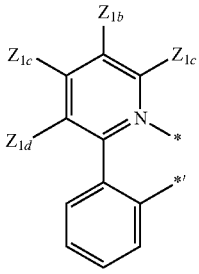
Formula 3-1(30)

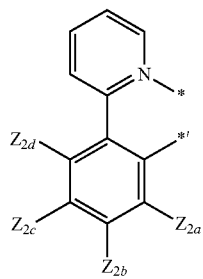
Formula 3-1(31)
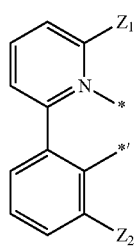
Formula 3-1(32)
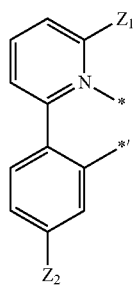
Formula 3-1(33)
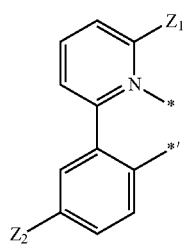
Formula 3-1(34)
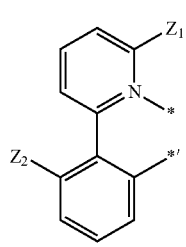
Formula 3-1(35)
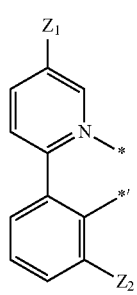
Formula 3-1(36)
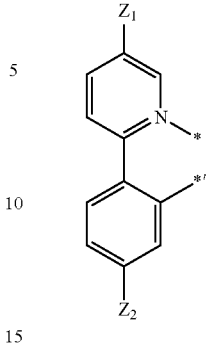
Formula 3-1(37)
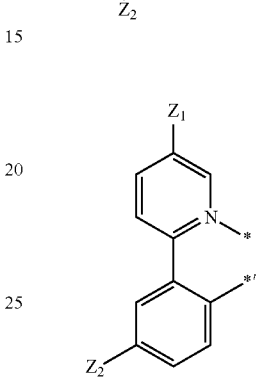
Formula 3-1(38)
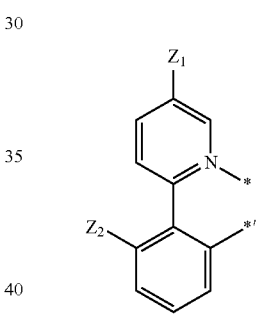
Formula 3-1(39)
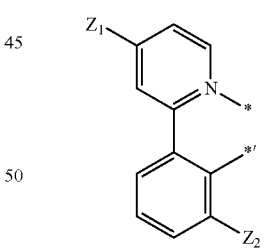
Formula 3-1(40)
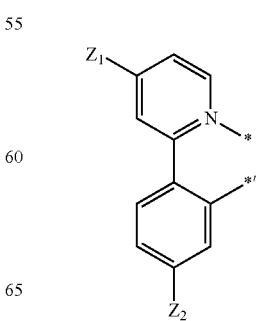
Formula 3-1(41)

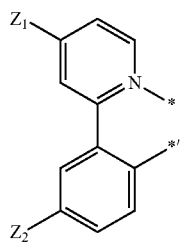 Formula 3-1(42)
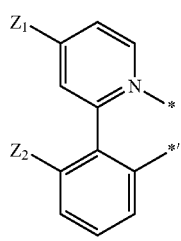 Formula 3-1(43)
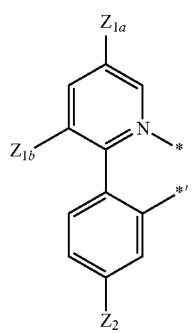 Formula 3-1(44)
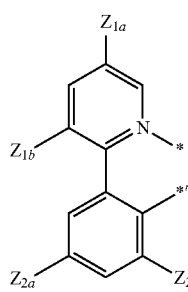 Formula 3-1(45)
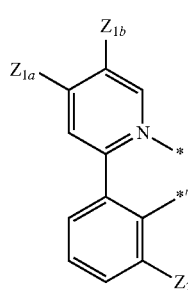 Formula 3-1(46)
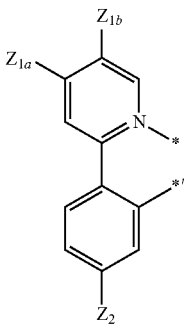 Formula 3-1(47)
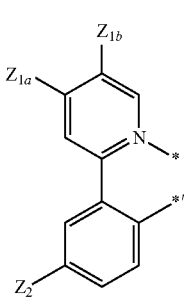 Formula 3-1(48)
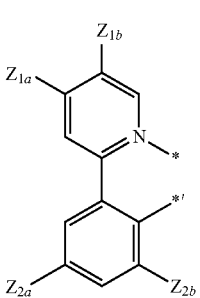 Formula 3-1(49)
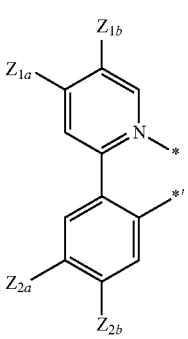 Formula 3-1(50)
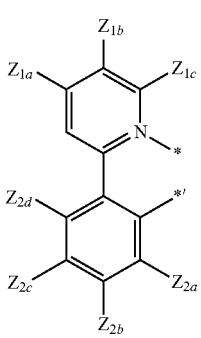 Formula 3-1(51)

Formula 3-1(52) 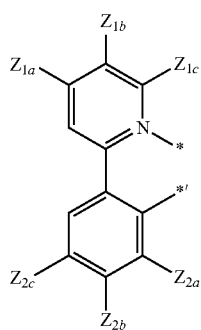
Formula 3-1(53) 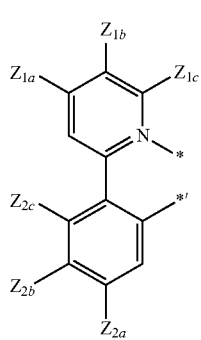
Formula 3-1(54) 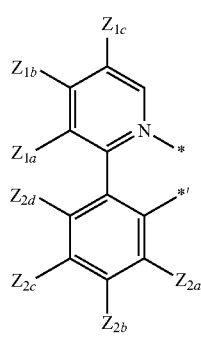
Formula 3-1(55) 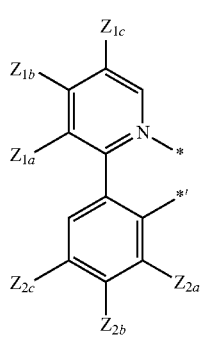
Formula 3-1(56) 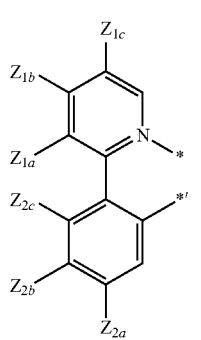
Formula 3-1(57) 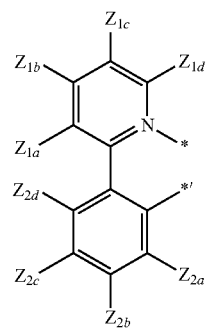
Formula 3-1(58) 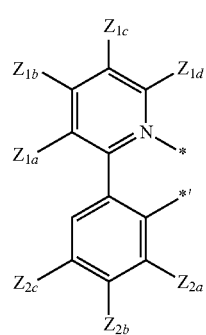
Formula 3-1(59) 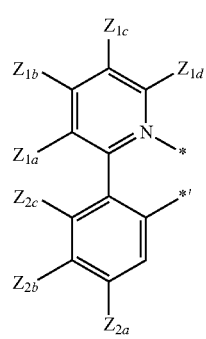
Formula 3-1(60) 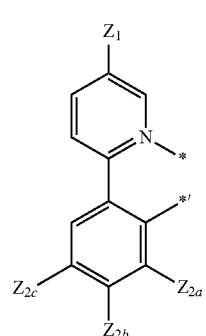
Formula 3-1(61) 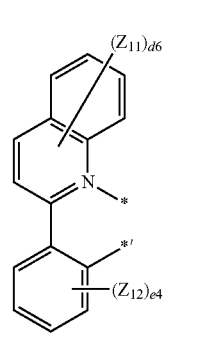

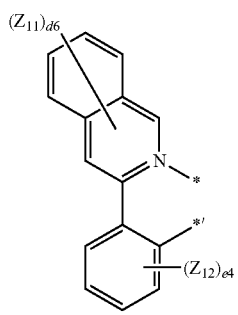
Formula 3-1(62)
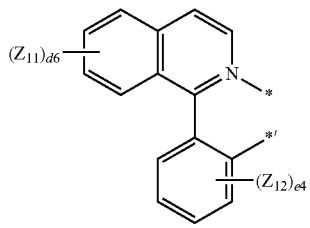
Formula 3-1(63)
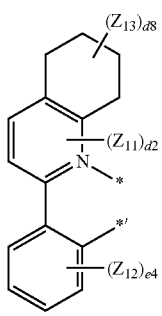
Formula 3-1(64)
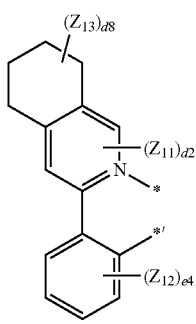
Formula 3-1(65)
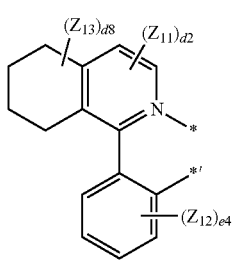
Formula 3-1(66)
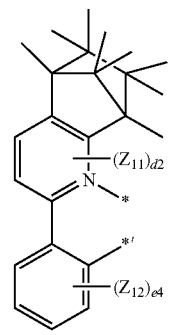
Formula 3-1(67)
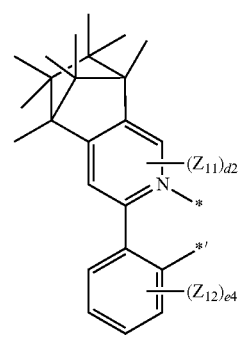
Formula 3-1(68)
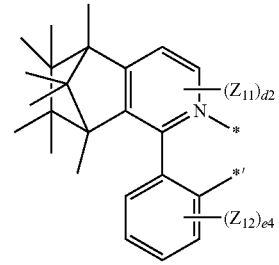
Formula 3-1(69)
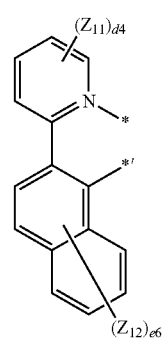
Formula 3-1(71)
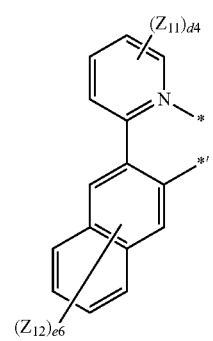
Formula 3-1(72)

Formula 3-1(73)
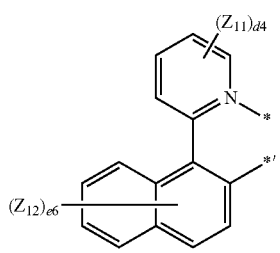
Formula 3-1(74)
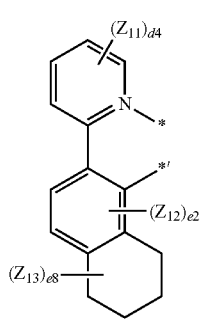
Formula 3-1(75)
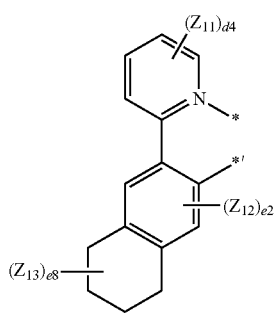
Formula 3-1(76)
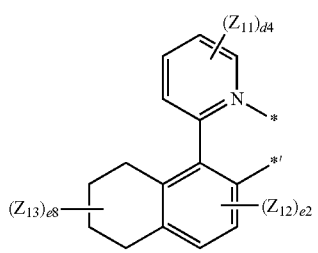
Formula 3-1(77)
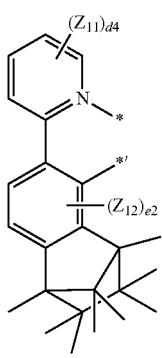
Formula 3-1(78)
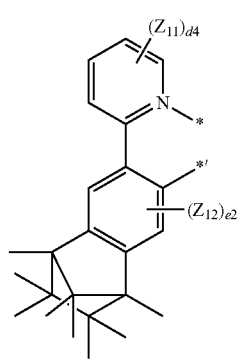
Formula 3-1(79)
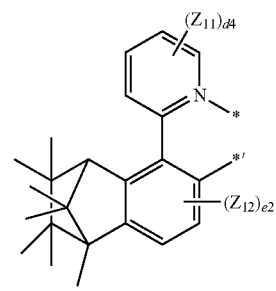
Formula 3-1(81)
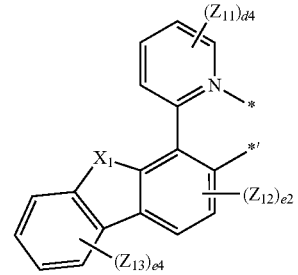
Formula 3-1(82)
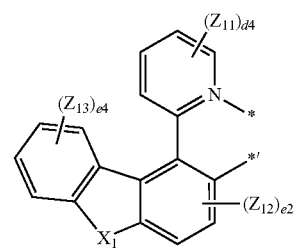
Formula 3-1(83)
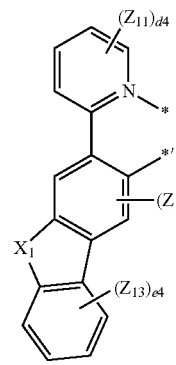

Formula 3-1(84)
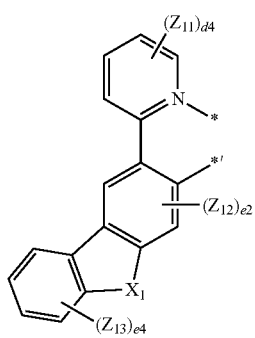
Formula 3-1(85)
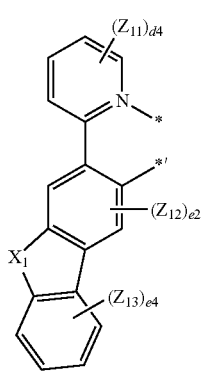
Formula 3-1(86)
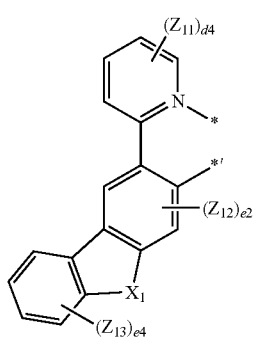
Formula 3-1(87)
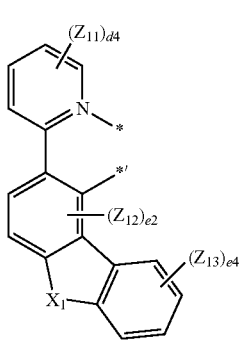
Formula 3-1(88)
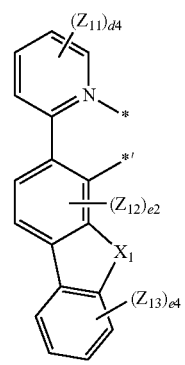
Formula 3-1(91)
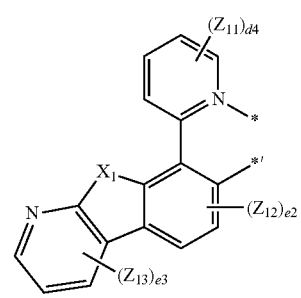
Formula 3-1(92)
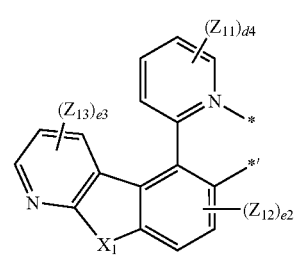
Formula 3-1(93)
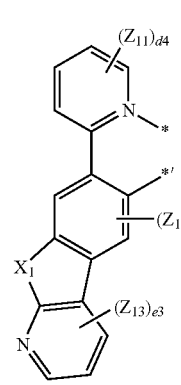
Formula 3-1(94)
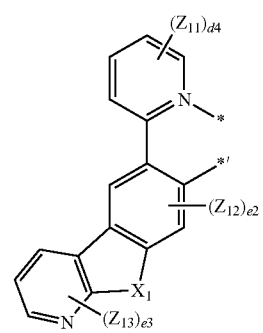

-continued
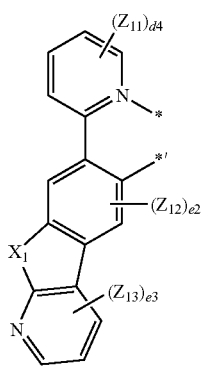
Formula 3-1(95)
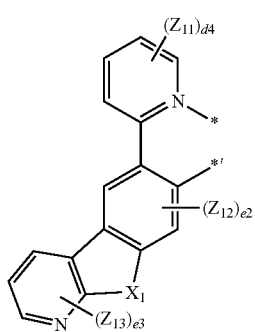
Formula 3-1(96)
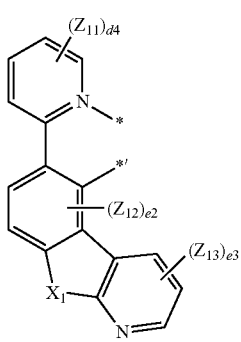
Formula 3-1(97)
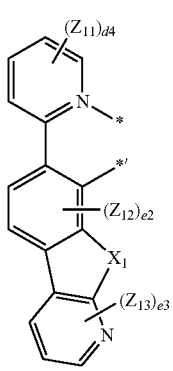
Formula 3-1(98)
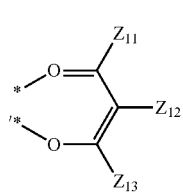
Formula 3-1(101)
-continued
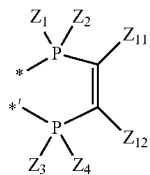
Formula 3-1(102)
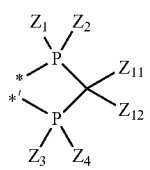
Formula 3-1(103)
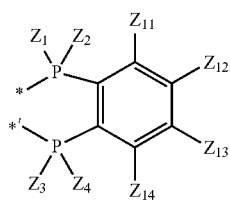
Formula 3-1(104)
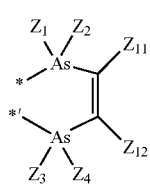
Formula 3-1(105)
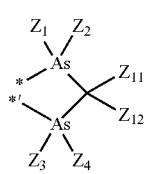
Formula 3-1(106)
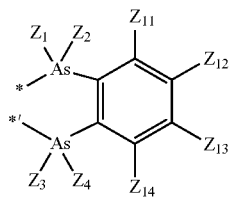
Formula 3-1(107)
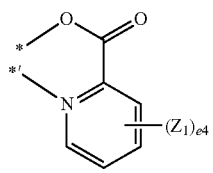
Formula 3-1(108)
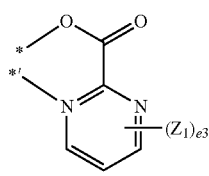
Formula 3-1(109)

-continued

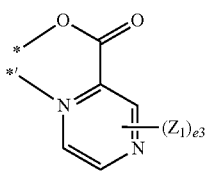
Formula 3-1(110)

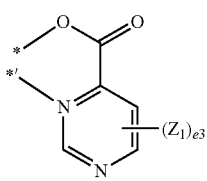
Formula 3-1(111)

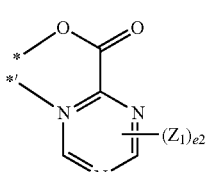
Formula 3-1(112)

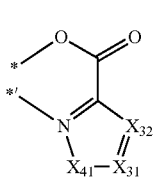
Formula 3-1(113)

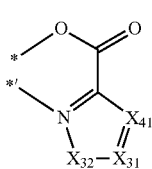
Formula 3-1(114)

wherein, in Formulae 3-1(1) to 3-1(60), 3-1(61) to 3-1(69), 3-1(71) to 3-1(79), 3-1(81) to 3-1(88), 3-1(91) to 3-1(98), and 3-1(101) to 3-1(114), $X_1$ may be O, S, $C(Z_{21})(Z_{22})$, or $N(Z_{23})$, $X_{31}$ may be N or $C(Z_{1a})$, $X_{32}$ may be N or $C(Z_{1b})$, $X_{41}$ may be O, S, N(Zia), or $C(Z_{1a})(Z_{1b})$, $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, $Z_{11}$ to $Z_{14}$, and $Z_{21}$ to $Z_{23}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —B($Q_{86}$)($Q_{87}$) and —P(=O)($Q_{88}$)($Q_{89}$), wherein $Q_{86}$ to $Q_{89}$ may each independently be selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, d2 and e2 may each independently be an integer selected from 0 to 4, e3 may be an integer selected from 0 to 3, d4 and e4 may each independently be an integer selected from 0 to 4, d6 and e6 may each independently be an integer selected from 0 to 6, d8 and e8 may each independently be an integer selected from 0 to 8, and

*and*' each indicate a binding site to M in Formula 1.

In one or more embodiments, in Formula 81, M may be Ir, and a sum of n81 and n82 may be 3. In one or more embodiments, in Formula 81, M may be Pt, and a sum of n81 and n82 may be 2.

In one or more embodiments, the organometallic compound represented by Formula 81 may be neutral, and may not include ion pairs of cations and anions.

In one or more embodiments, in Formula 81A, $Y_{81}$ may be N, $Y_{82}$ to $Y_{84}$ may each be N, $CY_{81}$ may be an imidazole group, and $CY_{82}$ may be a benzene group, but embodiments are not limited thereto.

In one or more embodiments, in Formulae 81 and 81A,

M may be Ir, n81 may be 2 or 3, a81 and a82 may each independently be an integer from 0 to 3, a83 may be 0, $R_{81}$ may be selected from a $C_1$-$C_{10}$ alkyl group and a phenyl group; and a $C_1$-$C_{10}$ alkyl group and a phenyl group, each substituted with at least one selected from deuterium and a $C_1$-$C_{10}$ alkyl group, and at least one $R_{82}$ in the number of a82 may be a cyano group, but embodiments are not limited thereto.

In one or more embodiments, the dopant in the emission layer may include at least one selected from Compounds PD1 to PD83 and PD85 to PD116, but embodiments are not limited thereto:

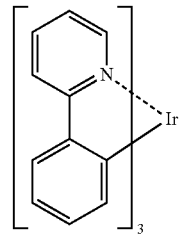

PD1

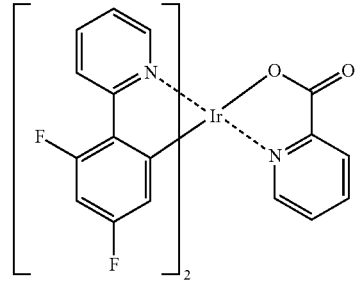

PD2

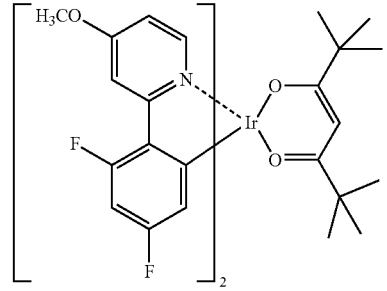

PD3

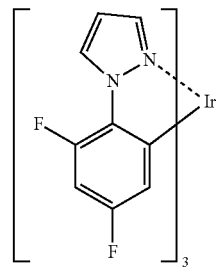

PD4

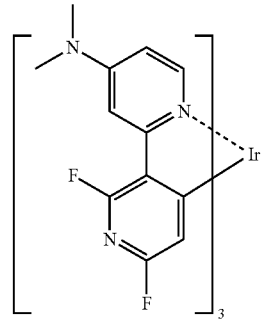

PD5

-continued
PD6
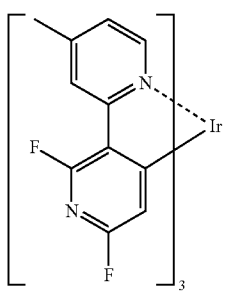
PD7
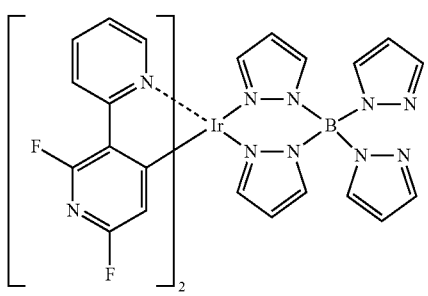
PD8
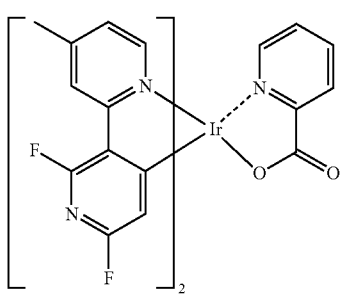
PD9
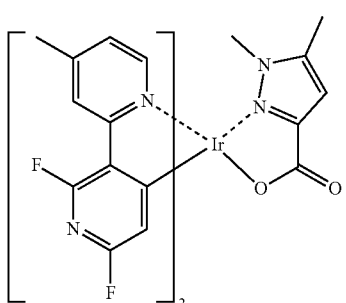
PD10
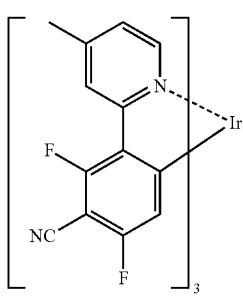
PD11
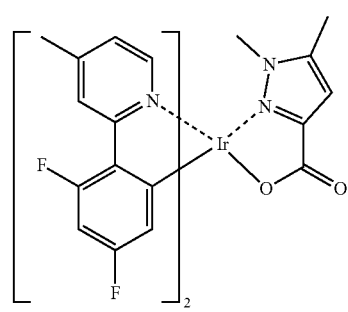
PD12
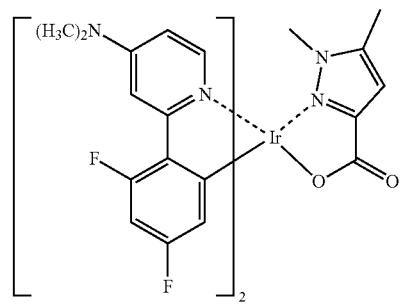
PD13
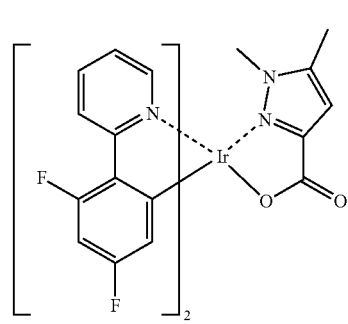
PD14
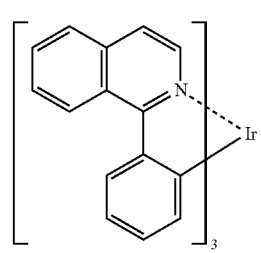
PD15
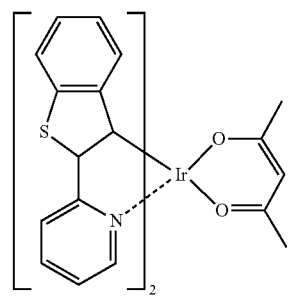

PD16 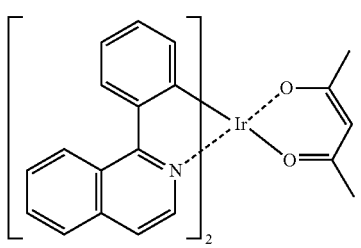
PD17 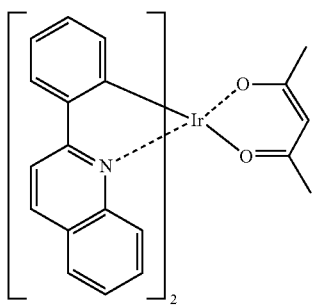
PD18 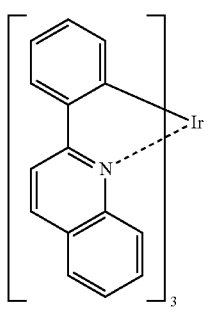
PD19 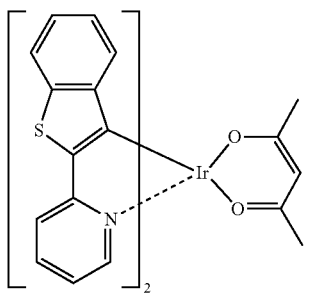
PD20 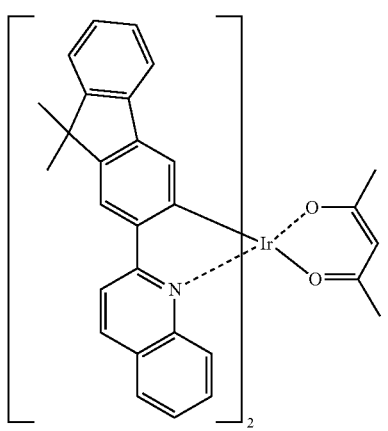
PD21 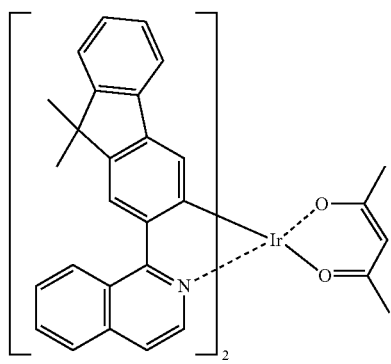
PD22 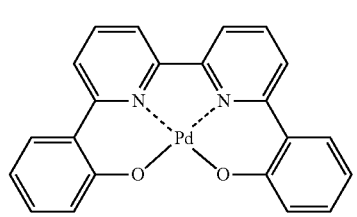
PD23 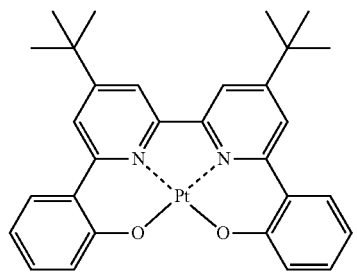
PD24 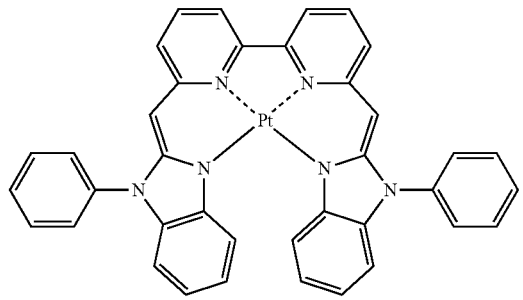
PD25 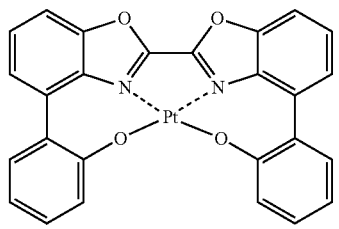
PD26 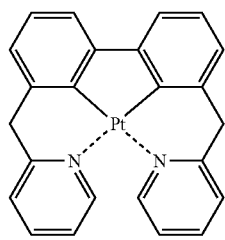

PD27 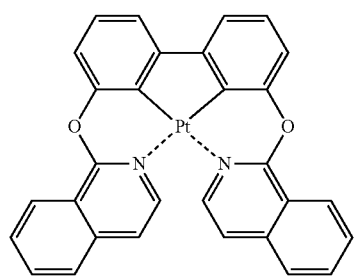
PD28 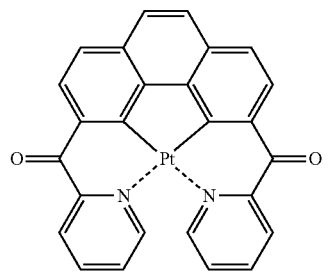
PD29 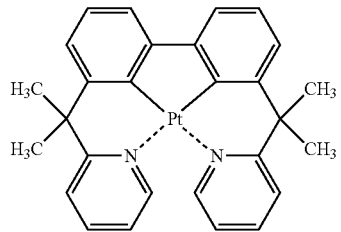
PD30 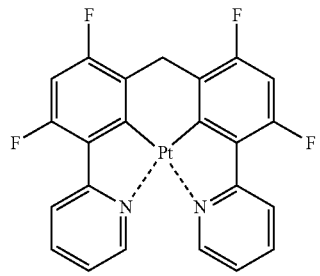
PD31 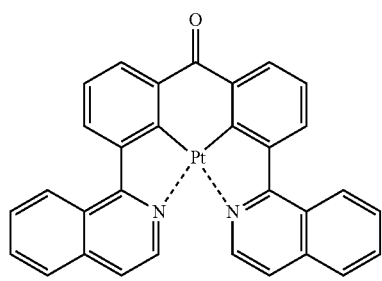
PD32 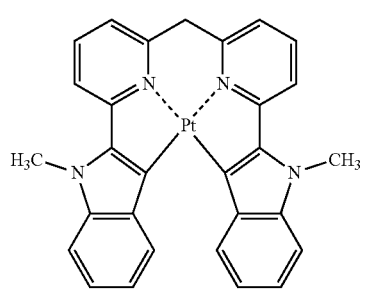
PD33 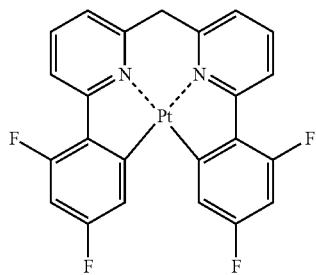
PD34 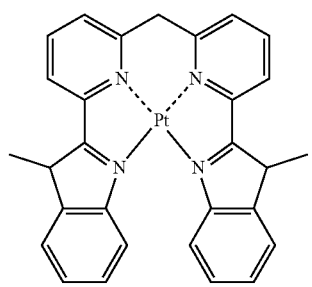
PD35 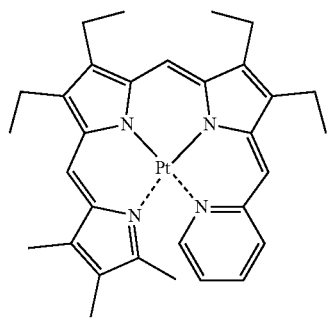
PD36 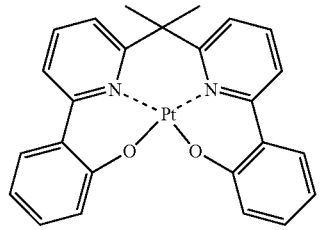
PD37 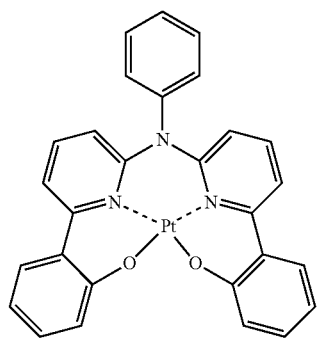

PD38
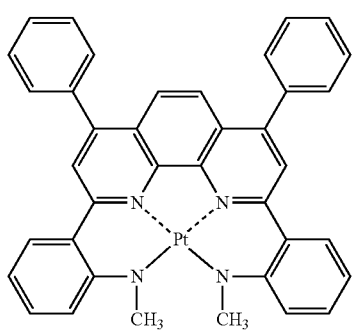
PD39
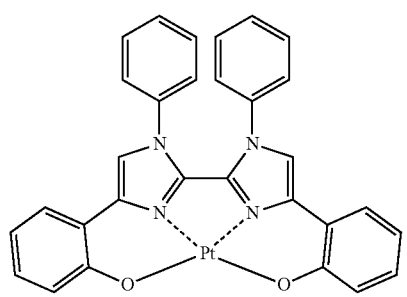
PD40
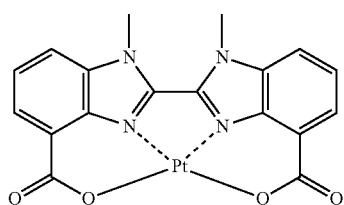
PD41
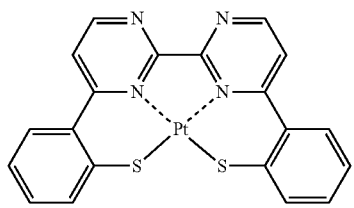
PD42
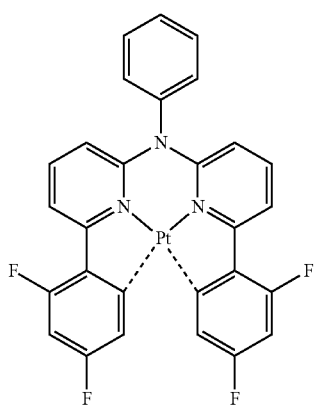
PD43
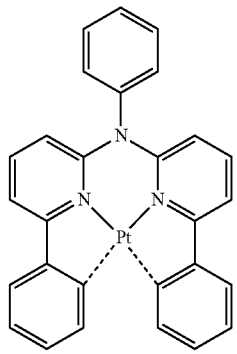
PD44
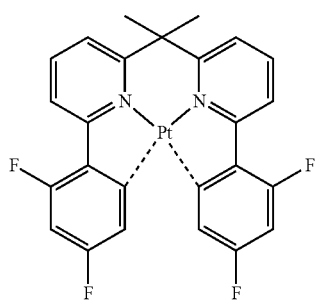
PD45
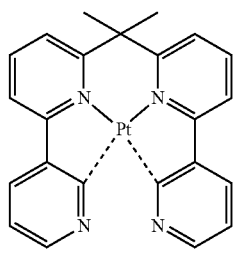
PD46
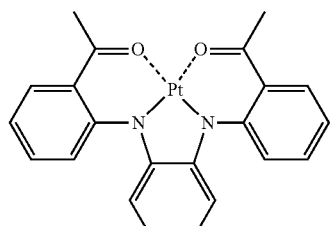
PD47
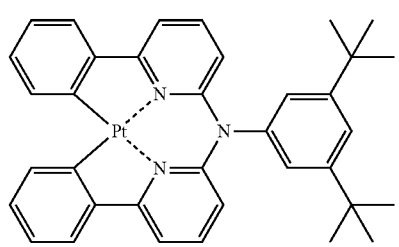
PD48
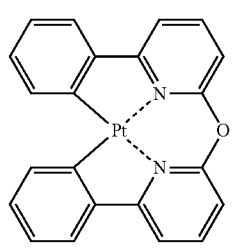

PD49
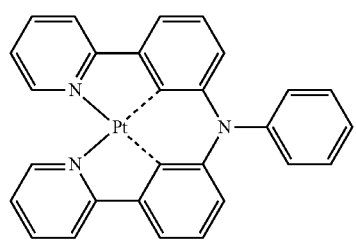
PD50
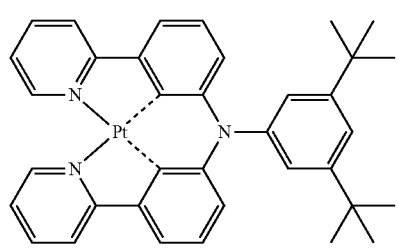
PD51
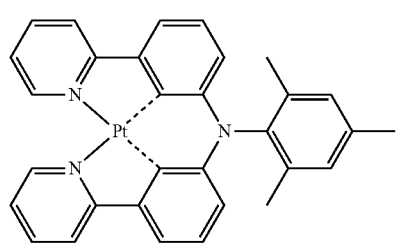
PD52
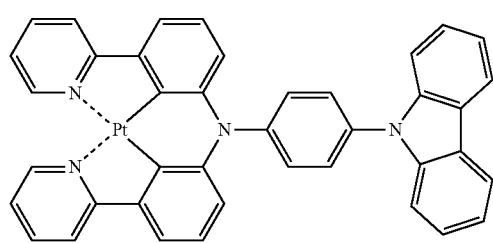
PD53
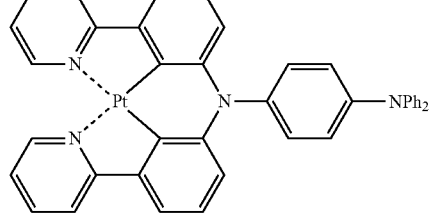
PD54
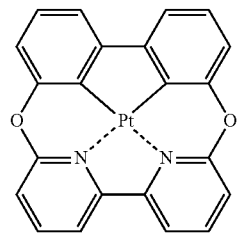
PD55
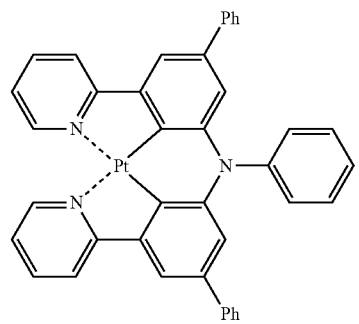
PD56
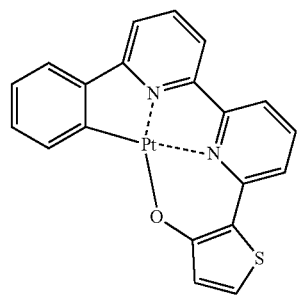
PD57
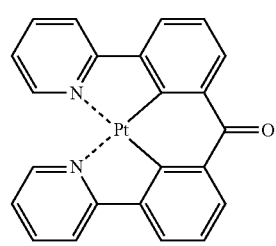
PD58
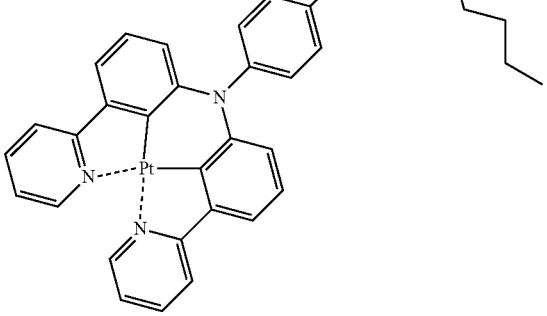
PD59
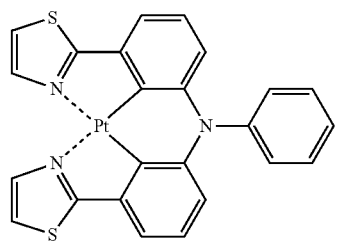

PD60 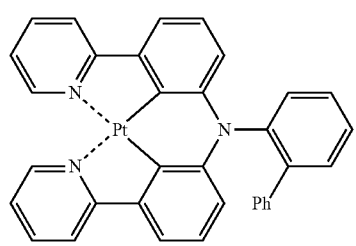
PD61 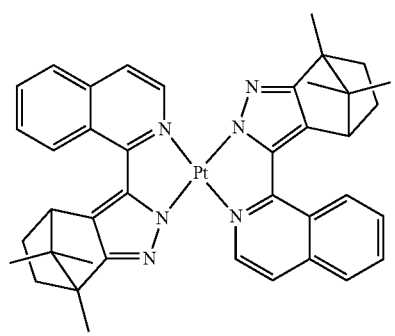
PD62 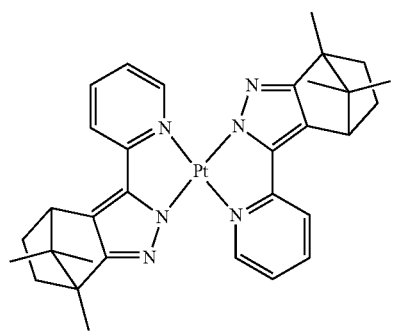
PD63 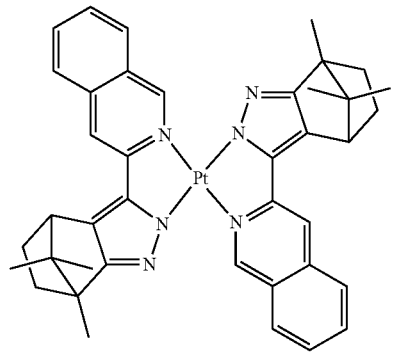
PD64 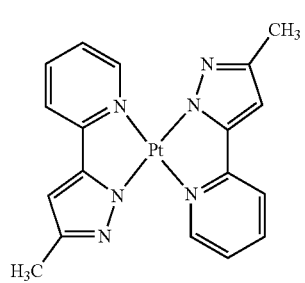
PD65 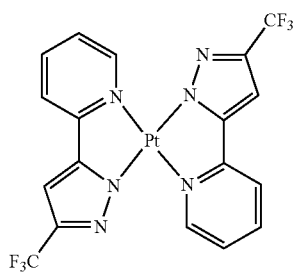
PD66 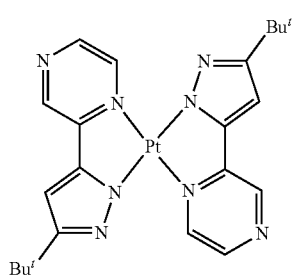
PD67 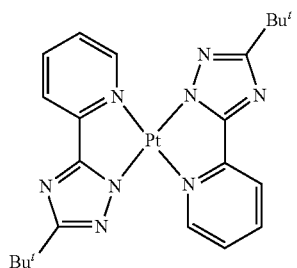
PD68 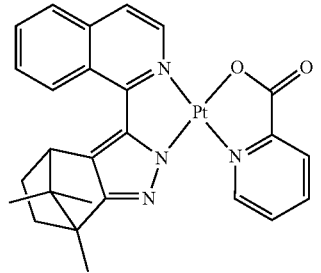
PD69 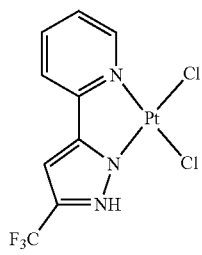

-continued
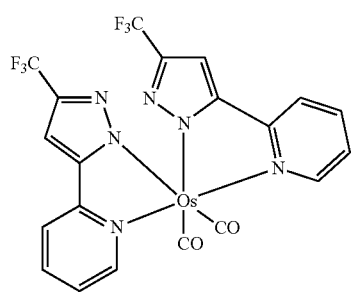
PD70
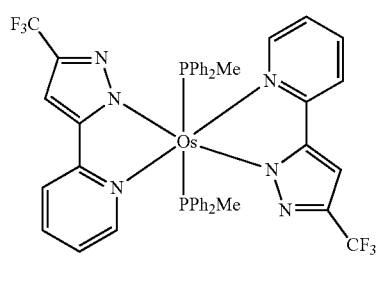
PD71
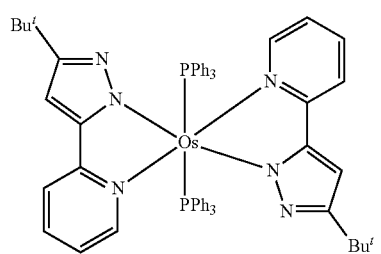
PD72
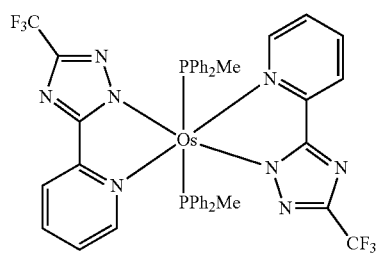
PD73
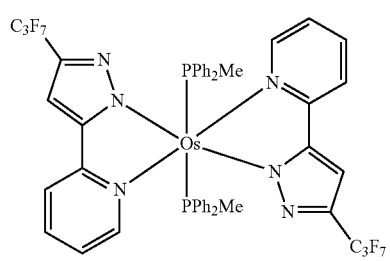
PD74
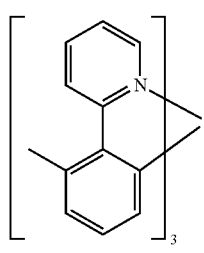
PD75
-continued
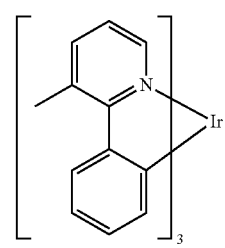
PD76
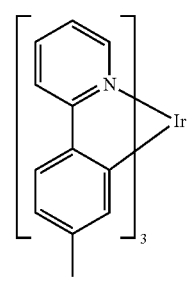
PD77
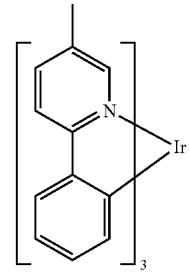
PD78
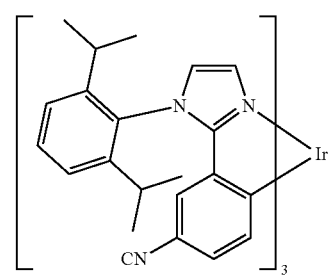
PD79
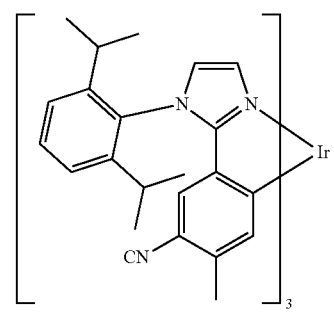
PD80

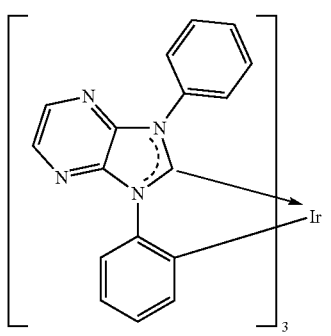
PD81
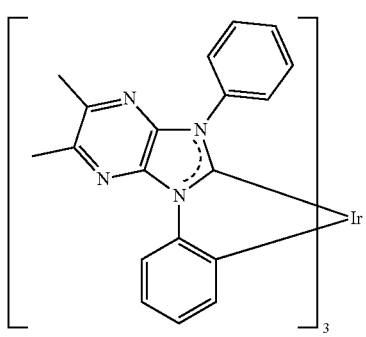
PD82
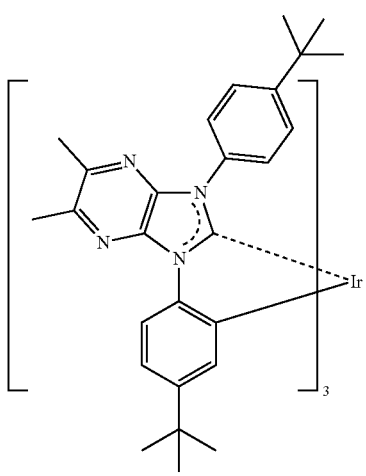
PD83
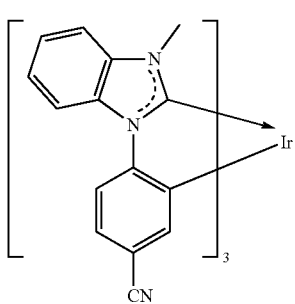
PD85
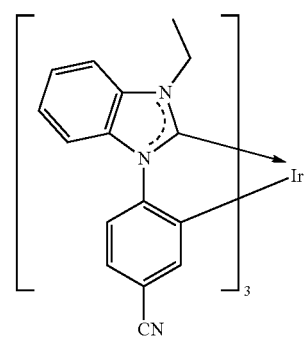
PD86
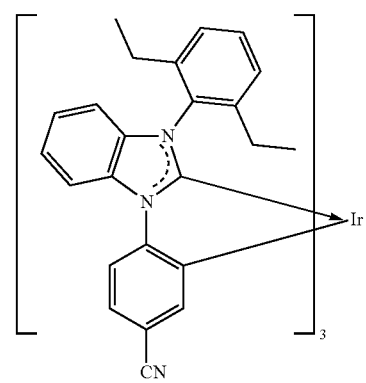
PD87
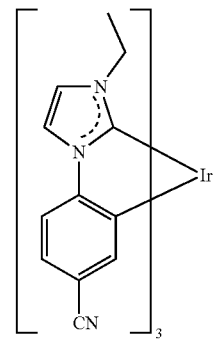
PD88
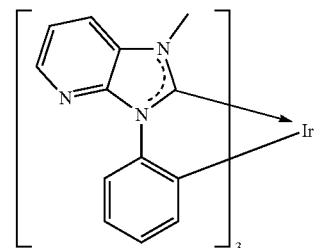
PD89
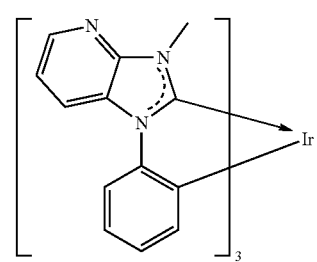
PD90

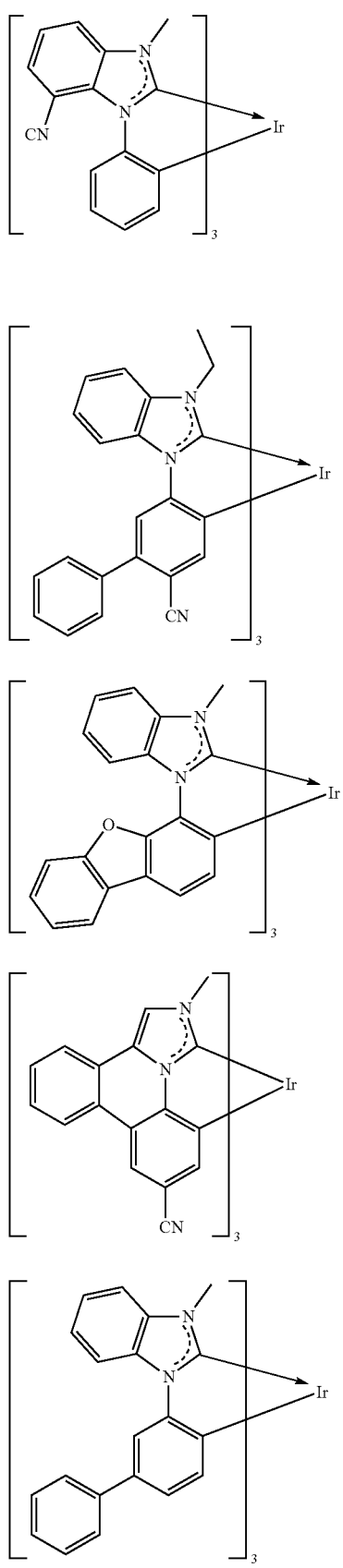
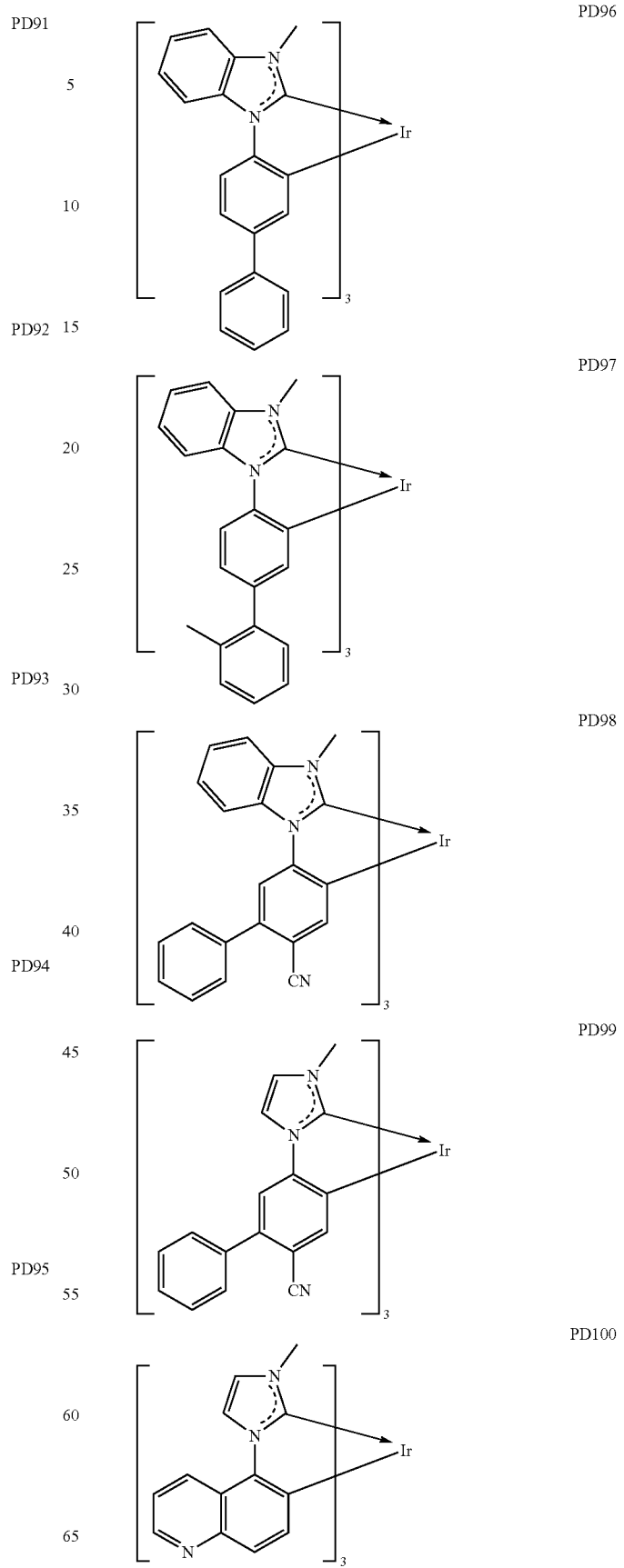

-continued
PD101
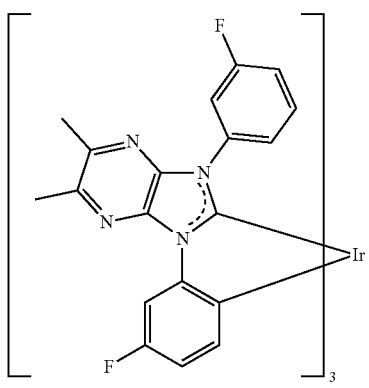
PD102
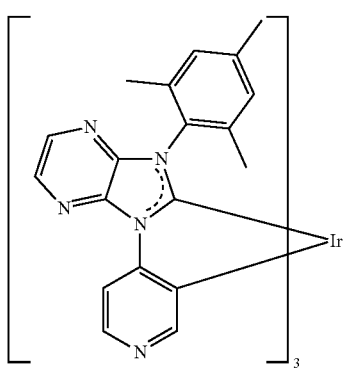
PD103
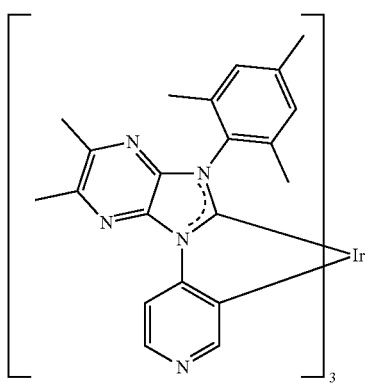
PD104
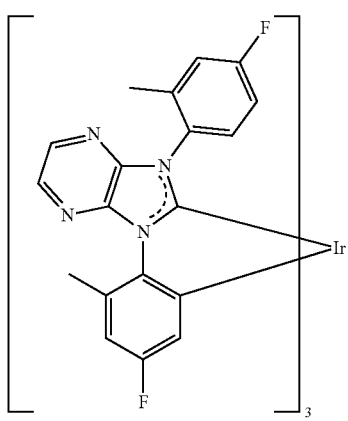
-continued
PD105
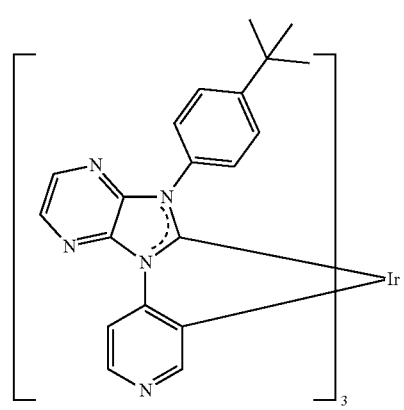
PD106
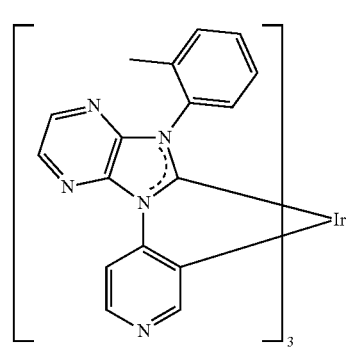
PD107
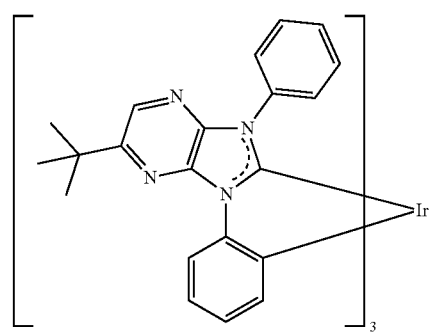
PD108
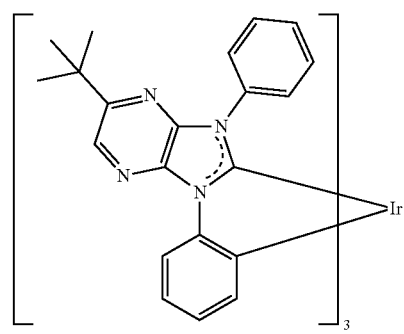

PD109 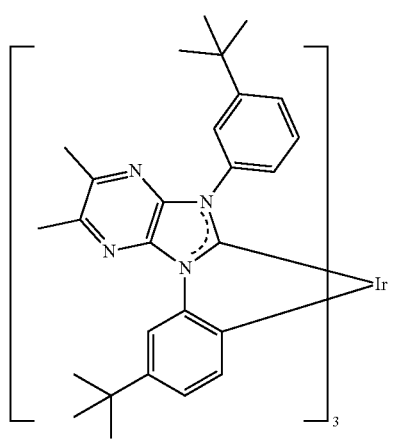
PD110 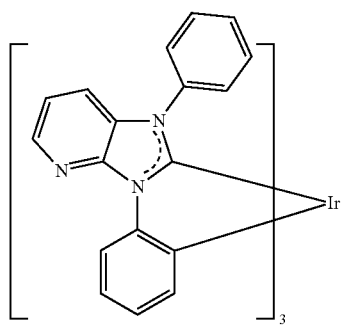
PD111 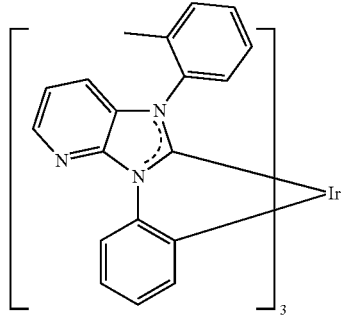
PD112 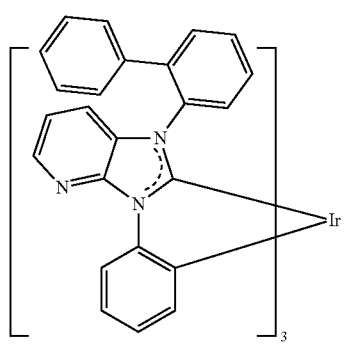
PD113 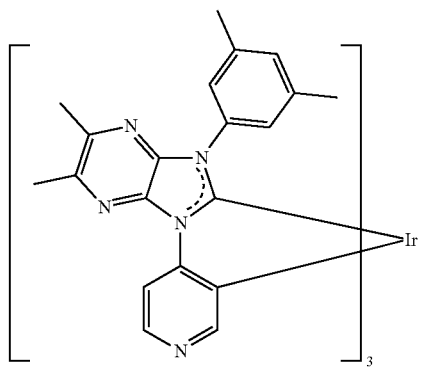
PD114 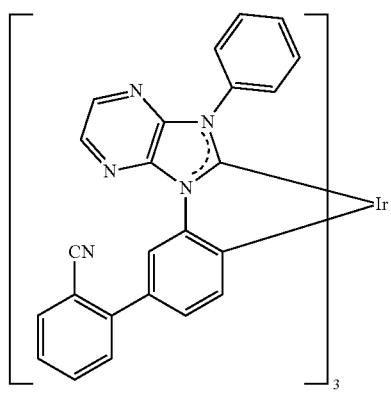
PD115 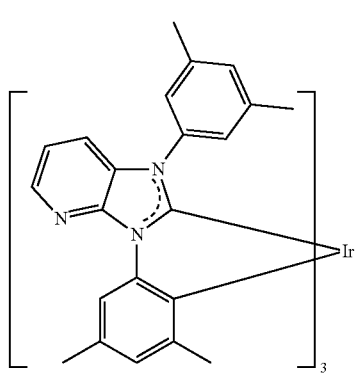
PD116 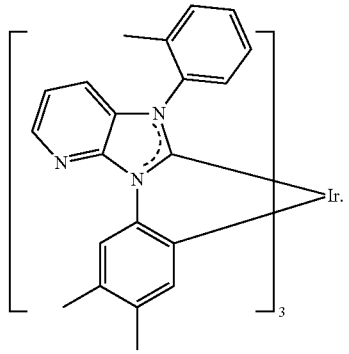
The amount of the dopant in the emission layer may be, in general, in a range of about 0.01 parts to about 20 parts by weight based on 100 parts by weight of the emission layer, but embodiments are not limited thereto. While not wishing to be bound by theory, it is understood that when the amount of the dopant is within this range, light emission without quenching may be realized.

The FIGURE illustrates a schematic view of an organic light-emitting device 10 according to an embodiment. Hereinafter, a structure of an organic light-emitting device according to one or more embodiments and a method of manufacturing the organic light-emitting device will be described with reference to the FIGURE. The organic light-emitting device 10 may include a first electrode 11, an organic layer 15, and a second electrode 19, which may be sequentially layered in this stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be formed by vacuum-depositing or sputtering, onto the substrate, a material for forming the first electrode 11. The first electrode 11 may be an anode. The material for forming the first electrode 11 may be selected from materials with a high work function for easy hole injection. The first electrode 11 may be a reflective electrode, a semi-transmissive electrode, or a transmissive electrode. The material for forming the first electrode 11 may be selected from indium tin oxide (ITO), indium zinc oxide (IZO), tin oxide ($SnO_2$), and zinc oxide (ZnO). In some embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In some embodiments, the first electrode 11 may have a triple-layered structure of ITO/Ag/ITO, but embodiments are not limited thereto.

The organic layer 15 may be on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include a hole injection layer only or a hole transport layer only. In some embodiments, the hole transport region may include a hole injection layer and a hole transport layer which are sequentially stacked on the first electrode 11. In some embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum deposition, for example, the vacuum deposition may be performed at a deposition temperature in a range of about 100° C. to about 500° C., at a vacuum pressure in a range of about $10^{-8}$ torr to about $10^{-3}$ torr, and at a deposition rate in a range of about 0.01 Angstroms per second (Å/sec) to about 100 Å/sec, though the conditions may vary depending on a compound that is used as a hole injection material and a structure and thermal properties of a desired hole injection layer, but conditions for the vacuum deposition are not limited thereto.

When a hole injection layer is formed by spin coating, the spin coating may be performed at a coating rate in a range of about 2,000 revolutions per minute (rpm) to about 5,000 rpm, and at a temperature in a range of about 80° C. to 200° C., to facilitate removal of a solvent after the spin coating, though the conditions may vary depending on a compound that is used as a hole injection material and a structure and thermal properties of a desired hole injection layer, but conditions for the spin coating are not limited thereto.

The conditions for forming a hole transport layer and an electron blocking layer may be inferred from the conditions for forming the hole injection layer.

The hole transport region may include at least one selected from m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PAN I/CSA), (polyaniline)/poly(4-styrene sulfonate) (PANI/PSS), a compound represented by Formula 201, and a compound represented by Formula 202:

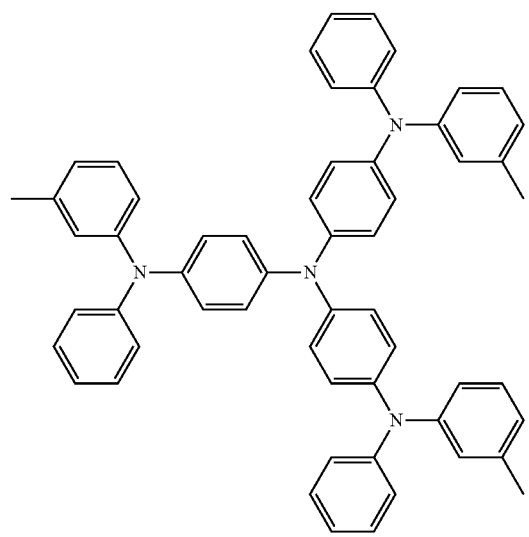

m-MTDATA

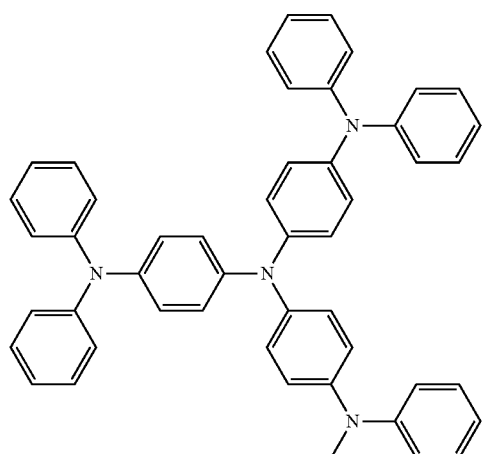
TDATA
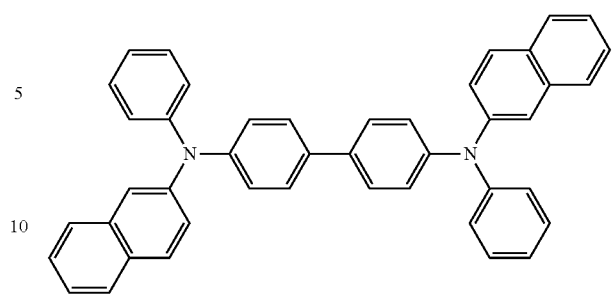
β-NPB
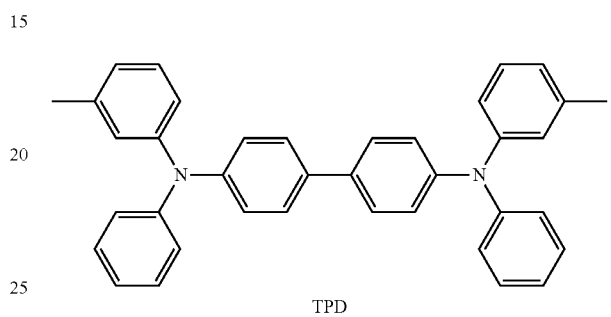
TPD
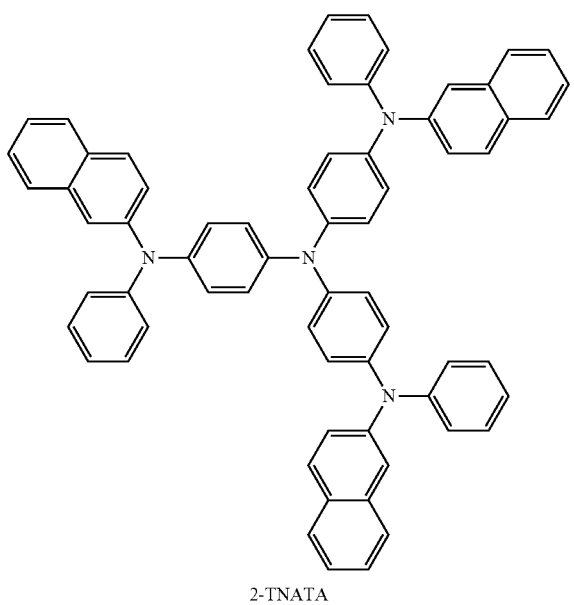
2-TNATA
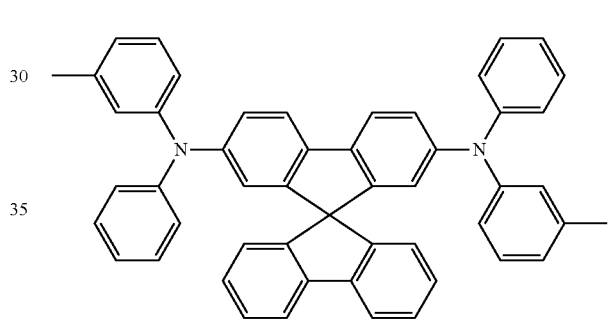
Spiro-TPD
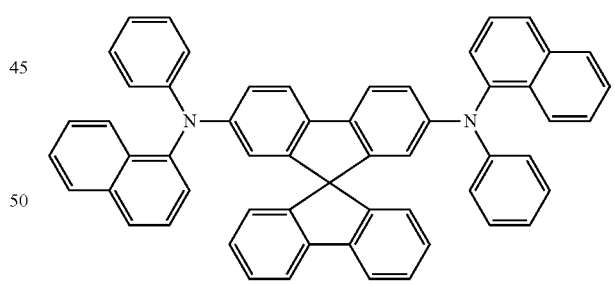
Spiro-NPB
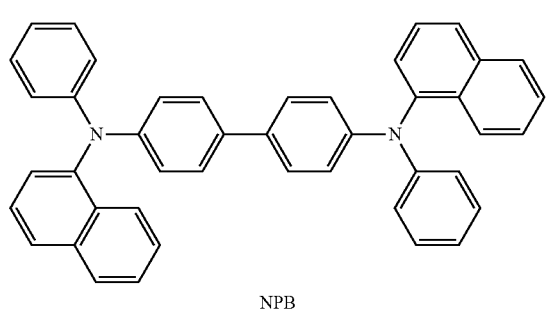
NPB
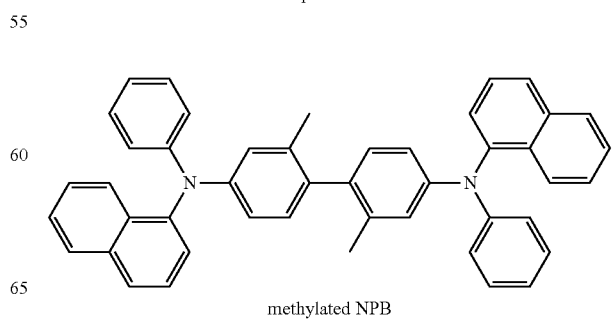
methylated NPB

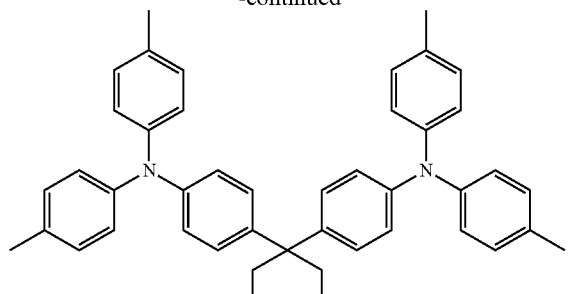

TAPC

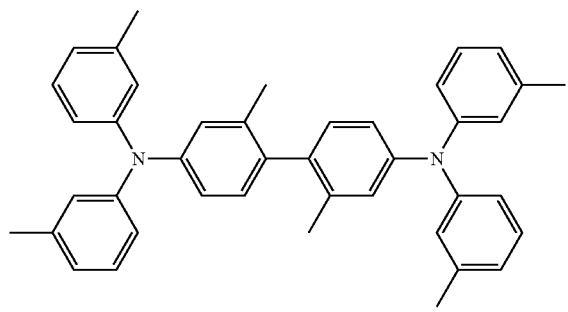

HMTPD

Formula 201

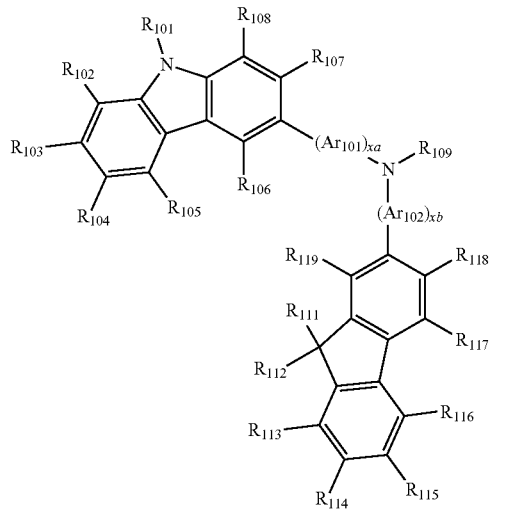

Formula 202

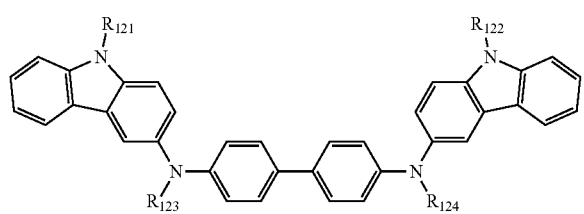

wherein, in Formula 201, $Ar_{101}$ and $Ar_{102}$ may each independently be selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

In Formula 201, xa and xb may each independently be an integer from 0 to 5. In some embodiments, xa and xb may each independently be an integer of 0, 1, or 2. In some embodiments, xa may be 1, and xb may be 0, but embodiments are not limited thereto.

In Formulae 201 and 202, $R_{1011}$ to $R_{108}$, $R_{111}$ to $R_{119}$, and $R_{121}$ to $R_{124}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, or a hexyl group), and a $C_1$-$C_{10}$ alkoxy group (e.g., a methoxy group, an ethoxy group, a propoxy group, a butoxy group, or a pentoxy group);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments are not limited thereto.

In Formula 201, $R_{109}$ may be selected from a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In some embodiments, the compound represented by Formula 201 may be represented by Formula 201A, but embodiments are not limited thereto:

Formula 201A

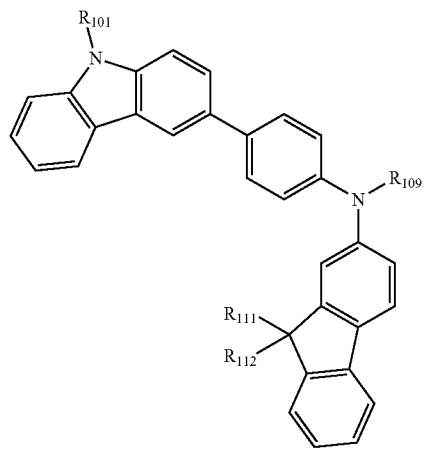

wherein, $R_{101}$, $R_{111}$, $R_{112}$, and $R_{109}$ in Formula 201A may be the same as those described above.

In some embodiments, the compounds represented by Formulae 201 and 202 may include Compounds HT1 to HT20, but embodiments are not limited thereto:

HT1

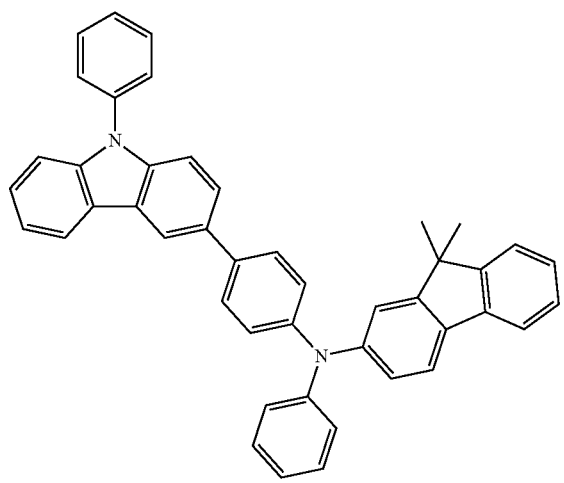

HT2

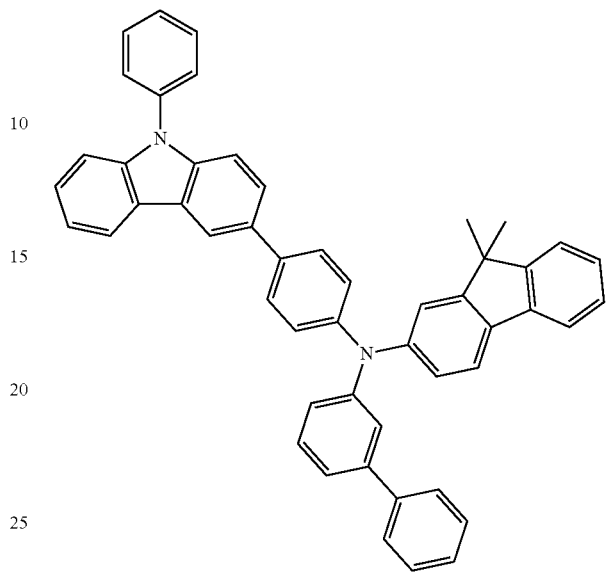

HT3

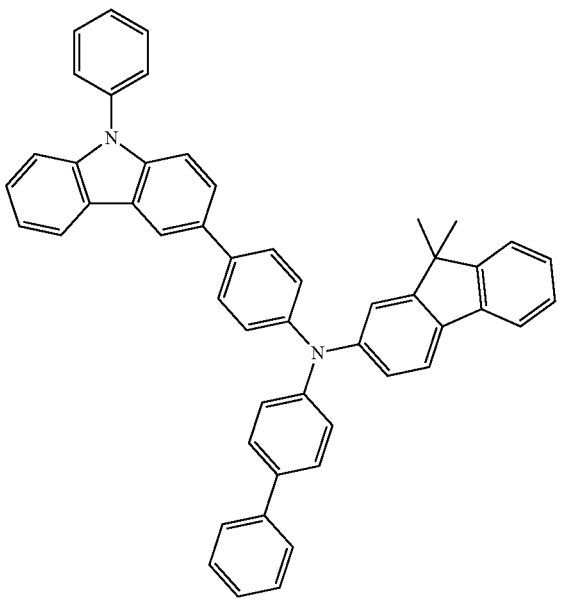

HT4
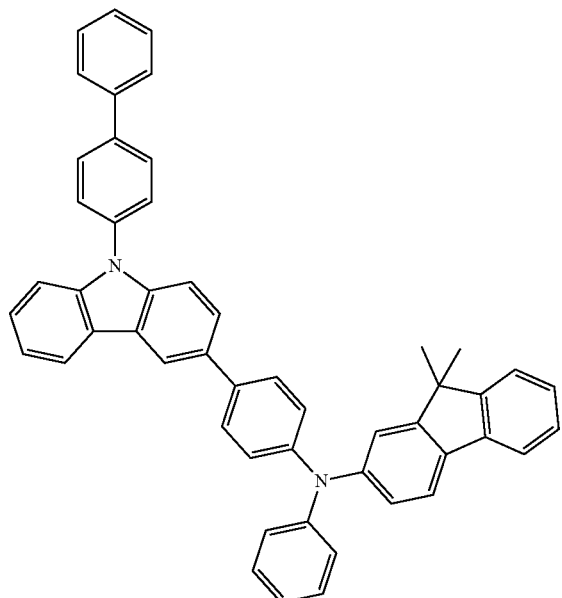
HT6
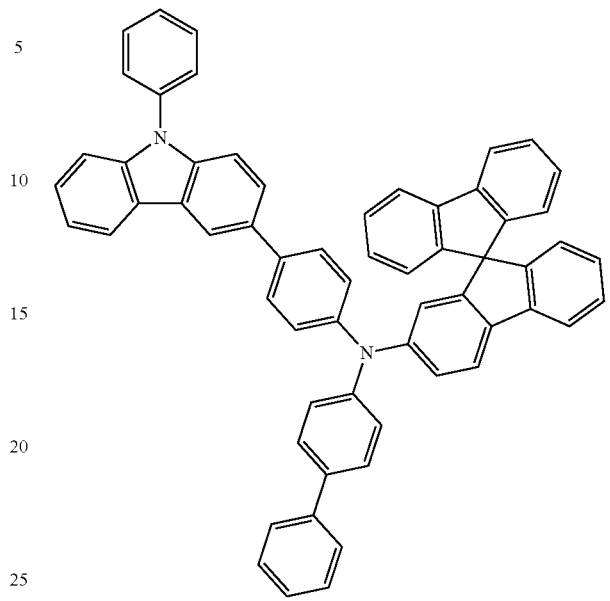
HT5
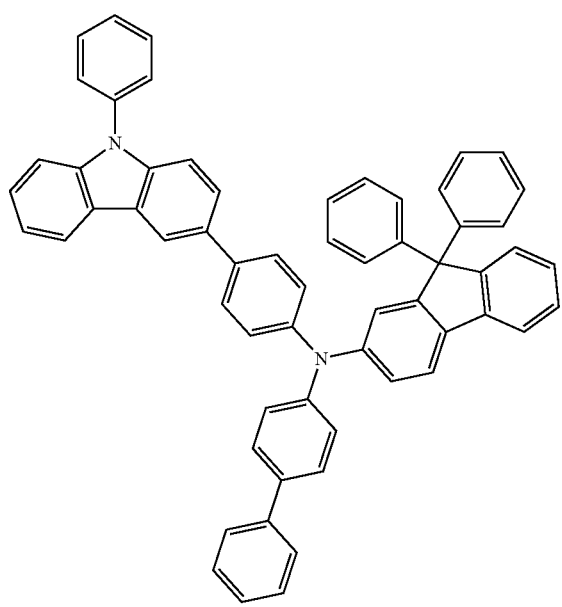
HT7
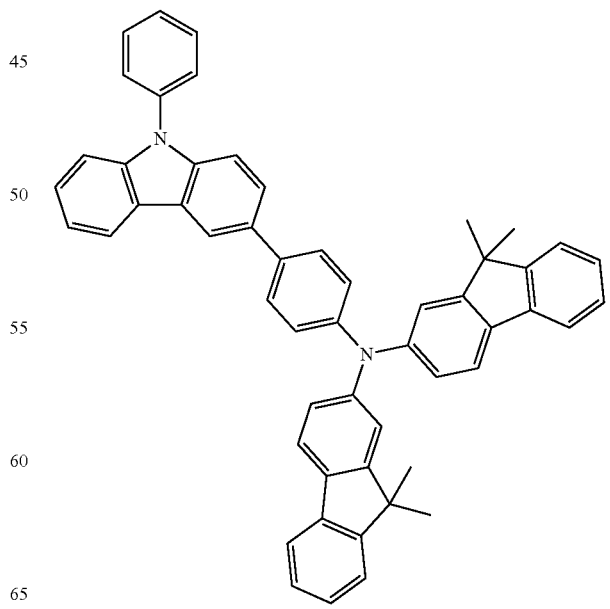

HT8
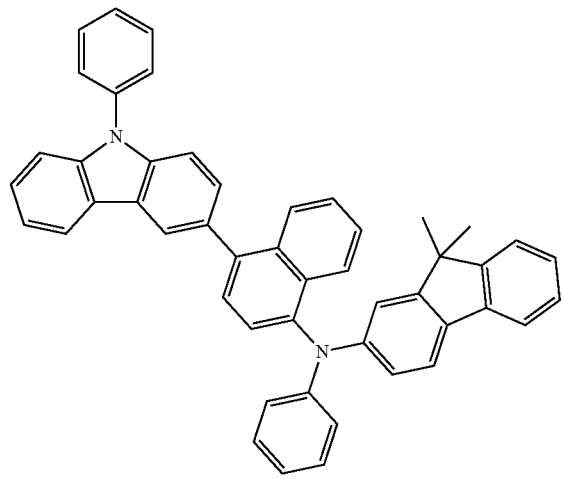
HT9
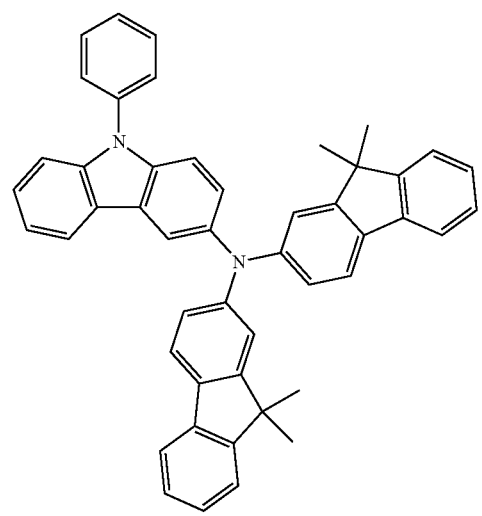
HT10
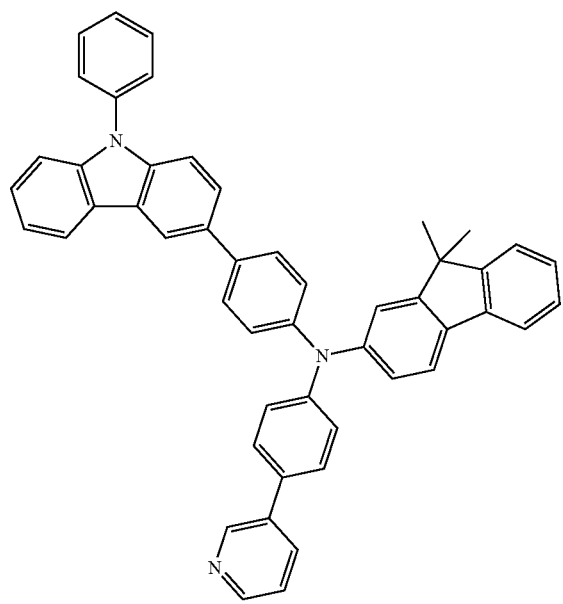
HT11
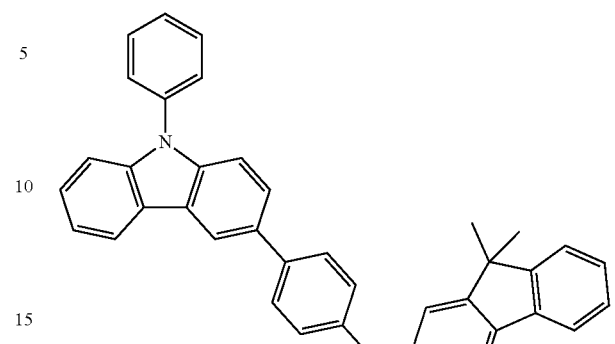
HT12
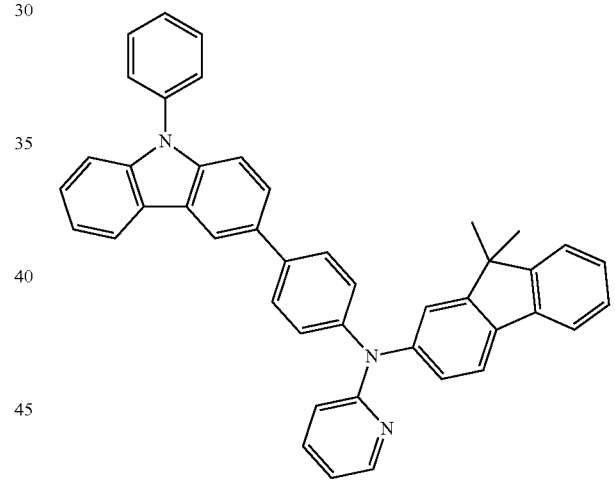
HT13
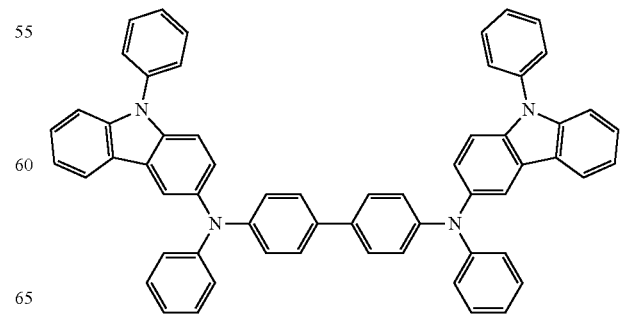

-continued

HT14
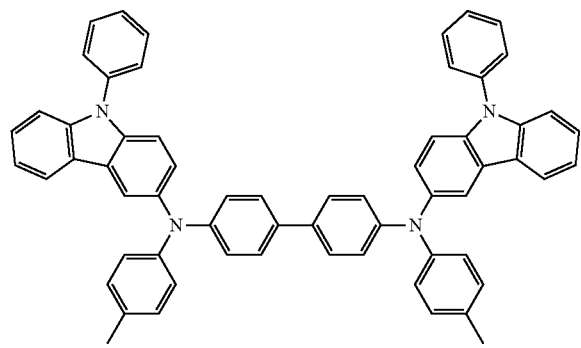

HT15
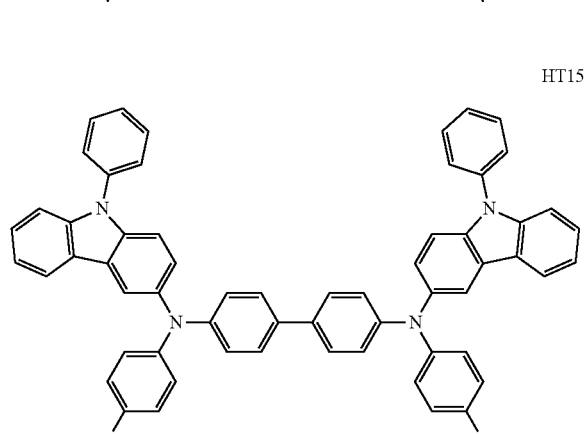

HT16
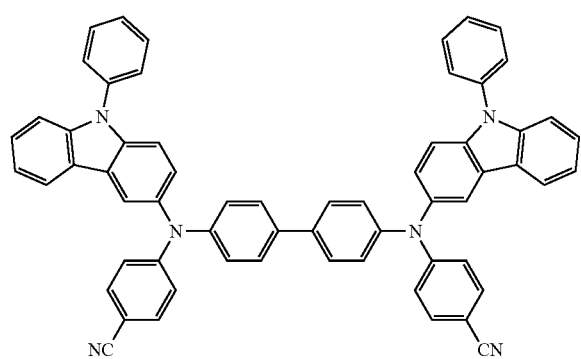

HT17
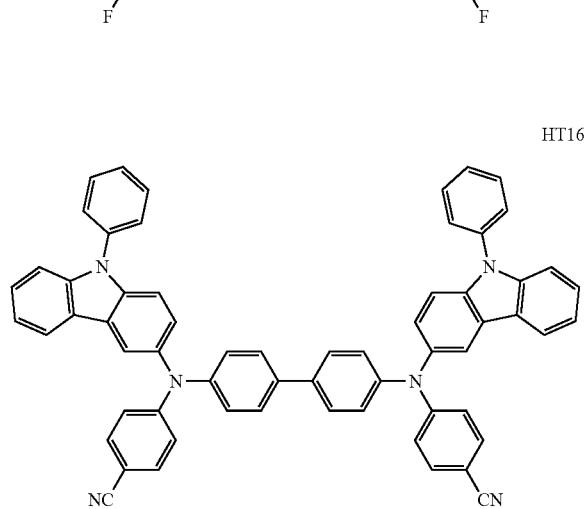

-continued

HT18
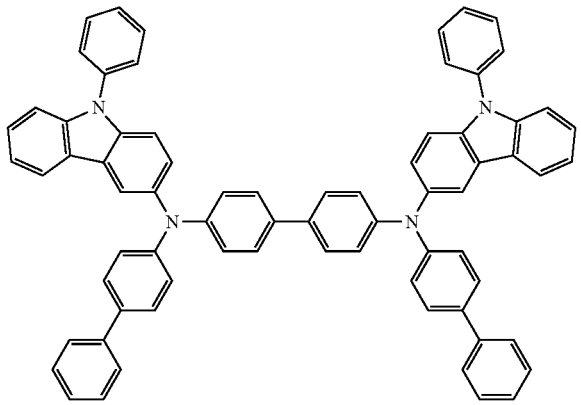

HT19
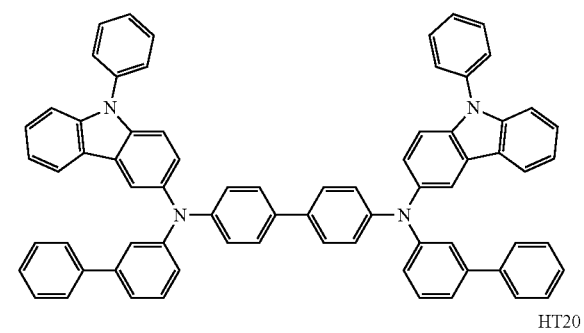

HT20
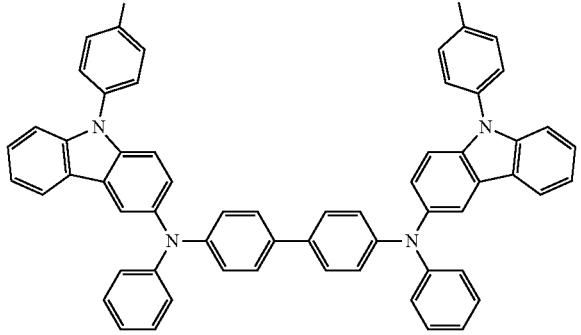

The thickness of the hole transport region may be in a range of about 100 Angstroms (Å) to about 10,000 Å, and in some embodiments, about 100 Å to about 1,000 Å. When the hole transport region includes at least one selected from a hole injection layer and a hole transport layer, the thickness of the hole injection layer may be in a range of about 100 Å to about 10,000 Å, and in some embodiments, about 100 Å to about 1,000 Å, and the thickness of the hole transport layer may be in a range of about 50 Å to about 2,000 Å, and in some embodiments, about 100 Å to about 1,500 Å. While not wishing to be bound by theory, it is understood that when the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may include one of a quinone derivative, a metal oxide, and a compound containing a cyano group, but embodiments are not limited thereto. For example, non-limiting examples of the p-dopant include a quinone derivative, such as tetracyanoquinod i methane (TCNQ) or 2,3,5,6-tetrafluoro-tetracyano-1,4-benzoquinonedimethane (F4-TCNQ); a metal oxide, such as a tungsten oxide or a molybdenum oxide; and a compound containing a cyano group, such as Compound HT-D1 or Compound HP-1, but embodiments are not limited thereto:

Compound HT-D1

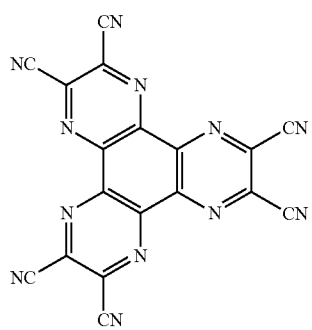

F4-TCNQ

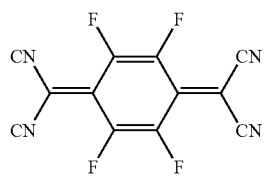

HP-1

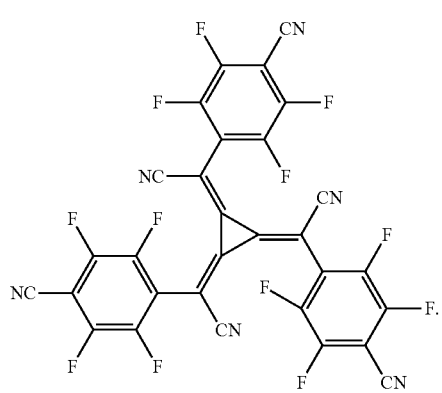

The hole transport region may further include a buffer layer.

The buffer layer may compensate for an optical resonance distance depending on a wavelength of light emitted from the emission layer, to improve the efficiency of an organic light-emitting device.

The hole transport region may further include an electron blocking layer. The electron blocking layer may include any suitable known material, e.g., mCP, but embodiments are not limited thereto:

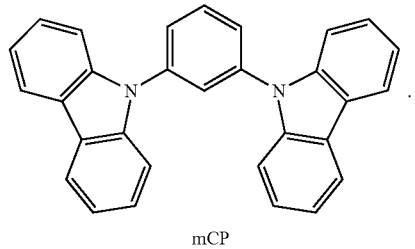 [SMILES: c1cc(-n2c3ccccc3c3ccccc32)cc(-n2c3ccccc3c3ccccc32)c1]

mCP

In some embodiments, a donor compound included in the emission layer may be used as a material for forming the electron blocking layer.

An emission layer may be formed on the hole transport region by using one or more suitable methods, such as vacuum deposition, spin coating, casting, or LB deposition. When the emission layer is formed by vacuum deposition or spin coating, vacuum deposition and coating conditions for forming the emission layer may be generally similar to the those conditions for forming a hole injection layer, though the conditions may vary depending on a compound that is used.

When the organic light-emitting device 10 is a full-color organic light-emitting device, the emission layer may be patterned into a red emission layer, a green emission layer, and a blue emission layer. In some embodiments, the emission layer may have a structure in which the red emission layer, the green emission layer, and/or the blue emission layer are layered to emit white light. In some embodiments, the structure of the emission layer may vary.

The emission layer may include a host and a dopant which may satisfy the above-described conditions.

In one or more embodiments, the emission layer may consist of a host and a dopant which may satisfy the above-described conditions.

The thickness of the emission layer may be in a range of about 100 Å to about 1,000 Å, and in some embodiments, about 200 Å to about 600 Å. While not wishing to be bound by theory, it is understood that when the thickness of the emission layer is within any of these ranges, improved luminous characteristics may be obtained without a substantial increase in driving voltage.

Next, an electron transport region may be formed on the emission layer.

The electron transport region may include at least one selected from a hole blocking layer, an electron transport layer, and an electron injection layer.

In some embodiments, the electron transport region may have a hole blocking layer/an electron transport layer/an electron injection layer structure or an electron transport layer/an electron injection layer structure, but embodiments are not limited thereto. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer, for example, may include at least one of BCP and Bphen, but embodiments are not limited thereto:

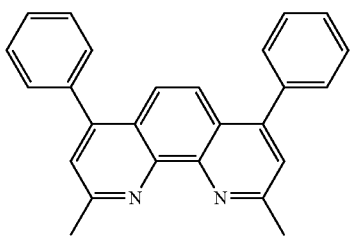

BCP

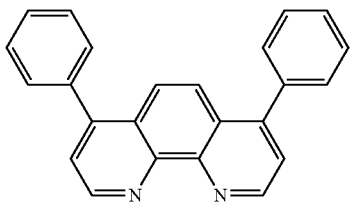

Bphen

In some embodiments, the acceptor compound used in the emission layer may be used as a material for forming the hole blocking layer.

The thickness of the hole blocking layer may be in a range of about 20 Å to about 1,000 Å, and in some embodiments, about 30 Å to about 300 Å. While not wishing to be bound by theory, it is understood that when the thickness of the hole blocking layer is within these ranges, excellent hole blocking characteristics may be obtained without a substantial increase in driving voltage.

The electron transport layer may further include at least one selected from BCP, BPhen, Alq₃, BAlq, TAZ, and NTAZ:

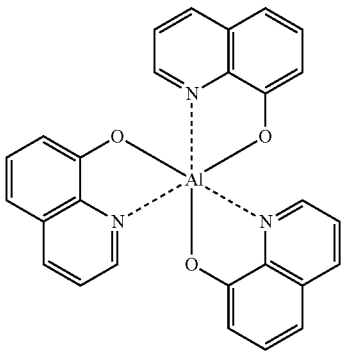

Alq₃

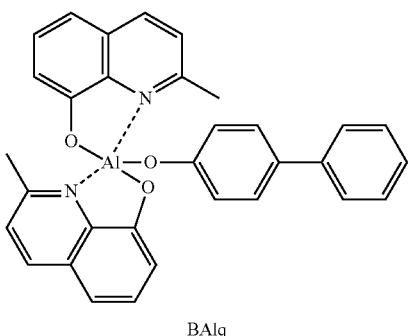

BAlq

-continued

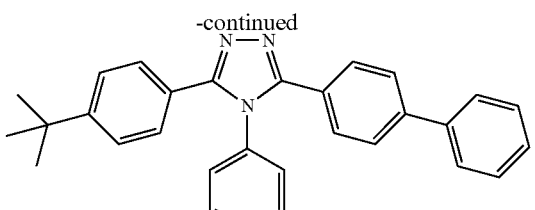

TAZ

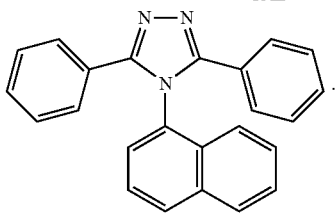

NTAZ

In some embodiments, an electron transport material in the electron transport layer may include a compound represented by Formula 40 or a compound represented by Formula 41:

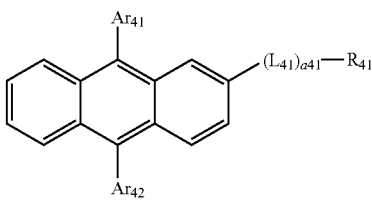

Formula 40

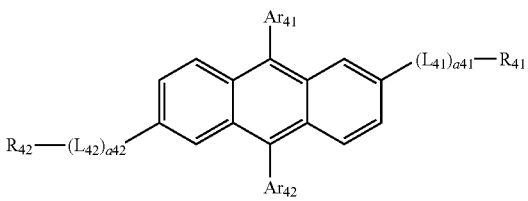

Formula 41 wherein, in Formulae 40 and 41, $L_{41}$ and $L_{42}$ may each independently be selected from a $C_6$-$C_{60}$ arylene group, a $C_1$-$C_{60}$ heteroarylene group, a divalent non-aromatic condensed polycyclic group, and a divalent non-aromatic condensed heteropolycyclic group; and a $C_6$-$C_{60}$ arylene group, a $C_1$-$C_{60}$ heteroarylene group, a divalent non-aromatic condensed polycyclic group, and a divalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, a41 and a42 may each independently be an integer from 0 to 5, $Ar_{41}$ and $Ar_{42}$ may each independently be selected from a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, and $R_{41}$ and $R_{42}$ may each independently be selected from a benzimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group; and a benzimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a benzimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group.

In Formulae 40 and 41, $L_{41}$ and $L_{42}$ may be the same as described herein with reference to $L_{11}$.

In some embodiments, an electron transport material in the electron transport layer may include a compound represented by Formula 42:

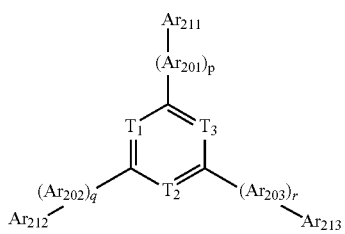

Formula 42 wherein, in Formula 42, $T_1$ may be N or $C(R_{201})$, $T_2$ may be N or $C(R_{202})$, $T_3$ may be N or $C(R_{203})$, provided that at least one of $T_1$ to $T_3$ is N, $R_{201}$ to $R_{203}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, and $Ar_{201}$ to $Ar_{203}$ may each independently be selected from a $C_6$-$C_{60}$ arylene group, a $C_1$-$C_{60}$ heteroarylene group, a divalent non-aromatic condensed polycyclic group, and a divalent non-aromatic condensed heteropolycyclic group; and a $C_6$-$C_{60}$ arylene group, a $C_1$-$C_{60}$ heteroarylene group, a divalent non-aromatic condensed polycyclic group, and a divalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, p, q, and r may each independently be 0, 1, or 2, and $Ar_{211}$ and $Ar_{213}$ may each independently be selected from a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group.

In an embodiment, in Formula 42, at least two of $T_1$ to $T_3$ may be N.

In one or more embodiments, in Formula 42, $T_1$ to $T_3$ may each be N.

In Formula 42, $Ar_{201}$ to $Ar_{203}$ may each independently be selected from a phenylene group, a naphthylene group, an anthrylene group, a pyrenylene group, a fluorenylene group, a triphenylenylene group, a pyridinylene group, and a pyrimidinylene group; and a phenylene group, a naphthylene group, an anthrylene group, a pyrenylene group, a fluorenylene group, a triphenylenylene group, a pyridinylene group, and a pyrimidinylene group, each substituted with at least one selected from a phenyl group, a naphthyl group, an anthryl group, a pyrenyl group, a fluorenyl group, a triphenylenyl group, a pyridinyl group, and a pyrimidinyl group, but embodiments are not limited thereto.

In Formula 42, p, q, and r may each independently be 0, 1, or 2. In some embodiments, in Formula 42, p, q, and r may each independently be 0 or 1, but embodiments are not limited thereto.

In Formula 42, $Ar_{211}$ to $Ar_{213}$ may each independently be selected from a phenyl group, a naphthyl group, a pyrenyl group, a chrysenyl group, a fluorenyl group, a phenanthrenyl group, a benzimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group; and a phenyl group, a naphthyl group, a pyrenyl group, a chrysenyl group, a fluorenyl group, a phenanthrenyl group, a benzimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, but embodiments are not limited thereto.

In an embodiment, in Formula 42, at least one selected from $Ar_{211}$ to $Ar_{213}$ may each independently be selected from a benzimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group; and a benzimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, but embodiments are not limited thereto.

In one or more embodiments, in Formula 20A, at least one selected from $Ar_{211}$ to $Ar_{213}$ may be a substituted or unsubstituted phenanthrenyl group.

In some embodiments, the electron transport layer may include at least one selected from Compounds ET1 to ET17, but embodiments are not limited thereto:

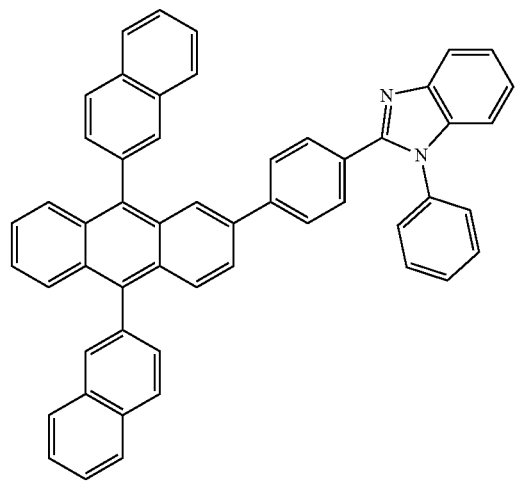

Compound ET1

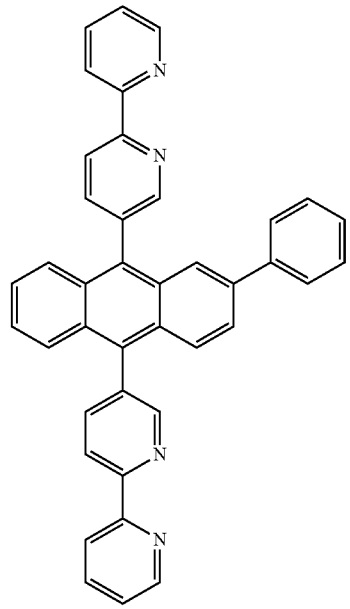

Compound ET2

Compound ET3
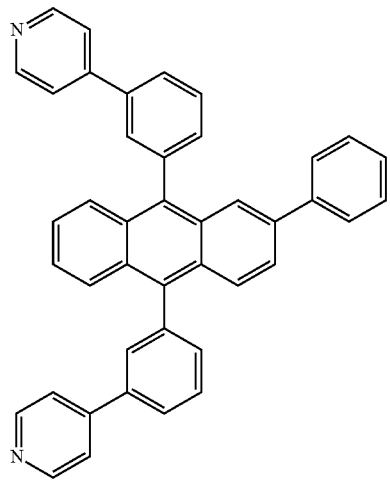
Compound ET4
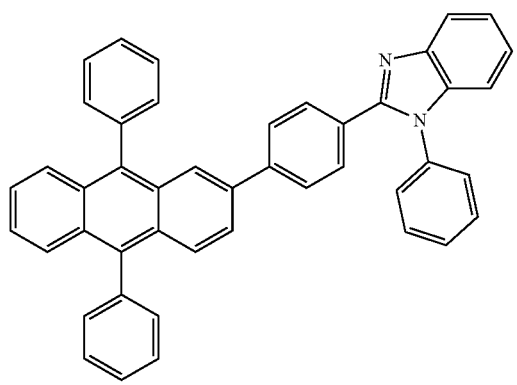
Compound ET5
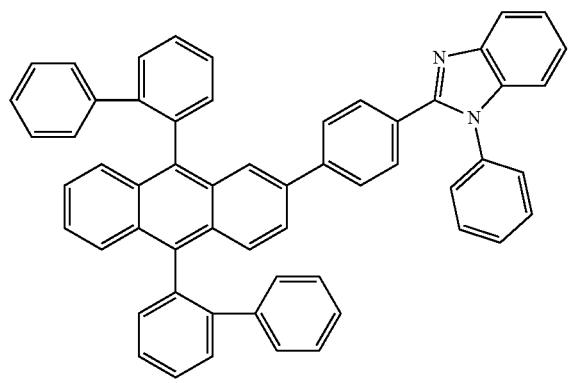
Compound ET6
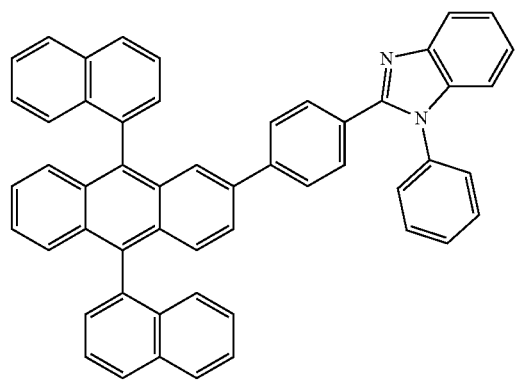
Compound ET7
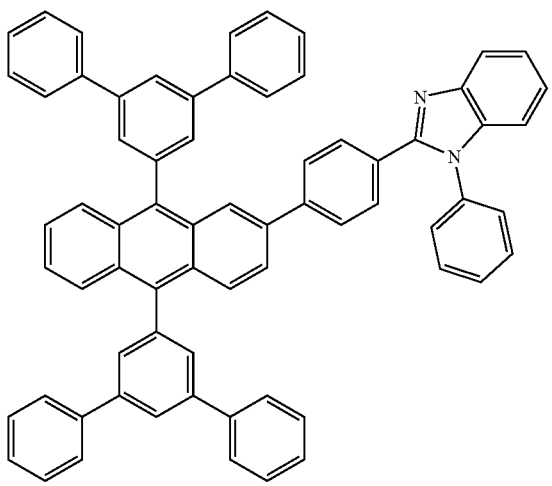
Compound ET8
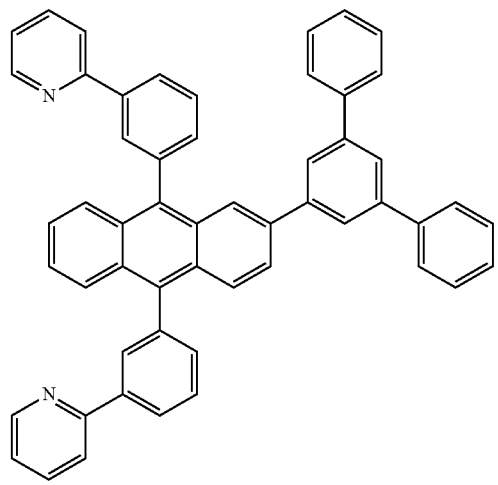

Compound ET8
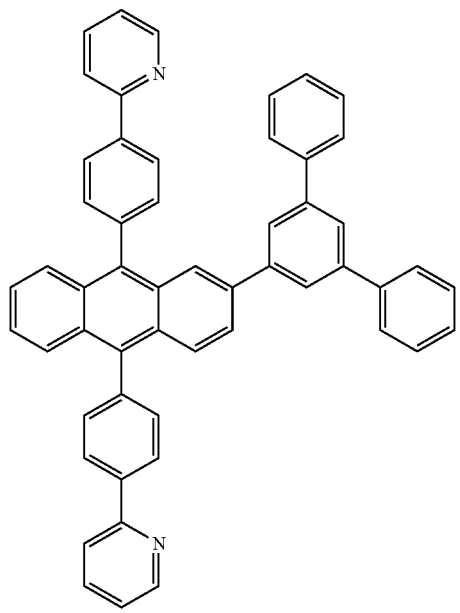
Compound ET11
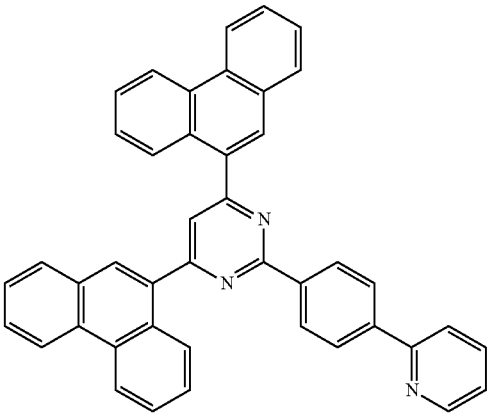
Compound ET12
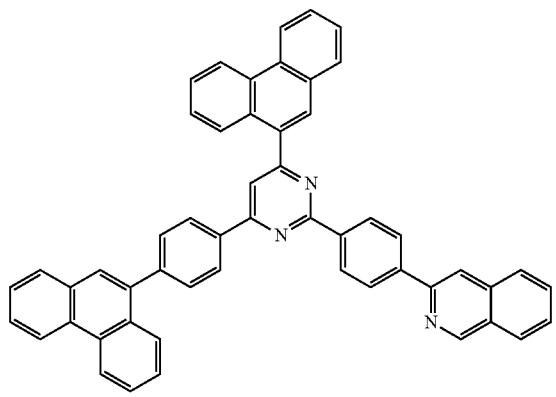
Compound ET10
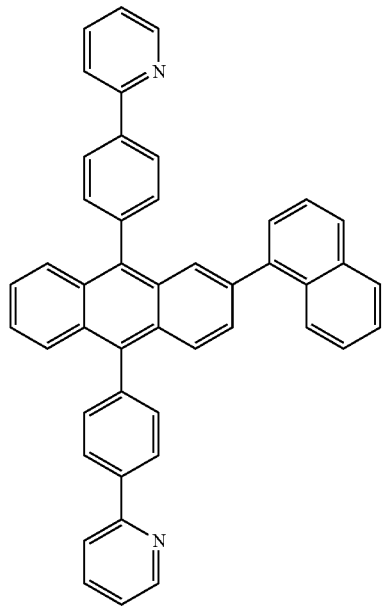
Compound ET13
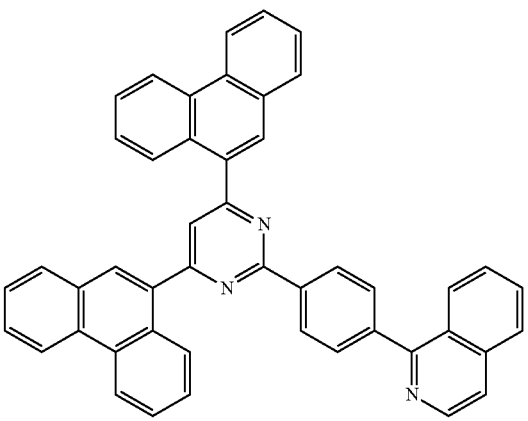

Compound ET14

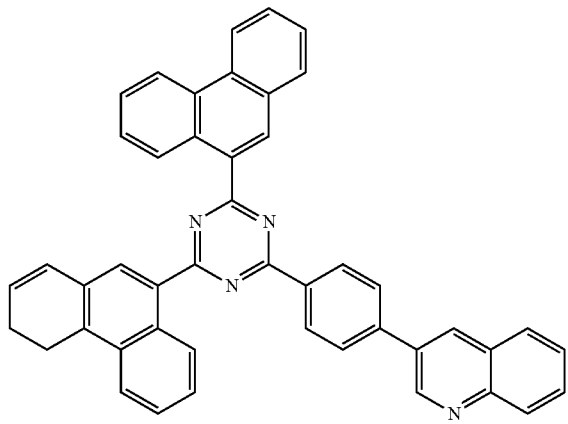

Compound ET15

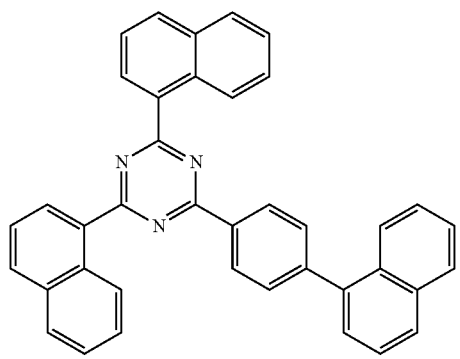

Compound ET16

Compound ET17

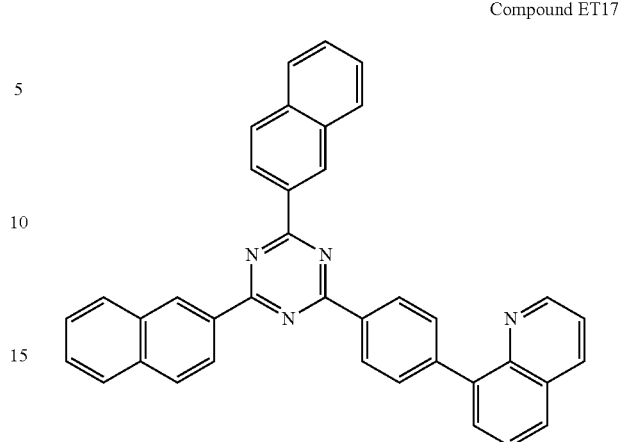

The thickness of the electron transport layer may be in a range of about 100 Å to about 1,000 Å, and in some embodiments, about 150 Å to about 500 Å. While not wishing to be bound by theory, it is understood that when the thickness of the electron transport layer is within any of these ranges, excellent electron transport characteristics may be obtained without a substantial increase in driving voltage.

The electron transport layer may further include a material containing metal, in addition to the materials described above.

The material containing metal may include a lithium (Li) complex. The Li complex may include, e.g., Compound ET-D1 (lithium 8-hydroxyquinolate, LiQ) or Compound ET-D2:

ET-D1

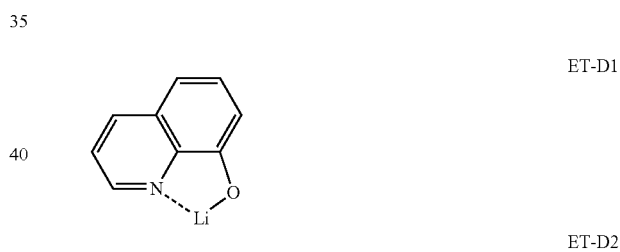

ET-D2

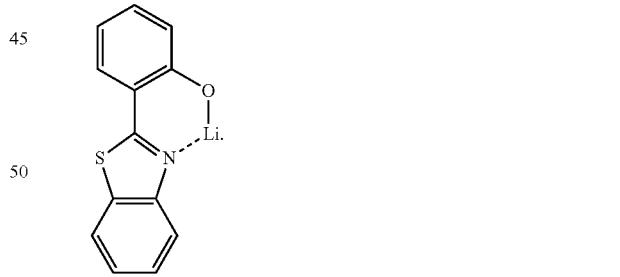

The electron transport region may include an electron injection layer that facilitates electron injection from the second electrode 19.

The electron injection layer may include at least one selected from LiF, NaCl, CsF, $Li_2O$, and BaO.

The thickness of the electron injection layer may be in a range of about 1 Å to about 100 Å, for example, about 3 Å to about 90 Å. While not wishing to be bound by theory, it is understood that when the thickness of the electron injection layer is within any of these ranges, excellent electron injection characteristics may be obtained without a substantial increase in driving voltage.

The second electrode 19 may be formed on the organic layer 15. The second electrode 19 may be a cathode. A material for forming the second electrode 19 may be a material with a relatively low work function, such as a metal, an alloy, an electrically conductive compound, and a mixture thereof. Examples of the material for forming the second electrode 19 may include lithium (Li), magnesium (Mg), aluminum (Al), aluminum-lithium (Al—Li), calcium (Ca), magnesium-indium (Mg—In), and magnesium-silver (Mg—Ag). In some embodiments, ITO or IZO may be used to form a transmissive second electrode 19 to manufacture a top emission light-emitting device. In some embodiments, the material for forming the second electrode 19 may vary.

Hereinbefore, the organic light-emitting device 10 has been described with reference to the FIGURE, but embodiments are not limited thereto.

The term "$C_1$-$C_{60}$ alkyl group" as used herein refers to a linear or branched aliphatic saturated hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having substantially the same structure as the $C_1$-$C_{60}$ alkyl group.

The term "$C_1$-$C_{60}$ alkoxy group" as used herein refers to a monovalent group represented by $-OA_{101}$ (wherein $A_{101}$ is a $C_1$-$C_{60}$ alkyl group). Examples thereof include a methoxy group, an ethoxy group, and an iso-propyloxy group.

The term "$C_2$-$C_{60}$ alkenyl group" as used herein refers to a group formed by including at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a group formed by including at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having substantially the same structure as the $C_2$-$C_{60}$ alkynyl group.

The term "$C_3$-$C_{10}$ cycloalkyl group" as used herein refers to a monovalent monocyclic saturated hydrocarbon group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a saturated monovalent monocyclic group including at least one heteroatom selected from N, O, P, Si, and S as a ring-forming atom and 1 to 10 carbon atoms. Examples thereof include a tetrahydrofuranyl group and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent monocyclic hydrocarbon group including 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, P, Si and S as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and a $C_6$-$C_{60}$ arylene group each include at least two rings, the at least two rings may be fused.

The term "$C_1$-$C_{60}$ heteroaryl group" as used herein refers to a monovalent group having a heterocyclic aromatic system having at least one heteroatom selected from N, O, P, Si and S as a ring-forming atom and 1 to 60 carbon atoms. The term "$C_1$-$C_{60}$ heteroarylene group" as used herein refers to a divalent group having a heterocyclic aromatic system having at least one heteroatom selected from N, O, P, Si and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include at least two rings, the at least two rings may be fused.

The term "$C_6$-$C_{60}$ aryloxy group" as used herein refers to a group represented by $-OA_{102}$ (where $A_{102}$ is a $C_6$-$C_{60}$ aryl group), and the term "$C_7$-$C_{60}$ arylalkyl group" as used herein indicates -$A_{104}A_{105}$ (wherein $A_{105}$ is the $C_6$-$C_{59}$ aryl group and $A_{104}$ is the $C_1$-$C_{53}$ alkylene group). The term "$C_6$-$C_{60}$ arylthio group" as used herein refers to a group represented by $-SA_{103}$ (where $A_{103}$ is a $C_6$-$C_{60}$ aryl group).

The term "$C_1$-$C_{60}$ heteroaryloxy group" as used herein refers to $-OA_{106}$ (wherein $A_{106}$ is the $C_2$-$C_{60}$ heteroaryl group), and the term "$C_1$-$C_{60}$ heteroarylthio group" as used herein indicates $-SA_{107}$ (wherein $A_{107}$ is the $C_1$-$C_{60}$ heteroaryl group).

The term "$C_2$-$C_{60}$ heteroarylalkyl group" as used herein refers to -$A_{108}A_{109}$ ($A_{109}$ is a $C_1$-$C_{59}$ heteroaryl group, and $A_{108}$ is a $C_1$-$C_{59}$ alkylene group).

The term "monovalent non-aromatic condensed polycyclic group" as used herein refers to a monovalent group having two or more rings condensed and only carbon atoms (for example, the number of carbon atoms may be in a range of 8 to 60) as ring-forming atoms, wherein the molecular structure as a whole is non-aromatic. Examples of the non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group having at least two rings condensed and a heteroatom selected from N, O, P, Si and S as well as carbon atoms (for example, the number of carbon atoms may be in a range of 2 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

At least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_7$-$C_{60}$ arylalkyl group, substituted $C_1$-$C_{60}$ heteroaryl group, substituted $C_1$-$C_{60}$ heteroaryloxy group, substituted $C_1$-$C_{60}$ heteroarylthio group, substituted $C_2$-$C_{60}$ heteroarylalkyl group, substituted monovalent non-aromatic condensed polycyclic group, and substituted monovalent non-aromatic condensed heteropolycyclic group may be:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); or —N($Q_{31}$)($Q_{32}$), —Si($Q_{33}$)($Q_{34}$)($Q_{35}$), or —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ may each independently be hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group.

The term "room temperature" as used herein refers to a temperature of about 25° C.

Hereinafter, a compound and an organic light-emitting device according to an embodiment will be described in detail with reference to Synthesis Examples and Examples, however, the present disclosure is not limited thereto. The wording "B was used instead of A" used in describing Synthesis Examples means that an amount of B used was identical to an amount of A used in terms of molar equivalents.

EXAMPLES

Evaluation Example 1

Referring to the methods shown in Table 1, T1, S1, $E_{ox}$, $E^*_{ox}$, $E_{red}$, and $E^*_{red}$ of Compounds PD79 to PD84, Compounds PD300 to PD303, and Compound A2 were evaluated. The results thereof are shown in Table 2.

Referring to Table 2, a value of $E^*_{ox}$ of each of Compounds PD79 to PD84 and PD300 to PD303 is equal to a value of $E_{ox}$–T1 of the corresponding compound. A value of $E^*_{ox}$ of Compound A2 is equal to a value of $E_{ox}$–S1 of Compound A2. A value of $E^*_{red}$ of each of Compounds PD79 to PD84 and PD300 to PD303 is equal to a value of $E_{red}$+T1 of the corresponding compound. A value of $E^*_{red}$ of Compound A2 is equal to a value of $E_{red}$+S1 of Compound A2.

TABLE 1

| | |
|---|---|
| T1 energy level evaluation method | A mixture of 2-Methyltetrahydrofuran (2-MeTHF) and each compound (in which each compound was dissolved in 3 milliliters (mL) of 2-MeTHF at a concentration of 10 micromolar, μM) was loaded into a quartz cell. Subsequently, the resulting quartz cell was loaded into a |

TABLE 1-continued

| | |
|---|---|
| | cryostat (available from Oxford Instruments, DN) including liquid nitrogen at a temperature of 77 Kelvins (K). A fluorescence spectrum thereof was measured by using a spectrofluorometer (available from PTI, QuantaMaster 400). A T1 energy level was calculated from the start wavelength of the short-wavelength side. |
| S1 energy level evaluation method | A mixture of 2-MeTHF and each compound (in which each compound was dissolved in 3 mL of 2-MeTHF at a concentration of 10 μM) was loaded into a quartz cell. A fluorescence spectrum thereof was measured at room temperature by using a spectrofluorometer (available from PTI, QuantaMaster 400). An S1 energy level was calculated from the start wavelength of the short-wavelength side. |
| $E_{ox}$ evaluation method | A potential (Volts, V) versus current (Amperes, A) graph of each compound was obtained by using cyclic voltammetry (CHI630B available from CH Instruments, electrolyte: 0.1 molar (M) Bu$_4$NPF$_6$/solvent: CH$_2$Cl$_2$/electrode: 3-electrode system (working electrode: Pt disc (1 mm diameter), reference electrode: Pt wire, and auxiliary electrode: Pt wire)). Subsequently, $E_{ox}$ was calculated. |
| $E_{red}$ evaluation method | A potential (V) versus current (A) graph of each compound was obtained by using differential pulse voltammetry (DPV, CHI630B available from CH Instruments, electrolyte: 0.1M Bu$_4$NPF$_6$/solvent: CH$_2$Cl$_2$/electrode: 3-electrode system (working electrode: Pt disc (1 mm diameter), reference electrode: Pt wire, and auxiliary electrode: Pt wire)). Subsequently, $E_{ox}$ was calculated. |

TABLE 2

| Compound No. | T1 (eV) | S1 (eV) | $E_{ox}$ (eV) | $E^*_{ox}$ (eV) | $E_{red}$ (eV) | $E^*_{red}$ (eV) |
|---|---|---|---|---|---|---|
| PD79 | 2.68 | — | 0.94 | −1.74 | −1.67 | 1.01 |
| PD80 | 2.72 | — | 0.87 | −1.85 | −1.77 | 0.95 |
| A2 | — | 2.86 | 1.23 | −1.63 | −1.65 | 1.21 |
| PD81 | 2.59 | — | 1.18 | −1.41 | −1.83 | 0.76 |
| PD82 | 2.68 | — | 0.97 | −1.71 | — | — |
| PD83 | 2.59 | — | 0.88 | −1.71 | — | — |
| PD84 | 2.86 | — | 0.96 | −1.90 | −1.21 | 1.65 |
| PD300 | 2.97 | — | 1.86 | −1.11 | −1.13 | 1.84 |
| PD301 | 2.90 | — | 1.02 | −1.88 | −1.14 | 1.76 |
| PD302 | 2.81 | — | 0.80 | −2.01 | −1.12 | 1.69 |
| PD303 | 2.81 | — | 2.24 | −0.57 | −1.10 | 1.71 |

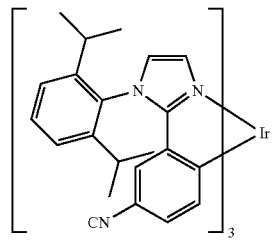

PD79

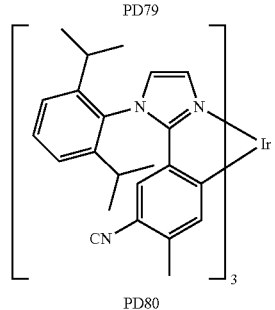

PD80

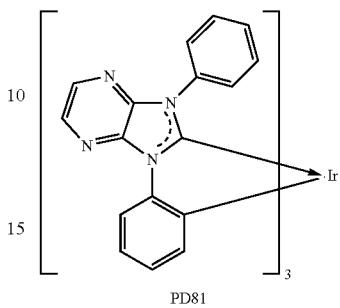

PD81

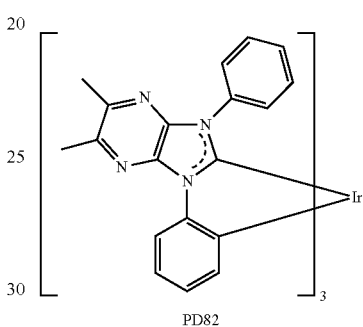

PD82

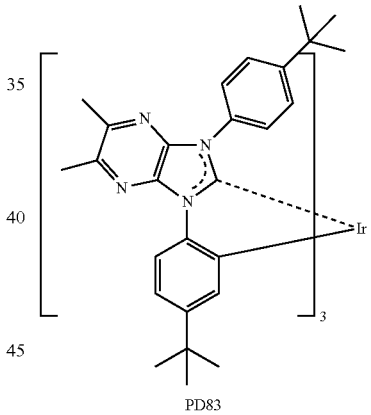

PD83

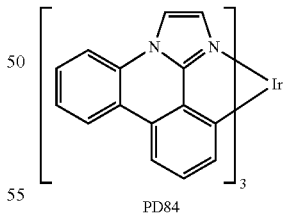

PD84

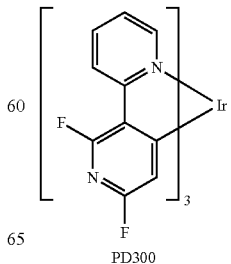

PD300

TABLE 2-continued

| Compound No. | T1 (eV) | S1 (eV) | $E_{ox}$ (eV) | $E^*_{ox}$ (eV) | $E_{red}$ (eV) | $E^*_{red}$ (eV) |
|---|---|---|---|---|---|---|

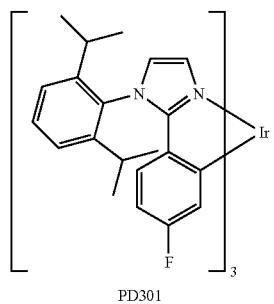

PD301

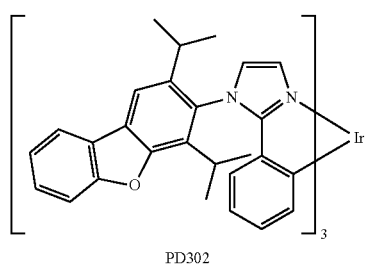

PD302

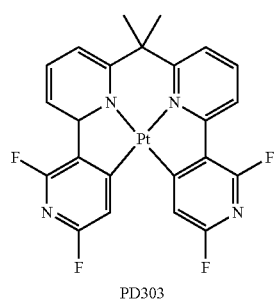

PD303

TABLE 2-continued

| Compound No. | T1 (eV) | S1 (eV) | $E_{ox}$ (eV) | $E^*_{ox}$ (eV) | $E_{red}$ (eV) | $E^*_{red}$ (eV) |
|---|---|---|---|---|---|---|

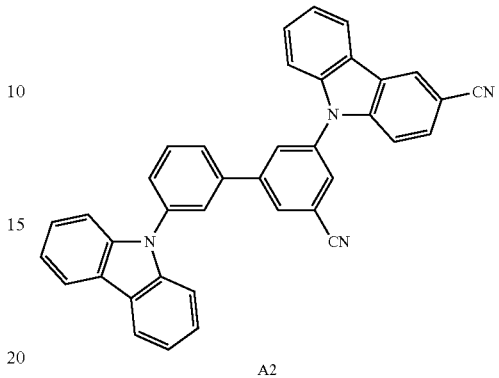

A2

Based on Table 2, it was identified whether Conditions 1, 2, 3, 4, 5-1, and 6-1 were satisfied in Combinations 1 to 10. The results thereof are shown in Tables 3 and 4.

TABLE 3

| Combination No. | Host | Dopant | Condition 1 | Condition 2 | Condition 3 | Condition 4 |
|---|---|---|---|---|---|---|
| Combination 1 | A2 | PD79 | X | ○ | X | ○ |
| Combination 2 | A2 | PD80 | X | ○ | X | ○ |
| Combination 3 | A2 | PD81 | ○ | ○ | X | ○ |
| Combination 4 | A2 | PD82 | X | N/A | X | N/A |
| Combination 5 | A2 | PD83 | X | N/A | X | N/A |
| Combination 6 | A2 | PD84 | X | X | X | X |
| Combination 7 | A2 | PD300 | ○ | X | ○ | X |
| Combination 8 | A2 | PD301 | X | X | X | X |
| Combination 9 | A2 | PD302 | X | X | X | X |
| Combination 10 | A2 | PD303 | ○ | X | ○ | X |

TABLE 4

| Combination No. | Host | Dopant | $T1_{dopant} - 0.4$ eV | $|E_{red,host} - E_{ox,dopant}|$ | $|E_{red,dopant} - E_{ox,host}|$ | $T1_{dopant} + 0.3$ eV | Condition 5-1 | Condition 6-1 |
|---|---|---|---|---|---|---|---|---|
| Combination 1 | A2 | PD79 | 2.28 | 2.59 | 2.9 | 2.98 | ○ | ○ |
| Combination 2 | A2 | PD80 | 2.32 | 2.52 | 3 | 3.02 | ○ | ○ |
| Combination 3 | A2 | PD81 | 2.19 | 2.83 | 3.06 | 2.89 | ○ | X |
| Combination 4 | A2 | PD82 | 2.28 | 2.62 | N/A | 2.98 | ○ | N/A |
| Combination 5 | A2 | PD83 | 2.19 | 2.53 | N/A | 2.89 | ○ | N/A |
| Combination 6 | A2 | PD84 | 2.46 | 2.61 | 2.44 | 3.16 | ○ | X |
| Combination 7 | A2 | PD300 | 2.57 | 3.51 | 2.36 | 3.27 | X | X |
| Combination 8 | A2 | PD301 | 2.50 | 2.67 | 2.37 | 3.20 | ○ | X |
| Combination 9 | A2 | PD302 | 2.41 | 2.45 | 2.35 | 3.11 | ○ | X |
| Combination 10 | A2 | PD303 | 2.41 | 3.89 | 2.33 | 3.11 | X | X |

"O" indicates that the combination satisfied the condition.
"X" indicates that the combination did not satisfy the condition.
"N/A" indicates that an evaluation could not be made because a measurement was not available.

Example 1

As an anode, a glass substrate having an ITO electrode thereon was cut to a size of 50 millimeters (mm)×50 mm×0.5 mm. Then the glass substrate was sonicated in acetone iso-propyl alcohol and pure water for about 15 minutes in each solvent, and cleaned by exposure to ultraviolet rays and ozone for 30 minutes.

Compounds HT3 and HP-1 (in which a concentration of Compound HP-1 was 3 percent by weight (wt %)) were co-deposited on the anode to form a hole injection layer having a thickness of 100 Angstroms (Å). Compound HT3 was deposited on the hole injection layer to form a hole transport layer. mCP was deposited on the hole transport layer to form an electron blocking layer having a thickness of 100 Å, thereby forming a hole transport region having a thickness of 1,700 Å.

Compound A2 (as a host) and Compound PD79 (as a dopant) were co-deposited on the hole transport region at a weight ratio of 9:1, thereby forming an emission layer having a thickness of 400 Å.

Compound A4 was vacuum-deposited on the emission layer to form a hole blocking layer having a thickness of 100 Å. Compound ET17 and LiQ were co-deposited on the hole blocking layer at a weight ratio of 5:5 to form an electron transport layer having a thickness of 360 Å. LiQ was deposited on the electron transport layer to form an electron injection layer having a thickness of 5 Å. Aluminum (Al) was deposited on the electron injection layer to form a layer of aluminum having a thickness of 120 Å, thereby completing the manufacture of an organic light-emitting device.

Examples 2 and 3 and Comparative Examples 1 to 3

Organic light-emitting devices were manufactured in substantially the same manner as in Example 1, except that the host and the dopant shown in Table 5 were used in the formation of an emission layer.

Evaluation Example 2

Relative lifespan ($T_{95}$) characteristics of the organic light-emitting devices manufactured in Examples 1 to 3 and Comparative Examples 1 and 2 were measured by using a current voltmeter (Keithley 2400) and a luminance meter (Minolta Cs-1000A). The evaluation results are shown in Table 5. In Table 5, the relative lifespan ($T_{95}$) represents lifespan data evaluating a period taken for the luminance (at 500 nit) to reach 95% with respect to 100% of the initial luminance.

TABLE 5

| | Host | Dopant | Weight ratio of host to dopant | Relative lifespan ($T_{95}$) (percent, %) |
|---|---|---|---|---|
| Example 1 (Combination 1) | A2 | PD79 | 9:1 | 231% |
| Example 2 (Combination 2) | A2 | PD80 | 9:1 | 100% |

TABLE 5-continued

| | Host | Dopant | Weight ratio of host to dopant | Relative lifespan ($T_{95}$) (percent, %) |
|---|---|---|---|---|
| Example 3 (Combination 3) | A2 | PD81 | 9:1 | 77% |
| Comparative Example 1 (Combination 6) | A2 | PD84 | 9:1 | <1% |
| Comparative Example 2 (Combination 8) | A2 | PD301 | 9:1 | <1% |
| Comparative Example 3 (Combination 9) | A2 | PD302 | 9:1 | <1% |

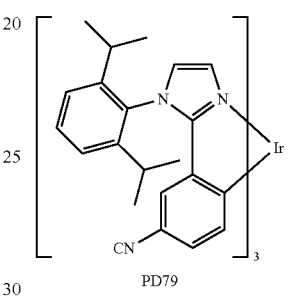

PD79

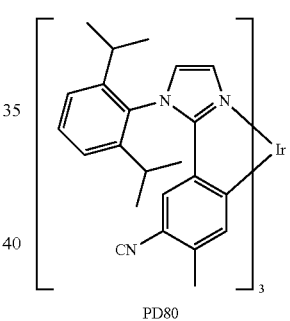

PD80

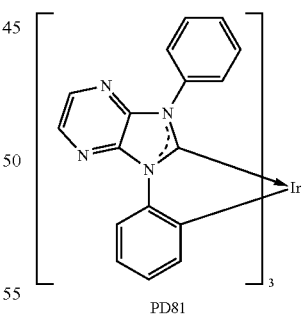

PD81

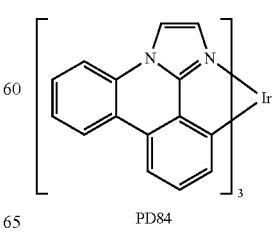

PD84

TABLE 5-continued

| Host | Dopant | Weight ratio of host to dopant | Relative lifespan (T$_{95}$) (percent, %) |
|---|---|---|---|

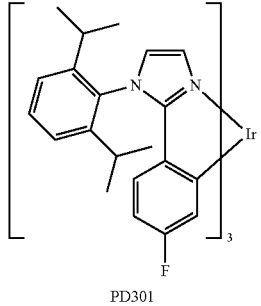

PD301

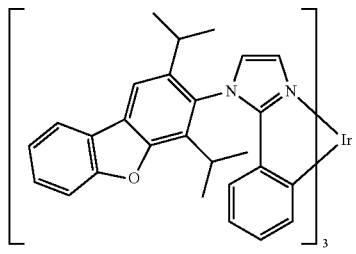

PD302

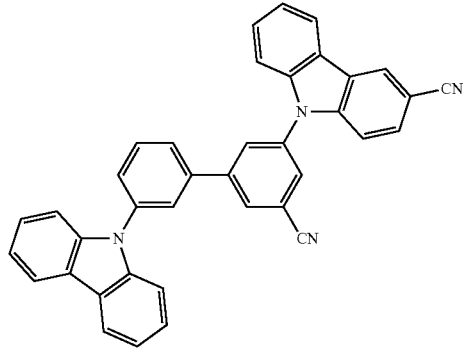

A2

Referring to the results of Table 5, it was found that the organic light-emitting device of Examples 1 to 3 have long lifespan characteristics, as compared with the organic light-emitting devices of Comparative Examples 1 to 3.

As apparent from the foregoing description, an organic light-emitting device, according to one or more embodiments, may include a host and a dopant satisfying the aforementioned conditions so as to have a long lifespan.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. An organic light-emitting device comprising:
a first electrode;
a second electrode facing the first electrode; and
an organic layer disposed between the first electrode and the second electrode, wherein the organic layer includes an emission layer,
wherein the emission layer comprises a host and a dopant,
wherein the dopant comprises the phosphorescent dopant, Conditions 1 and 3 are not satisfied, and Conditions 2, 4, 5-1, and 6-1 are satisfied, $$E^*_{ox,dopant} \geq E_{red,host} \quad \text{Condition 1}$$

$$E^*_{red,dopant} \leq E_{ox,host} \quad \text{Condition 2}$$

$$E_{ox,dopant} \geq E^*_{red,host} \quad \text{Condition 3}$$

$$E_{red,dopant} \leq E^*_{ox,host} \quad \text{Condition 4}$$

$$T1_{dopant} - 0.4 \text{ eV} < |E_{red,host} - E_{ox,dopant}| < T1_{dopant} + 0.3 \text{ eV} \quad \text{Condition 5-1}$$

$$T1_{dopant} - 0.4 \text{ eV} < |E_{red,dopant} - E_{ox,host}| < T1_{dopant} + 0.3 \text{ eV} \quad \text{Condition 6-1}$$

wherein, $E^*_{ox,dopant}$" represents an excited-state oxidation potential (eV) of the dopant,
$E^*_{red,dopant}$ represents an excited-state reduction potential (eV) of the dopant,
$E_{ox,dopant}$ represents a ground-state oxidation potential (eV) of the dopant,
$E_{red,dopant}$ represents a ground-state reduction potential (eV) of the dopant,
$E^*_{red,host}$ represents an excited-state reduction potential (eV) of the host,
$E^*_{ox,host}$ represents an excited-state oxidation potential (eV) of the host,
$E_{red,host}$ represents a ground-state reduction potential (eV) of the host,
$E_{ox,host}$ represents a ground-state oxidation potential (eV) of the host,
$E^*_{ox,dopant}$ is identical to $E_{ox,dopant} - T1_{dopant}$,
$E^*_{red,dopant}$ is identical to $E_{red,dopant} + T1_{dopant}$,
$E^*_{ox,host}$ is identical to $E_{ox,host} - S1_{host}$,
$E^*_{red,host}$ is identical to $E_{red,host} + S1_{host}$,
$T1_{dopant}$ represents the lowest triplet energy level (eV) of the dopant,
$E_{ox,dopant}$ and $E_{ox,host}$ are measured by using cyclic voltammetry (CV),
$E_{red,dopant}$ and $E_{red,host}$ are measured by using differential pulse voltammetry,
$T1_{dopant}$ and $S1_{dopant}$ are calculated from a photoluminescence (PL) spectrum of the dopant in solution, and
$S1_{host}$ is calculated from a PL spectrum of the host in solution,
wherein "eV" denotes "electron volts",
wherein the host comprises i) at least one acceptor compound, or ii) a combination of at least one donor compound and at least one acceptor compound,
wherein the acceptor compound comprises a compound represented by Formula A2:

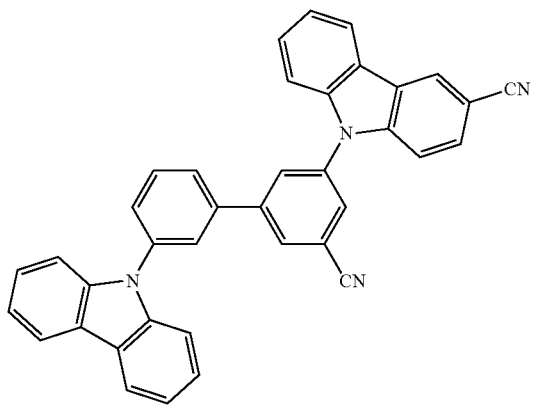
A2
wherein the dopant comprises an organometallic compound represented by Compound PD79
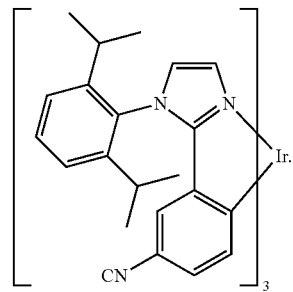
PD79
* * * * *